United States Patent
Lee et al.

(10) Patent No.: US 12,119,259 B2
(45) Date of Patent: Oct. 15, 2024

(54) TRANSISTOR GATE CONTACTS AND METHODS OF FORMING THE SAME

(71) Applicant: Taiwan Semiconductor Manufacturing Co., Ltd., Hsinchu (TW)

(72) Inventors: Kai-Hsuan Lee, Hsinchu (TW); Sai-Hooi Yeong, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 549 days.

(21) Appl. No.: 17/325,477

(22) Filed: May 20, 2021

(65) Prior Publication Data

US 2022/0310445 A1  Sep. 29, 2022

Related U.S. Application Data

(60) Provisional application No. 63/166,348, filed on Mar. 26, 2021.

(51) Int. Cl.
*H01L 21/768* (2006.01)
*H01L 21/8234* (2006.01)
(Continued)

(52) U.S. Cl.
CPC .......... *H01L 21/76831* (2013.01); *H01L 21/76816* (2013.01); *H01L 21/823475* (2013.01);
(Continued)

(58) Field of Classification Search
CPC ......... H01L 21/76831; H01L 21/76816; H01L 21/823475; H01L 21/7682; H01L 21/76895; H01L 21/76897; H01L 21/823431; H01L 21/823821; H01L 21/823871; H01L 21/76834; H01L 21/823468; H01L 21/845; H01L 23/522; H01L 29/41775; H01L 29/41791; H01L 29/6653; H01L 29/4991; H01L 29/785; H01L 29/165; H01L 29/7848;
(Continued)

(56) References Cited

U.S. PATENT DOCUMENTS 7,964,970 B2   6/2011  Gerhardt et al.
9,105,490 B2   8/2015  Wang et al.
(Continued)

FOREIGN PATENT DOCUMENTS

CN   101730939 A   6/2010
TW   201913878 A   4/2019

*Primary Examiner* — Cuong B Nguyen
*Assistant Examiner* — Anthony A Pulatov
(74) *Attorney, Agent, or Firm* — Slater Matsil, LLP

(57) ABSTRACT

In an embodiment, a device includes: a source/drain region adjoining a channel region of a substrate; a contact etch stop layer on the source/drain region; a first source/drain contact extending through the contact etch stop layer, the first source/drain contact connected to the source/drain region; a gate structure on the channel region; a gate contact connected to the gate structure; and a contact spacer around the gate contact, where the contact spacer, the gate structure, the contact etch stop layer, and the substrate collectively define a void between the gate structure and the first source/drain contact.

20 Claims, 63 Drawing Sheets

(51) Int. Cl.
*H01L 23/522* (2006.01)
*H01L 29/417* (2006.01)
*H01L 29/66* (2006.01)

(52) U.S. Cl.
CPC .... *H01L 23/5226* (2013.01); *H01L 29/41775* (2013.01); *H01L 29/41791* (2013.01); *H01L 29/6653* (2013.01); *H01L 29/66795* (2013.01)

(58) Field of Classification Search
CPC ....... H01L 29/66545; H01L 29/66795–66818; H01L 29/7855–7856; H01L 29/04–045; H01L 29/16–1608; H01L 29/18–185; H01L 29/22–2206; H01L 29/36–365; H01L 29/42392; H01L 29/0673; H01L 29/66787; H01L 29/78696; H01L 29/0669–068; H01L 29/66439; H01L 29/66469; H01L 27/088; H01L 27/0924; H01L 27/0886; H01L 27/1211; H01L 27/10826; H01L 27/10879; H01L 2029/7858; H01L 2029/7857; H01L 2924/13067; H01L 2924/13061; Y10S 977/938

See application file for complete search history.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,559,000 B1 * | 1/2017 | Basker ................. H01L 21/845 |
| 9,576,814 B2 | 2/2017 | Wu et al. |
| 9,831,183 B2 | 11/2017 | Lin et al. |
| 9,859,386 B2 | 1/2018 | Ho et al. |
| 10,943,830 B2 | 3/2021 | Chiang et al. |
| 2016/0049487 A1 | 2/2016 | Xu et al. |
| 2020/0020776 A1 | 1/2020 | Yang et al. |
| 2020/0127110 A1 | 4/2020 | Lee et al. |

* cited by examiner

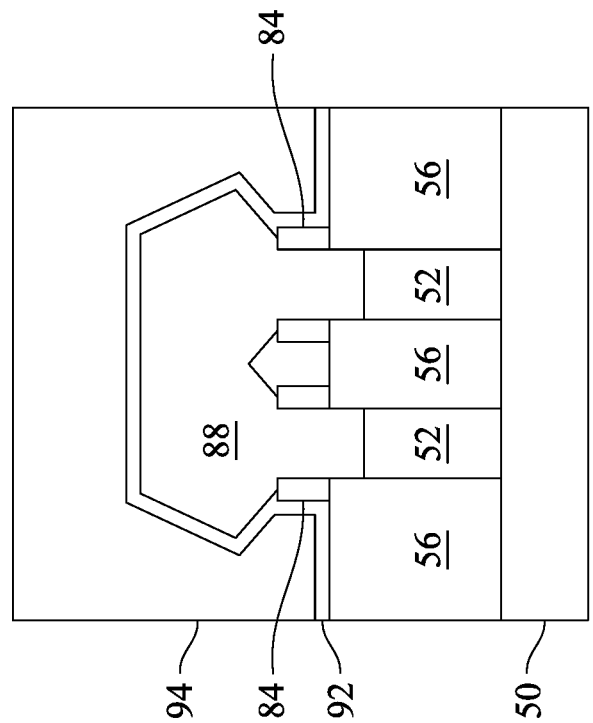
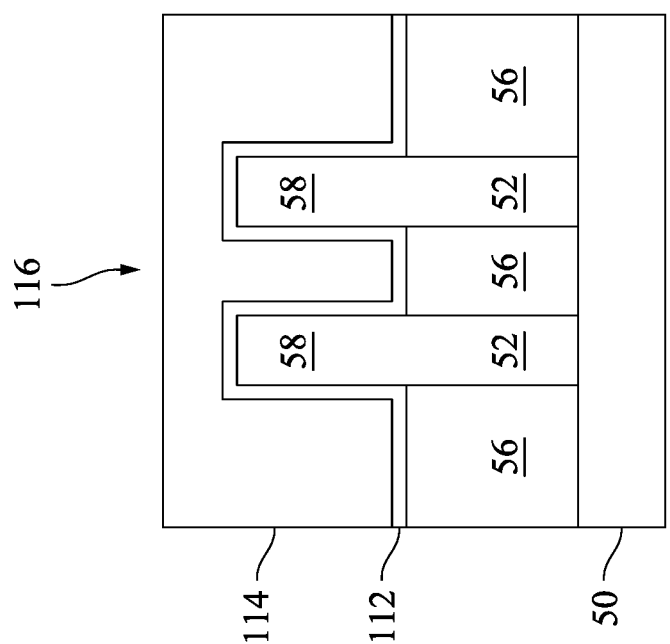
Fig. 13C
Fig. 13B

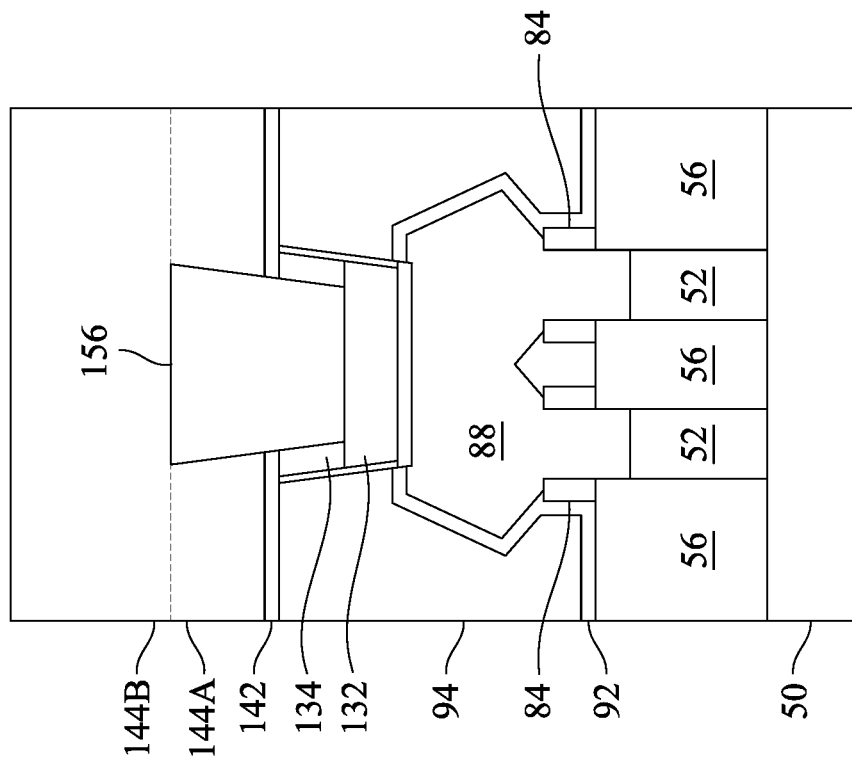
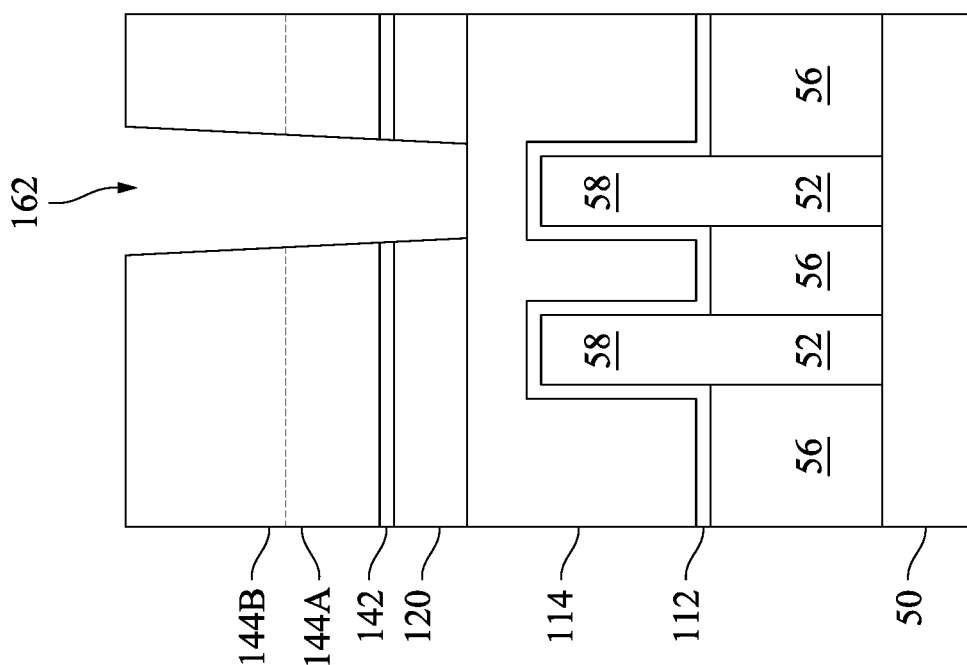
Fig. 26C
Fig. 26B

TRANSISTOR GATE CONTACTS AND METHODS OF FORMING THE SAME

PRIORITY CLAIM AND CROSS-REFERENCE

This application claims the benefit of U.S. Provisional Application No. 63/166,348, filed on Mar. 26, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
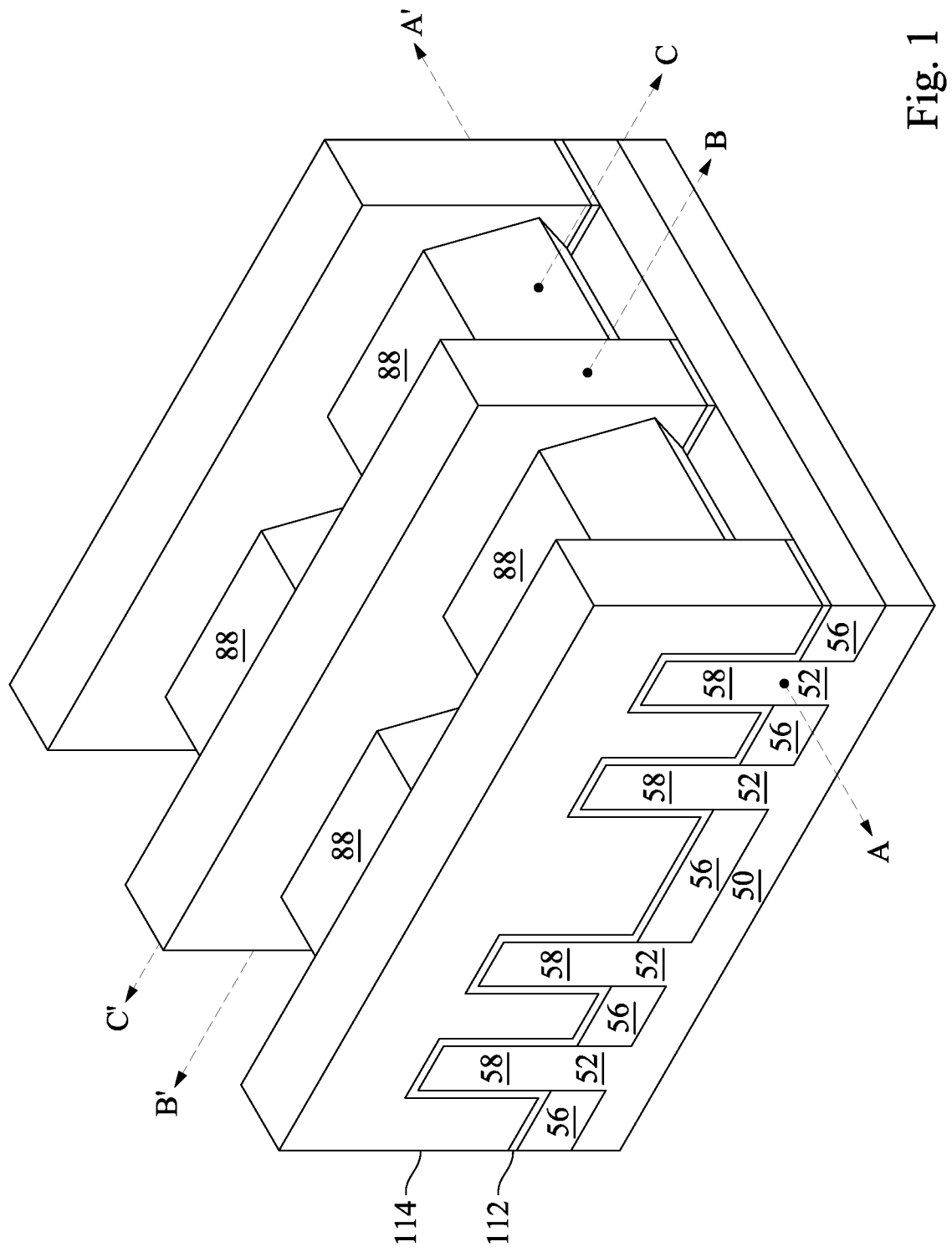
FIG. 1 illustrates an example of a fin field-effect transistor (FinFET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, gate spacers for transistors are removed during a process for forming contacts to the gate structures of the transistors. Air gaps or voids are thus formed between the gate structures and contacts to the source/drain regions of the transistors. The air gaps or voids have a low relative permittivity, allowing the parasitic capacitance of the transistors to be reduced, thereby improving the performance of the resulting FinFETs.

FIG. 1 illustrates an example of Fin Field-Effect Transistors (FinFETs), in accordance with some embodiments. FIG. 1 is a three-dimensional view, where some features of the FinFETs are omitted for illustration clarity. The FinFETs include fins 52 extending from a substrate 50 (e.g., a semiconductor substrate), with the fins 52 acting as channel regions 58 for the FinFETs. Isolation regions 56, such as shallow trench isolation (STI) regions, are disposed between adjacent fins 52, which may protrude above and from between adjacent isolation regions 56. Although the isolation regions 56 are described/illustrated as being separate from the substrate 50, as used herein, the term "substrate" may refer to the semiconductor substrate alone or a combination of the semiconductor substrate and the isolation regions. Additionally, although the bottom portions of the fins 52 are illustrated as being single, continuous materials with the substrate 50, the bottom portions of the fins 52 and/or the substrate 50 may include a single material or a plurality of materials. In this context, the fins 52 refer to the portion extending from between the adjacent isolation regions 56.

Gate dielectrics 112 are along sidewalls and over top surfaces of the fins 52. Gate electrodes 114 are over the gate dielectrics 112. Epitaxial source/drain regions 88 are disposed in opposite sides of the fin 52 with respect to the gate dielectrics 112 and gate electrodes 114. The epitaxial source/drain regions 88 may be shared between various fins 52. For example, adjacent epitaxial source/drain regions 88 may be electrically connected, such as through coalescing the epitaxial source/drain regions 88 by epitaxial growth, or through coupling the epitaxial source/drain regions 88 with a same source/drain contact.

FIG. 1 further illustrates reference cross-sections that are used in later figures. Cross-section A-A' is along a longitudinal axis of a fin 52 and in a direction of, for example, a current flow between the epitaxial source/drain regions 88 of a FinFET. Cross-section B-B' is perpendicular to cross-section A-A' and is along a longitudinal axis of a gate electrode 114. Cross-section C-C' is parallel to cross-section B-B' and extends through epitaxial source/drain regions 88 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
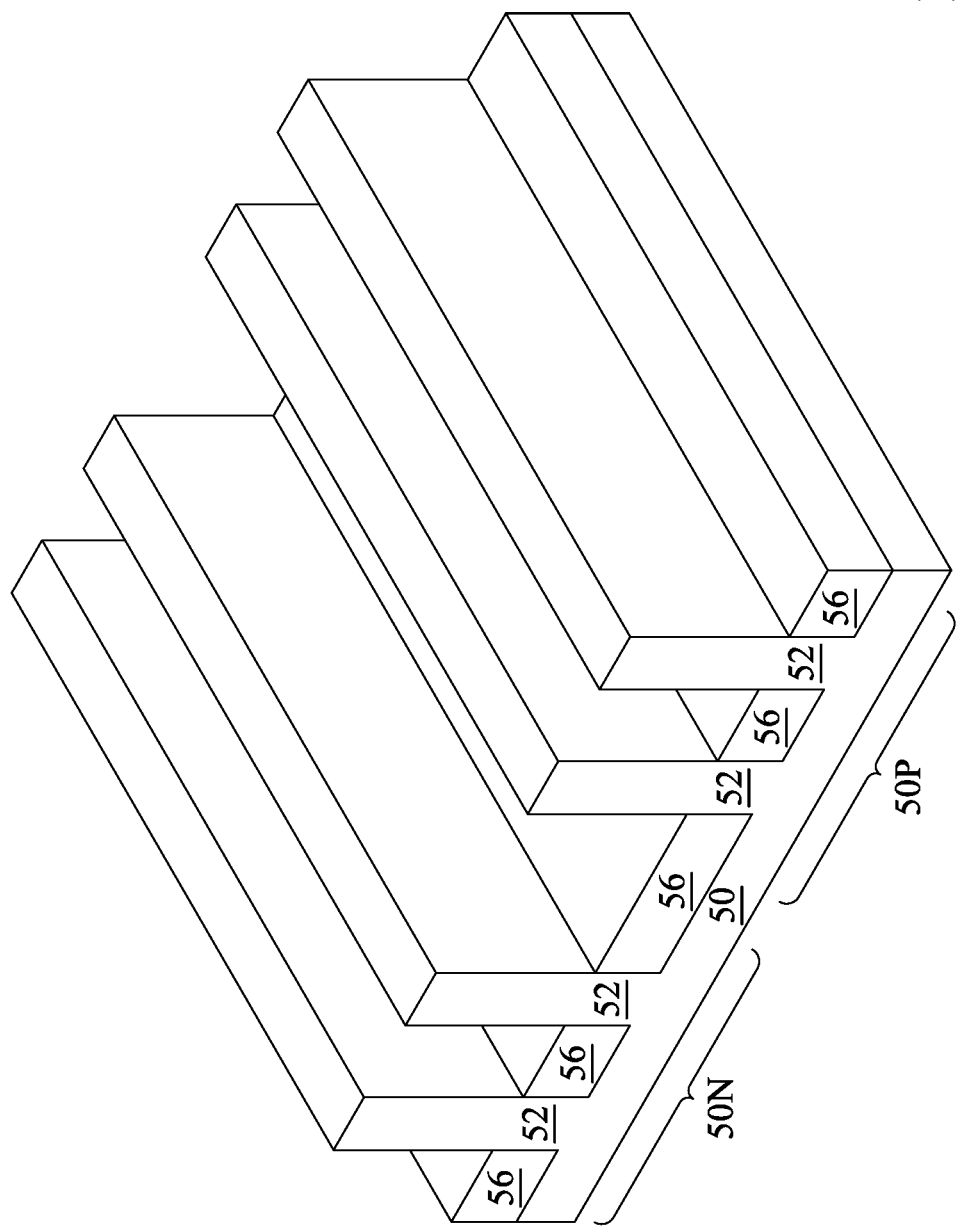
FIGS. 2-31C are views of intermediate stages in the manufacturing of FinFETs, in accordance with some embodiments.
Figure 3:
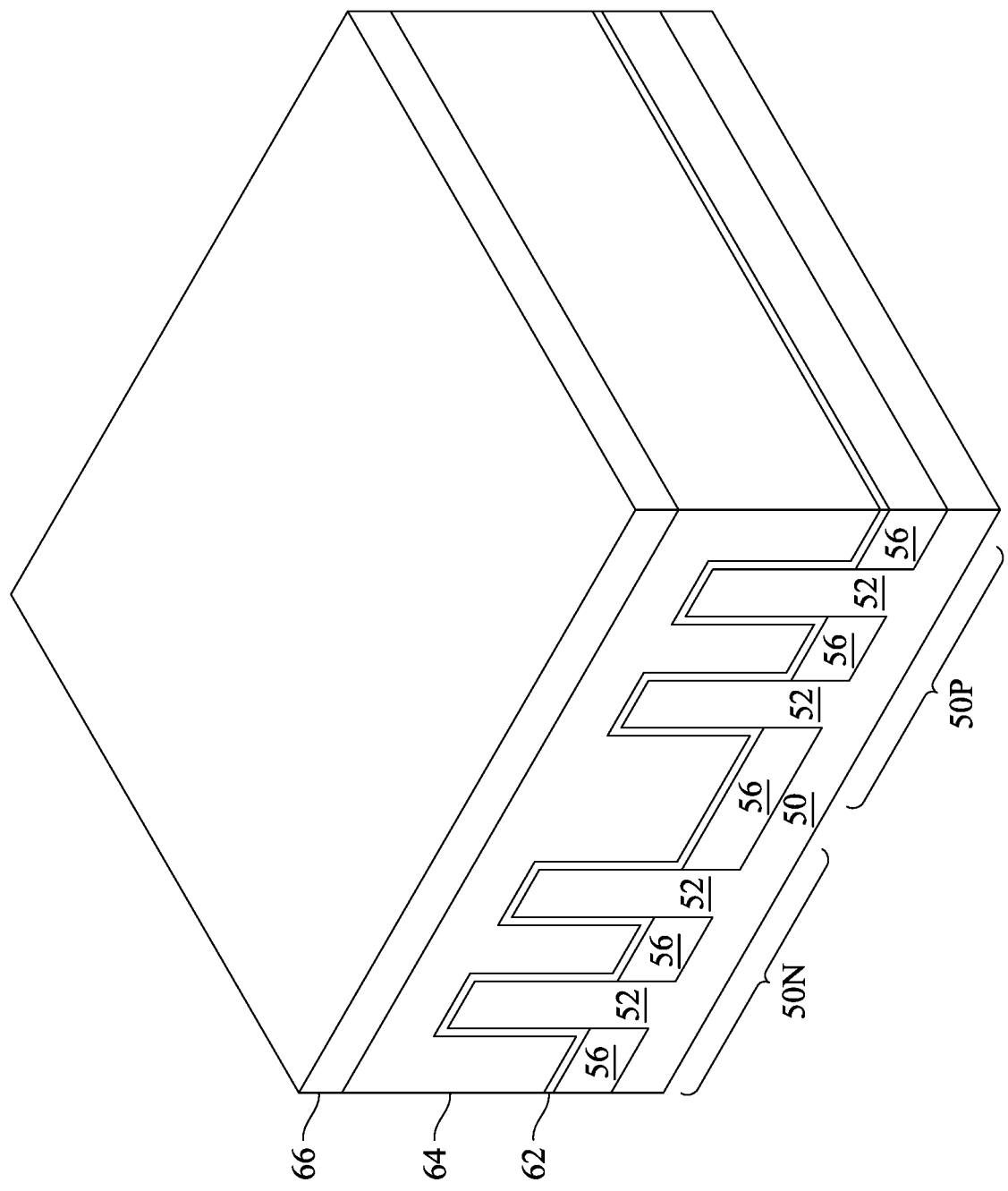
Figure 4:
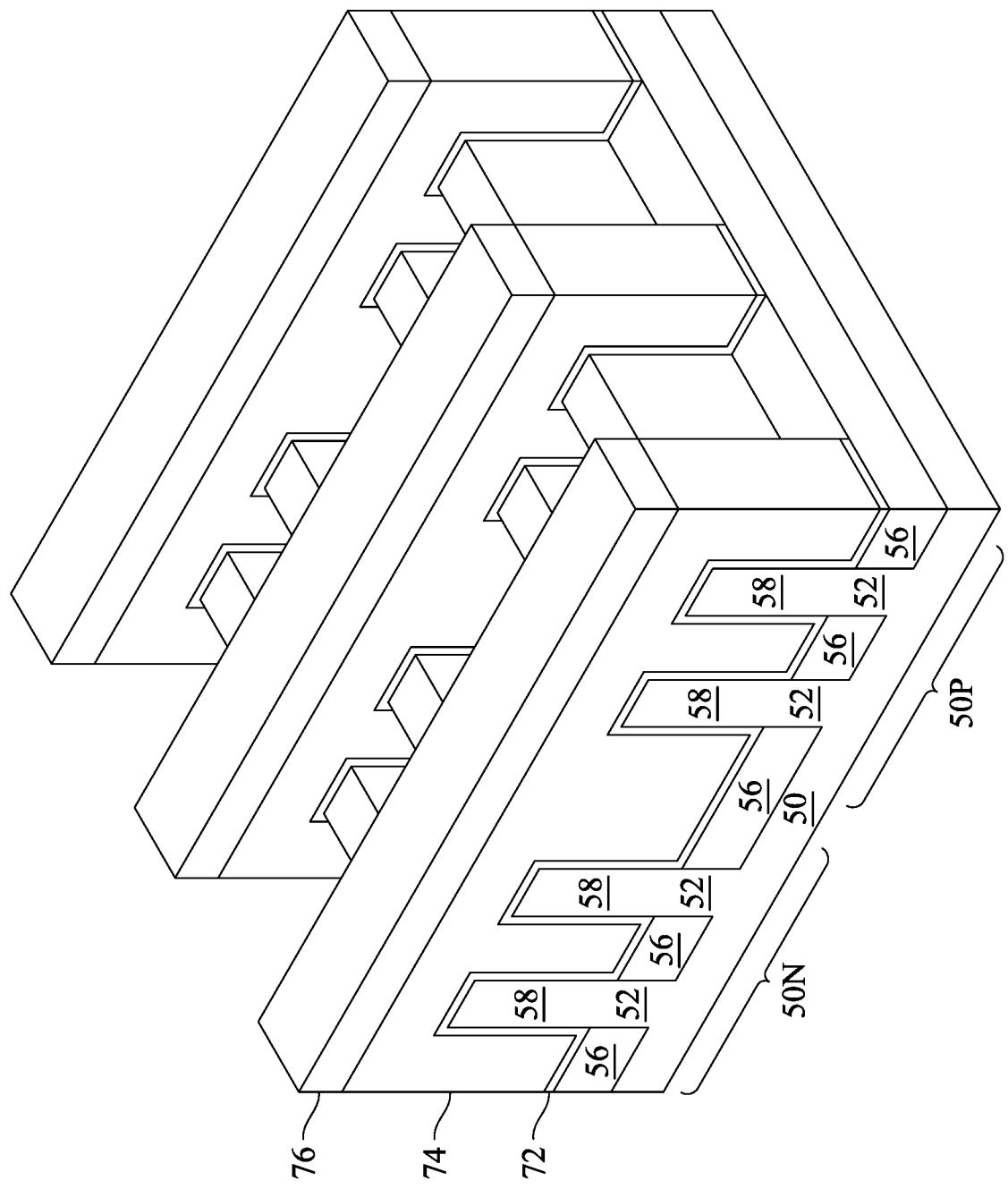

FIGS. 2-31C are views of intermediate stages in the manufacturing of FinFETs, in accordance with some embodiments. FIGS. 2, 3, and 4, are three-dimensional views showing a similar three-dimensional view as FIG. 1. FIGS. 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, and 31A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, and 31B are cross-sectional views illustrated along a similar cross-section as reference cross-section B-B' in FIG. 1. FIGS. 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, 29C, 30C, and 31C are cross-sectional views illustrated along a similar cross-section as reference cross-section C-C' in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type FinFETs, and the p-type region 50P can be for forming p-type devices, such as PMOS transistors, e.g., p-type FinFETs. The n-type region 50N may be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Fins 52 are formed in the substrate 50. The fins 52 are semiconductor strips. The fins 52 may be formed in the substrate 50 by etching trenches in the substrate 50. The etching may be any acceptable etching process, such as a reactive ion etch (RIE), neutral beam etch (NBE), the like, or a combination thereof. The etching process may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 52. In some embodiments, the mask (or other layer) may remain on the fins 52.

STI regions 56 are formed over the substrate 50 and between adjacent fins 52. The STI regions 56 are disposed around lower portions of the fins 52 such that upper portions of the fins 52 protrude from between adjacent STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between adjacent fins 52. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. Although the STI regions 56 are each illustrated as a single layer, some embodiments may utilize multiple layers. For example, in some embodiments a liner (not separately illustrated) may first be formed along surfaces of the substrate 50 and the fins 52. Thereafter, an insulation material, such as those previously described may be formed over the liner. In an embodiment, the insulation material is formed such that excess insulation material covers the fins 52. A removal process is then applied to the insulation material to remove excess insulation material over the fins 52. In some embodiments, a planarization process such as a chemical mechanical polish (CMP), an etch-back process, combinations thereof, or the like may be utilized. In embodiments in which a mask remains on the fins 52, the planarization process may expose the mask or remove the mask. After the planarization process, the top surfaces of the insulation material and the mask (if present) or the fins 52 are coplanar (within process variations). Accordingly, the top surfaces of the mask (if present) or the fins 52 are exposed through the insulation material. In the illustrated embodiment, no mask remains on the fins 52. The insulation material is then recessed to form the STI regions 56. The insulation material is recessed such that upper portions of the fins 52 protrude from between adjacent portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using any acceptable etching process, such as one that is selective to the material of the insulation material (e.g., selectively etches the insulation material of the STI regions 56 at a faster rate than the material of the fins 52). For example, an oxide removal may be performed using dilute hydrofluoric (dHF) acid.

The process previously described is just one example of how the fins 52 and the STI regions 56 may be formed. In some embodiments, the fins 52 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 52. In some embodiments where epitaxial structures are epitaxially grown, the epitaxially grown materials may be in situ doped during growth, which may obviate prior and/or subsequent implantations, although in situ and implantation doping may be used together.

Further, it may be advantageous to epitaxially grow a material in n-type region 50N different from the material in p-type region 50P. In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not separately illustrated) may be formed in the fins 52 and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of about $10^{13}$ $cm^{-3}$ to about $10^{14}$ $cm^{-3}$. After the implant, the photoresist is removed, such as by any acceptable ashing process.

Following or prior to the implanting of the p-type region 50P, a mask (not separately illustrated) such as a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of about $10^{13}$ $cm^{-3}$ to about $10^{14}$ $cm^{-3}$. After the implant, the photoresist is removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 52, the grown materials may be in situ doped during growth, which may obviate the implantations, although in situ and implantation doping may be used together.

In FIG. 3, a dummy dielectric layer 62 is formed on the fins 52. The dummy dielectric layer 62 may be formed of a dielectric material such as silicon oxide, silicon nitride, a combination thereof, or the like, which may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 64 may be formed of material(s) that have a high etching selectivity from the etching of insulation materials, e.g., the STI regions 56 and/or the dummy dielectric layer 62. The mask layer 66 may be formed of a dielectric material such as silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the fins 52 and the STI regions 56, such that the dummy dielectric layer 62 extends over the STI regions 56 and between the dummy gate layer 64 and the STI regions 56. In another embodiment, the dummy dielectric layer 62 covers only the fins 52.

In FIG. 4, the mask layer 66 is patterned using acceptable photolithography and etching techniques to form masks 76. The pattern of the masks 76 is then transferred to the dummy gate layer 64 by any acceptable etching technique to form dummy gates 74. The pattern of the masks 76 may optionally be further transferred to the dummy dielectric layer 62 by any acceptable etching technique to form dummy dielectrics 72. The dummy gates 74 cover respective channel regions 58 of the fins 52. The pattern of the masks 76 may be used to physically separate adjacent dummy gates 74. The dummy gates 74 may also have lengthwise directions substantially perpendicular (within process variations) to the lengthwise directions of the fins 52. The masks 76 may be removed during the patterning of the dummy gate 74, or may be removed during subsequent processing.

FIGS. 5A-31C illustrate various additional steps in the manufacturing of embodiment devices. FIGS. 5A-31C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 5A:
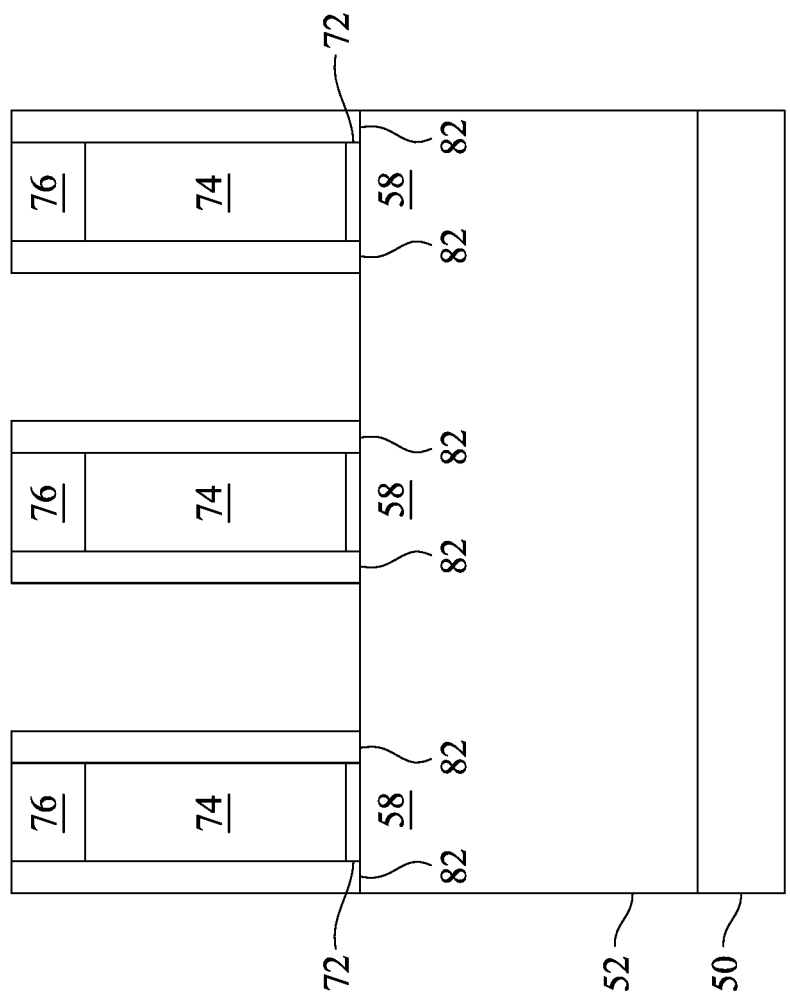
Figure 5C:
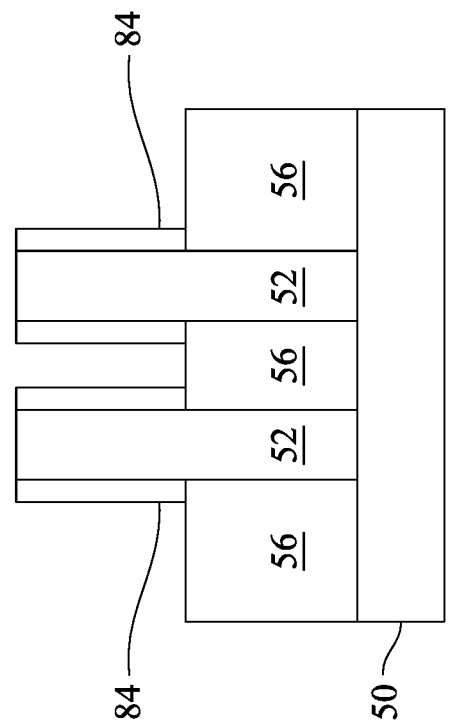
Figure 5B:
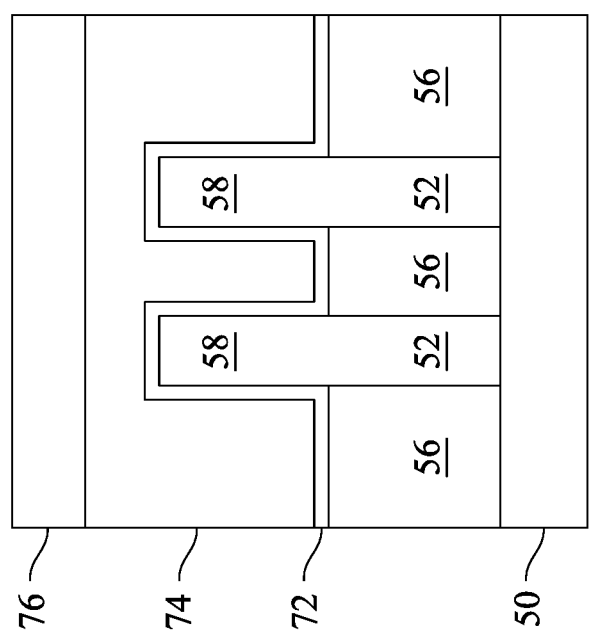

In FIGS. 5A-5C, gate spacers 82 are formed over the fins 52, on exposed sidewalls of the masks 76 (if present), the dummy gates 74, and the dummy dielectrics 72. The gate spacers 82 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 74 (thus forming the gate spacers 82). As will be subsequently described in greater detail, in some embodiments the etch used to form the gate spacers 82 is adjusted so that the dielectric material(s), when etched, also have portions left on the sidewalls of the fins 52 (thus forming fin spacers 84). After etching, the fin spacers 84 (if present) and the gate spacers 82 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 52 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 52 exposed in the n-type region 50N. The mask may then be removed. The n-type impurities may be any of the n-type impurities previously described, and the p-type impurities may be any of the p-type impurities previously described. During the implanting, the channel regions 58 remain covered by the dummy gates 74, so that the channel regions 58 remain substantially free of the impurity implanted to form the LDD regions. The LDD regions may have a concentration of impurities in the range of about $10^{15}$ cm$^{-3}$ to about $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 6A:
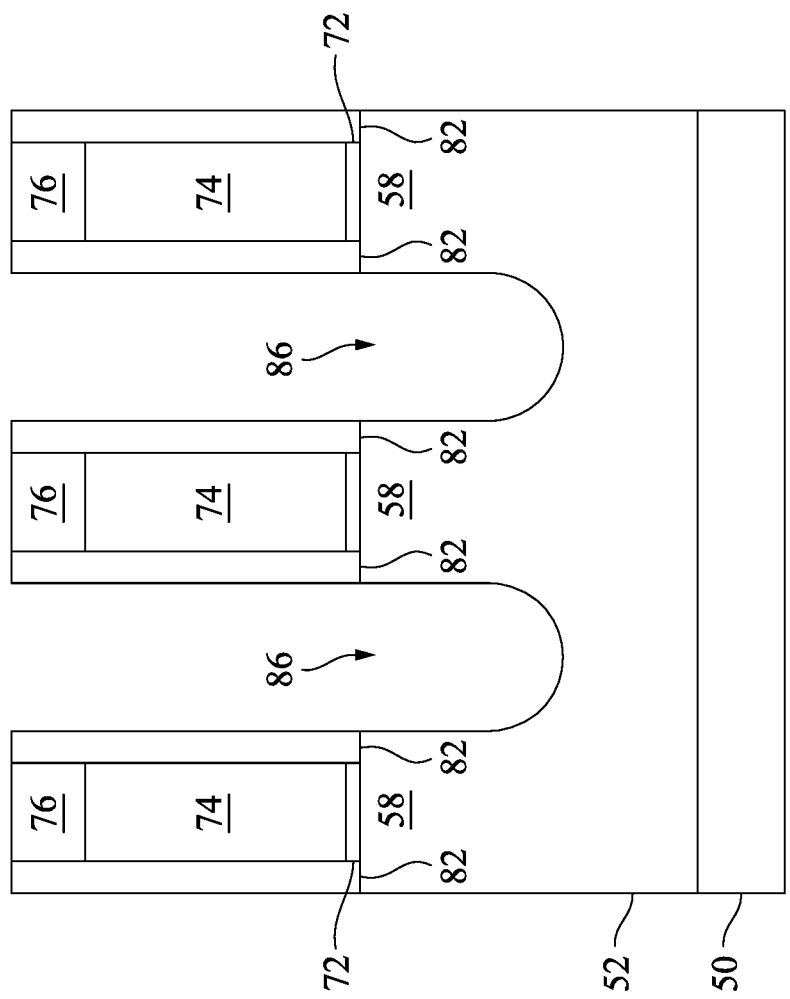
Figure 6C:
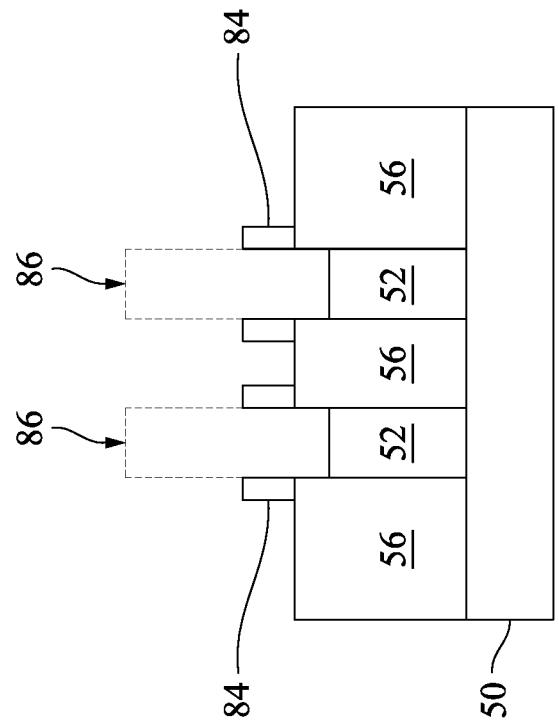
Figure 6B:
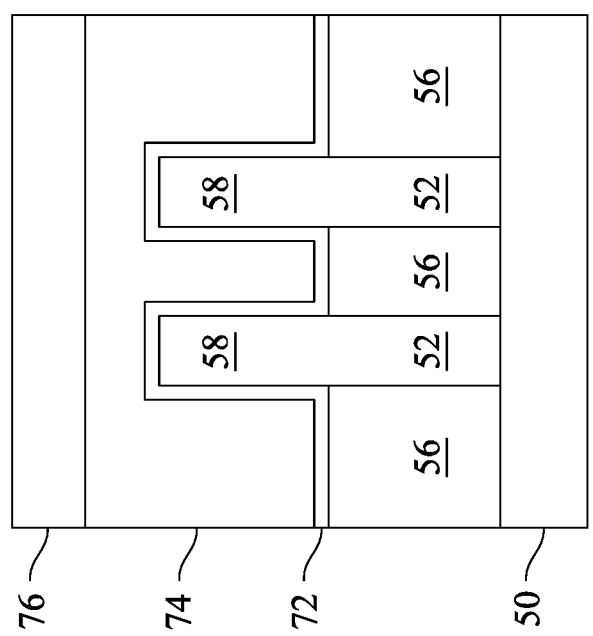

In FIGS. 6A-6C, source/drain recesses 86 are formed in the fins 52. In the illustrated embodiment, the source/drain recesses 86 extend into the fins 52. The source/drain recesses 86 may also extend into the substrate 50. In various embodiments, the source/drain recesses 86 may extend to a top surface of the substrate 50 without etching the substrate 50; the fins 52 may be etched such that bottom surfaces of the source/drain recesses 86 are disposed below the top surfaces of the STI regions 56; or the like. The source/drain recesses 86 may be formed by etching the fins 52 using an anisotropic etching processes, such as a RIE, a NBE, or the like. The gate spacers 82 and the dummy gates 74 collectively mask portions of the fins 52 during the etching processes used to form the source/drain recesses 86. Timed etch processes may be used to stop the etching of the source/drain recesses 86 after the source/drain recesses 86 reach a desired depth. In some embodiments, the fin spacers 84 are also recessed until they are a desired height. Controlling the height of the fin spacers 84 allows the dimensions of the subsequently grown source/drain regions to be controlled.

Figure 7A:
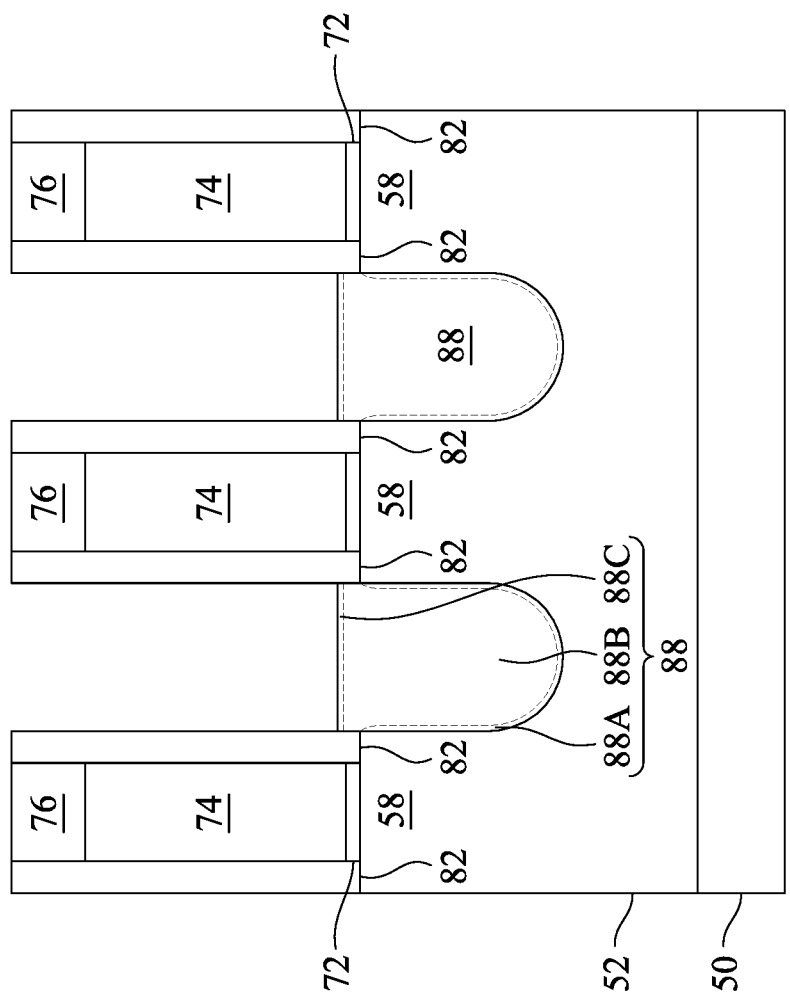
Figure 7C:
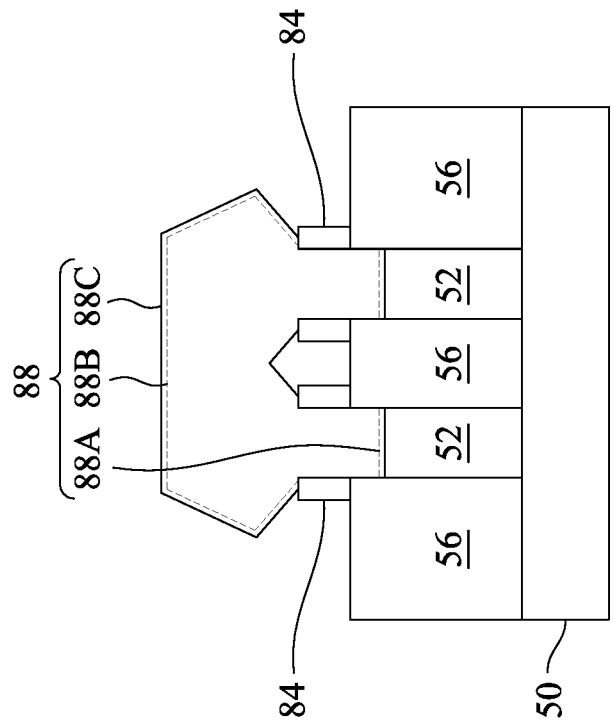
Figure 7B:
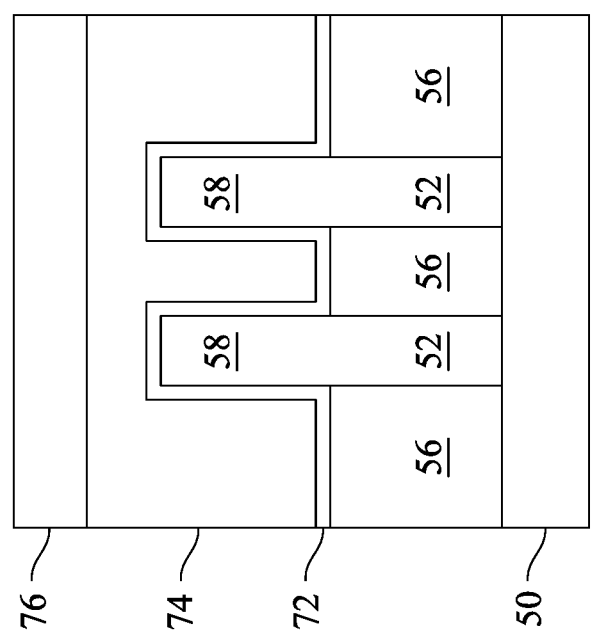

In FIGS. 7A-7C, epitaxial source/drain regions 88 are formed in the source/drain recesses 86. The epitaxial source/drain regions 88 are thus disposed in the fins 52 such that each dummy gate 74 (and corresponding channel region 58) is between respective adjacent pairs of the epitaxial source/drain regions 88. The epitaxial source/drain regions 88 thus adjoin the channel regions 58. In some embodiments, the gate spacers 82 are used to separate the epitaxial source/drain regions 88 from the dummy gates 74 by an appropriate lateral distance so that the epitaxial source/drain regions 88 do not short out with subsequently formed gates of the resulting FinFETs. A material of the epitaxial source/drain regions 88 may be selected to exert stress in the respective channel regions 58, thereby improving performance.

The epitaxial source/drain regions 88 in the n-type region 50N may be formed by masking the p-type region 50P. Then, the epitaxial source/drain regions 88 in the n-type region 50N are epitaxially grown in the source/drain recesses 86 in the n-type region 50N. The epitaxial source/drain regions 88 may include any acceptable material appropriate for n-type devices. For example, if the fins 52 are silicon, the epitaxial source/drain regions 88 in the n-type region 50N may include materials exerting a tensile strain on the channel regions 58, such as silicon, silicon carbide, phosphorous doped silicon carbide, silicon phosphide, or the like. The epitaxial source/drain regions 88 in the n-type region 50N may be referred to as "n-type source/drain regions." The epitaxial source/drain regions 88 in the n-type region 50N may have surfaces raised from respective surfaces of the fins 52 and may have facets.

The epitaxial source/drain regions 88 in the p-type region 50P may be formed by masking the n-type region 50N. Then, the epitaxial source/drain regions 88 in the p-type region 50P are epitaxially grown in the source/drain recesses 86 in the p-type region 50P. The epitaxial source/drain regions 88 may include any acceptable material appropriate for p-type devices. For example, if the fins 52 are silicon, the epitaxial source/drain regions 88 in the p-type region 50P may include materials exerting a compressive strain on the channel regions 58, such as silicon germanium, boron doped silicon germanium, germanium, germanium tin, or the like. The epitaxial source/drain regions 88 in the p-type region 50P may be referred to as "p-type source/drain regions." The epitaxial source/drain regions 88 in the p-type region 50P may have surfaces raised from respective surfaces of the fins 52 and may have facets.

The epitaxial source/drain regions 88 and/or the fins 52 may be implanted with impurities to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 88 may be in situ doped during growth.

As a result of the epitaxy processes used to form the epitaxial source/drain regions 88, upper surfaces of the epitaxial source/drain regions have facets which expand laterally outward beyond sidewalls of the fins 52. In some embodiments, these facets cause adjacent epitaxial source/drain regions 88 to merge as illustrated by FIG. 7C. In some embodiments, adjacent epitaxial source/drain regions 88 remain separated after the epitaxy process is completed. In the illustrated embodiments, the fin spacers 84 are formed to cover a portion of the sidewalls of the fins 52 that extend above the STI regions 56, thereby blocking the epitaxial growth. In another embodiment, the spacer etch used to form the gate spacers 82 is adjusted to not form the fin spacers 84, so as to allow the epitaxial source/drain regions 88 to extend to the surface of the STI regions 56.

The epitaxial source/drain regions 88 may include one or more semiconductor material layers. For example, the epitaxial source/drain regions 88 may each include a liner layer 88A, a main layer 88B, and a finishing layer 88C (or more generally, a first semiconductor material layer, a second semiconductor material layer, and a third semiconductor material layer). Any number of semiconductor material layers may be used for the epitaxial source/drain regions 88. The liner layers 88A, the main layers 88B, and the finishing layers 88C may be formed of different semiconductor materials and may be doped to different impurity concentrations. In some embodiments, the main layers 88B have a greater concentration of impurities than the finishing layers 88C, and the finishing layers 88C have a greater concentration of impurities than the liner layers 88A. In embodiments in which the epitaxial source/drain regions 88 include three semiconductor material layers, the liner layers 88A may be grown in the source/drain recesses 86, the main layers 88B may be grown on the liner layers 88A, and the finishing layers 88C may be grown on the main layers 88B. Forming the liner layers 88A with a lesser concentration of impurities than the main layers 88B may increase adhesion in the source/drain recesses 86, and forming the finishing layers 88C with a lesser concentration of impurities than the main layers 88B may reduce out-diffusion of dopants from the main layers 88B during subsequent processing.

Figure 8A:
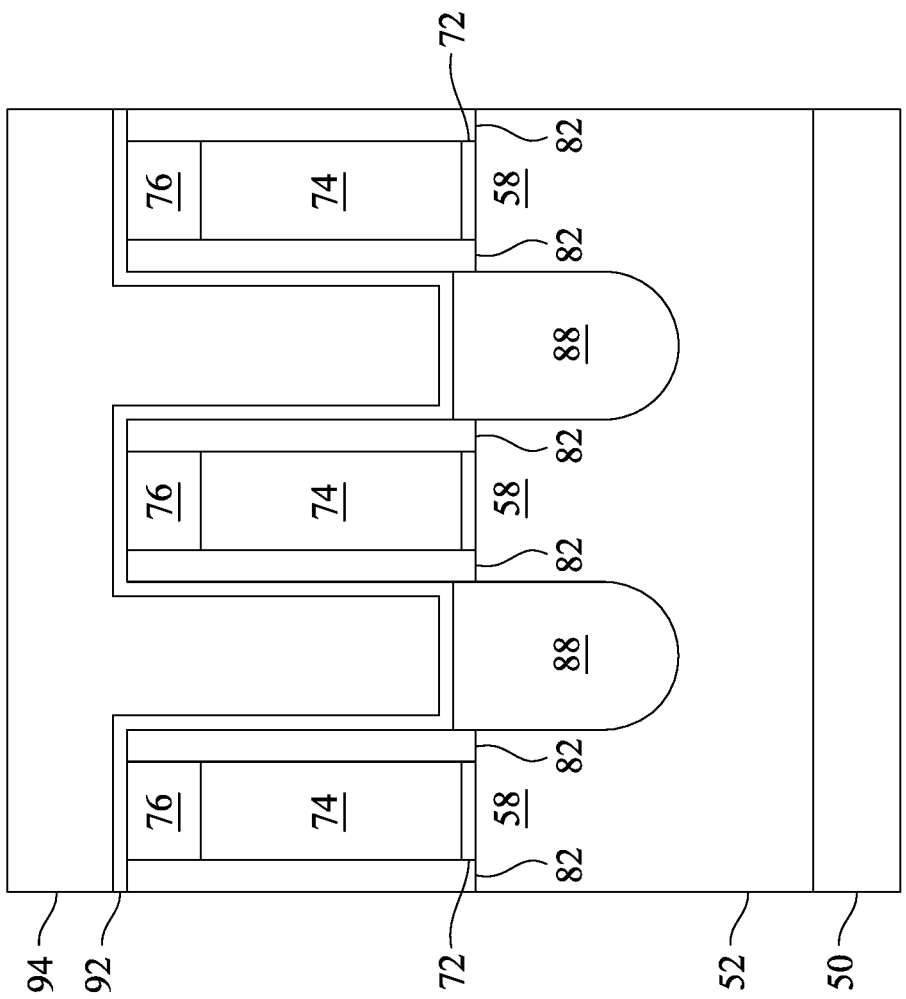
Figure 8C:
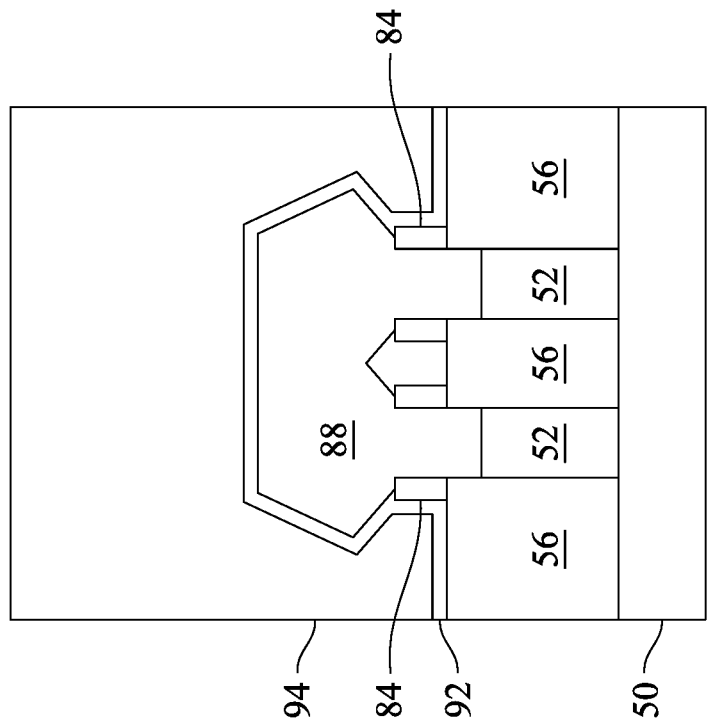
Figure 8B:
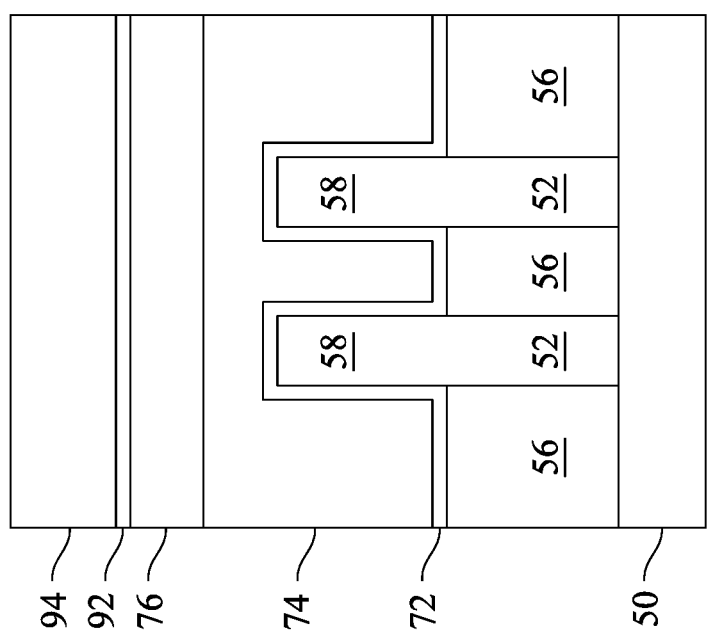

In FIGS. 8A-8C, a first inter-layer dielectric (ILD) 94 is deposited over the epitaxial source/drain regions 88, the gate spacers 82, and the masks 76 (if present) or the dummy gates 74. The first ILD 94 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 92 is formed between the first ILD 94 and the epitaxial source/drain regions 88, the gate spacers 82, and the masks 76 (if present) or the dummy gates 74. The CESL 92 may be formed of a dielectric material, such as silicon nitride, silicon oxide, silicon oxynitride, or the like, having a high etching selectivity from the etching of the first ILD 94. The CESL 92 may be formed by an any suitable method, such as CVD, ALD, or the like.

Figure 9A:
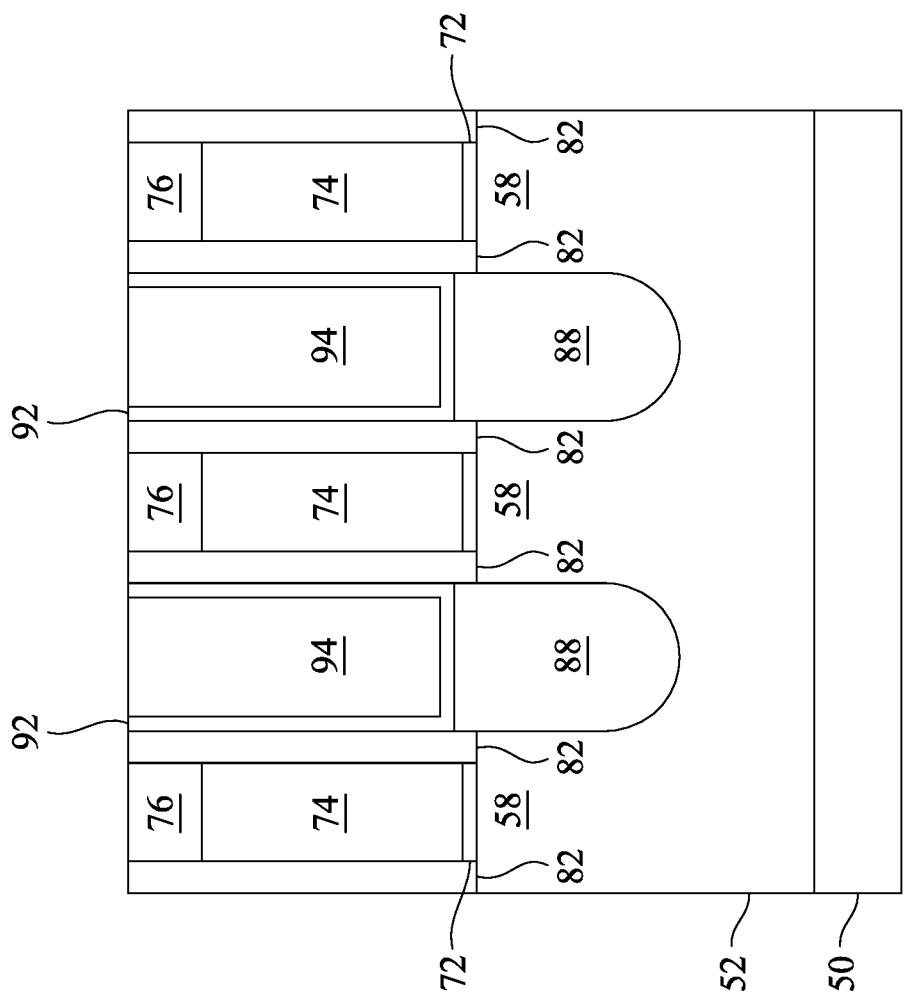
Figure 9C:
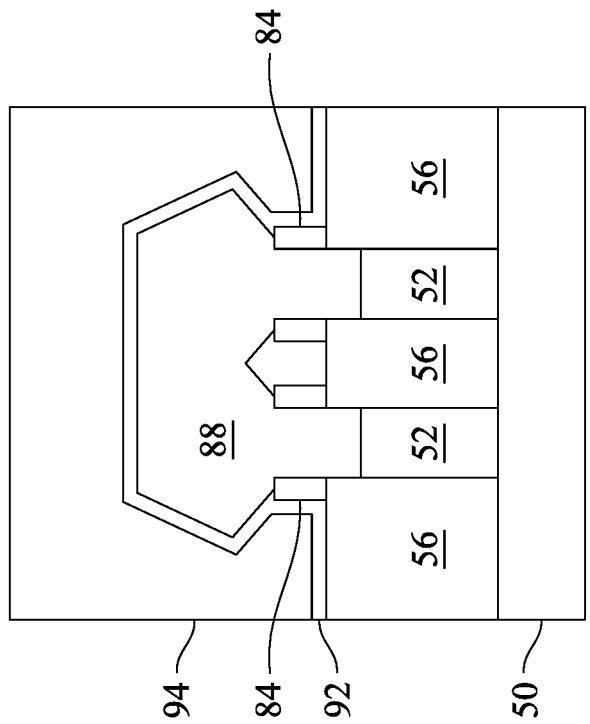
Figure 9B:
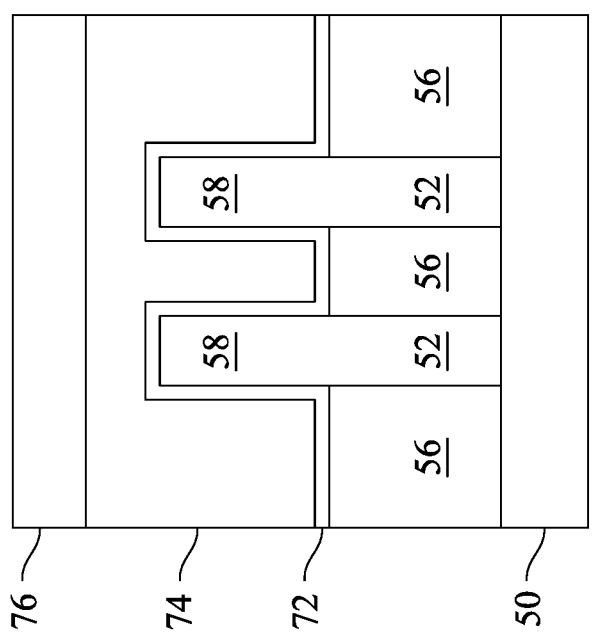

In FIGS. 9A-9C, a removal process is performed to level the top surfaces of the first ILD 94 with the top surfaces of the masks 76 (if present) or the dummy gates 74. In some embodiments, a planarization process such as a chemical mechanical polish (CMP), an etch-back process, combinations thereof, or the like may be utilized. The planarization process may also remove the masks 76 on the dummy gates 74, and portions of the gate spacers 82 along sidewalls of the masks 76. After the planarization process, the top surfaces of the first ILD 94, the CESL 92, the gate spacers 82, and the masks 76 (if present) or the dummy gates 74 are coplanar (within process variations). Also after the planarization process, the gate spacers 82 have a uniform height. Accordingly, the top surfaces of the masks 76 (if present) or the dummy gates 74 are exposed through the first ILD 94. In the illustrated embodiment, the masks 76 remain, and the planarization process levels the top surfaces of the first ILD 94 with the top surfaces of the masks 76.

Figure 10A:
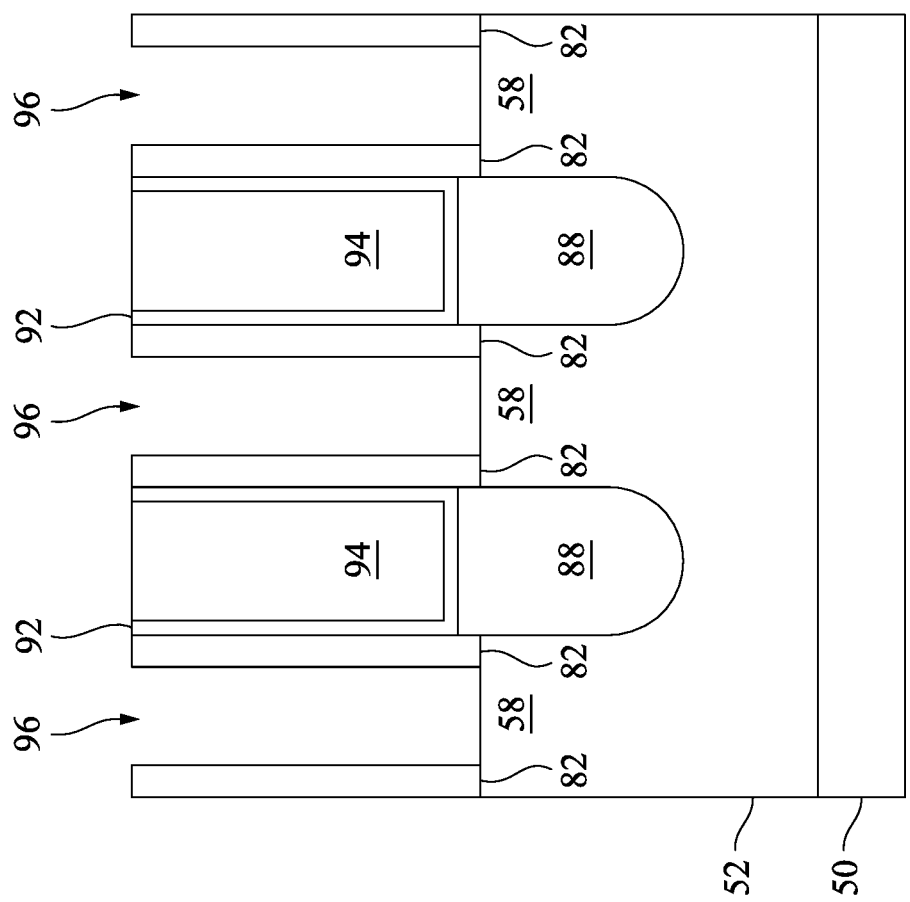
Figure 10C:
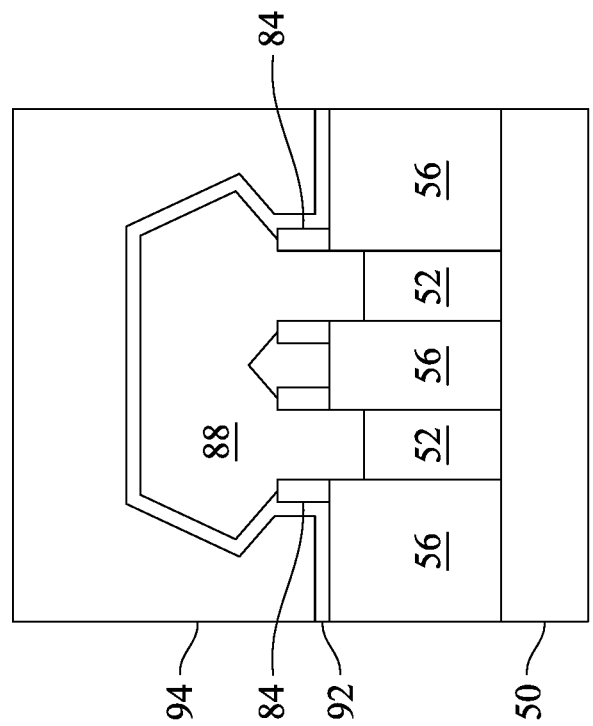
Figure 10B:
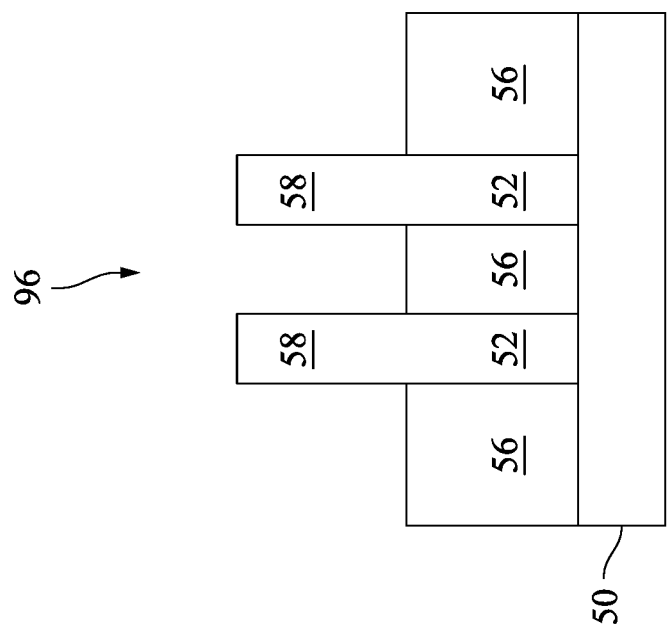

In FIGS. 10A-10C, the masks 76 (if present) and the dummy gates 74 are removed in an etching process, so that recesses 96 are formed. Portions of the dummy dielectrics 72 in the recesses 96 may also be removed. In some embodiments, only the dummy gates 74 are removed and the dummy dielectrics 72 remain and are exposed by the recesses 96. In some embodiments, the dummy dielectrics 72 are removed from recesses 96 in a first region of a die (e.g., a core logic region) and remain in recesses 96 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 94 or the gate spacers 82. During the removal, the dummy dielectrics 72 may be used as etch stop layers when the dummy gates 74 are etched. The dummy dielectrics 72 may then be optionally removed after the removal of the dummy gates 74. Each recess 96 exposes and/or overlies a channel region 58 of a respective fin 52.

Figure 11A:
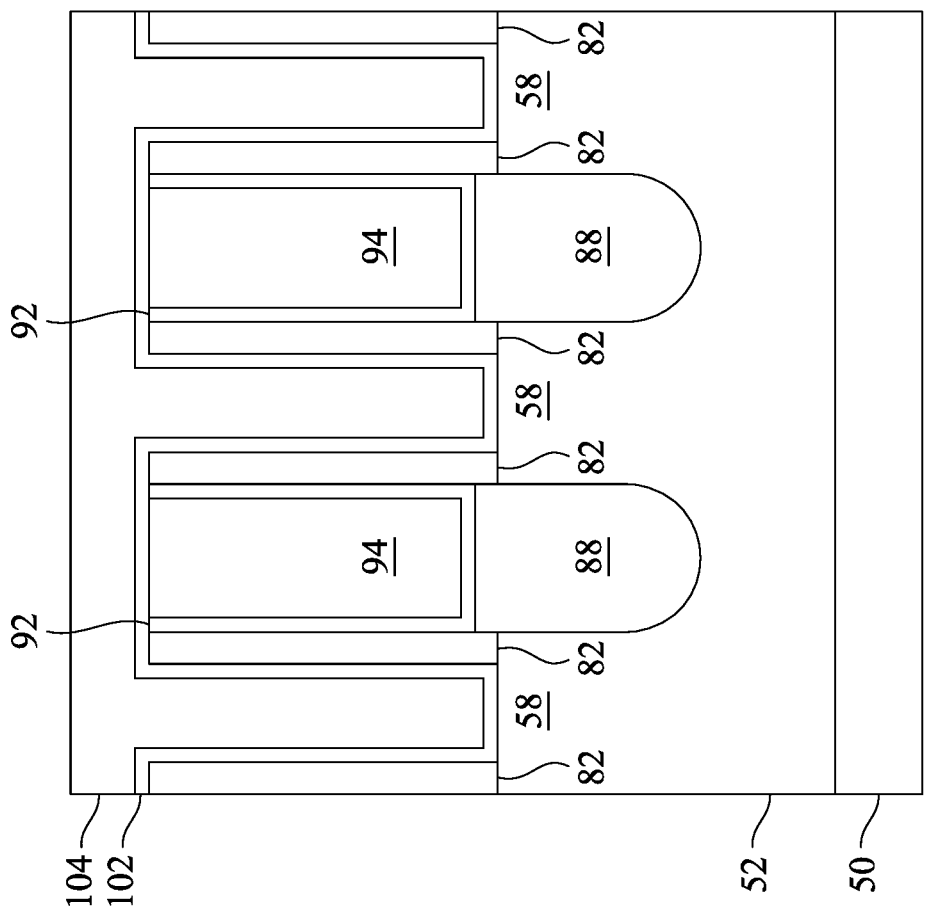
Figure 11C:
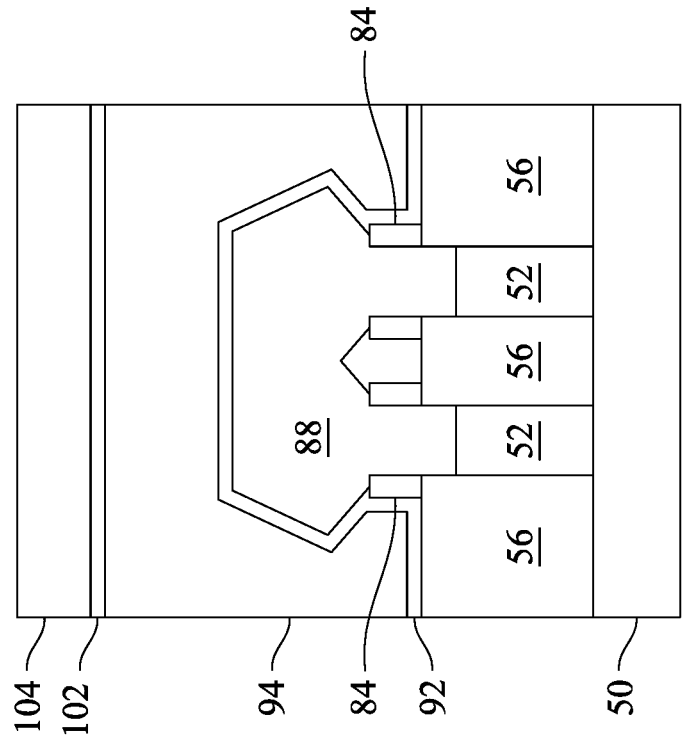
Figure 11B:
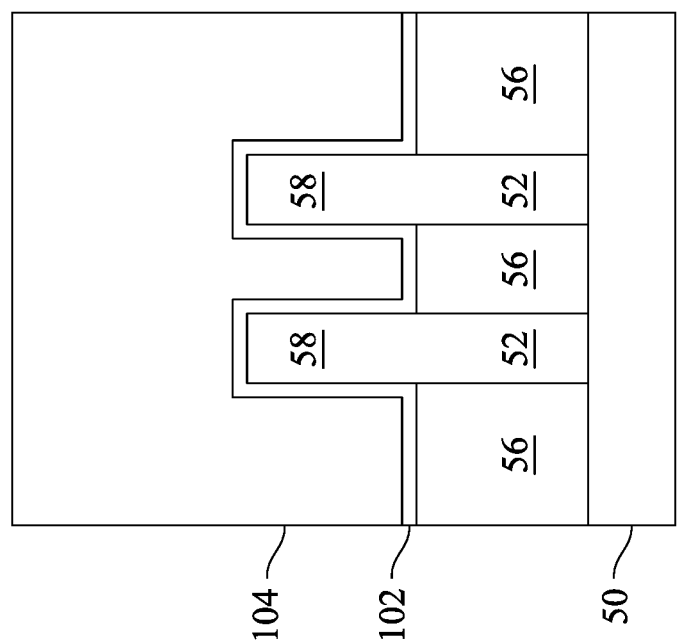

In FIGS. 11A-11C, a gate dielectric layer 102 is formed in the recesses 96. A gate electrode layer 104 is formed on the gate dielectric layer 102. The gate dielectric layer 102 and the gate electrode layer 104 are layers for replacement gates, and each extend along sidewalls and over top surfaces of the channel regions 58.

The gate dielectric layer 102 is disposed on the sidewalls and/or the top surfaces of the fins 52 and on the sidewalls of the gate spacers 82. The gate dielectric layer 102 may also be formed on the top surfaces of the first ILD 94 and the gate spacers 82. The gate dielectric layer 102 may include an oxide such as silicon oxide or a metal oxide, a silicate such as a metal silicate, combinations thereof, multi-layers thereof, or the like. The gate dielectric layer 102 may include a dielectric material having a k-value greater than about 7.0 (e.g., a high-k dielectric material), such as a metal oxide or a silicate of hafnium, aluminum, zirconium, lanthanum, manganese, barium, titanium, lead, and combinations thereof. The formation methods of the gate dielectric layer 102 may include molecular-beam deposition (MBD), ALD, PECVD, and the like. In embodiments where portions of the dummy dielectrics 72 remain in the recesses 96, the gate dielectric layer 102 includes a material of the dummy dielectrics 72 (e.g., silicon oxide). Although a single-layered gate dielectric layer 102 is illustrated, the gate dielectric layer 102 may include any number of interfacial layers and any number of main layers. For example, the gate dielectric layer 102 may include an interfacial layer and an overlying high-k dielectric layer.

The gate electrode layer 104 may include a metal-containing material such as titanium nitride, titanium oxide, tantalum nitride, tantalum carbide, tungsten, cobalt, ruthenium, aluminum, combinations thereof, multi-layers thereof, or the like. Although a single-layered gate electrode layer 104 is illustrated, the gate electrode layer 104 may include any number of work function tuning layers, any number of barrier layers, any number of glue layers, and a fill material.

The formation of the gate dielectric layer 102 in the n-type region 50N and the p-type region 50P may occur simultaneously such that the gate dielectric layer 102 in each region is formed of the same material(s), and the formation of the gate electrode layer 104 may occur simultaneously such that the gate electrode layer 104 in each region is formed of the same material(s). In some embodiments, the gate dielectric layers 102 in each region may be formed by distinct processes, such that the gate dielectric layers 102 may be different materials and/or have a different number of layers, and/or the gate electrode layers 104 in each region may be formed by distinct processes, such that the gate electrode layers 104 may be different materials and/or have a different number of layers. Various masking steps may be used to mask and expose appropriate regions when using distinct processes.

Figure 12A:
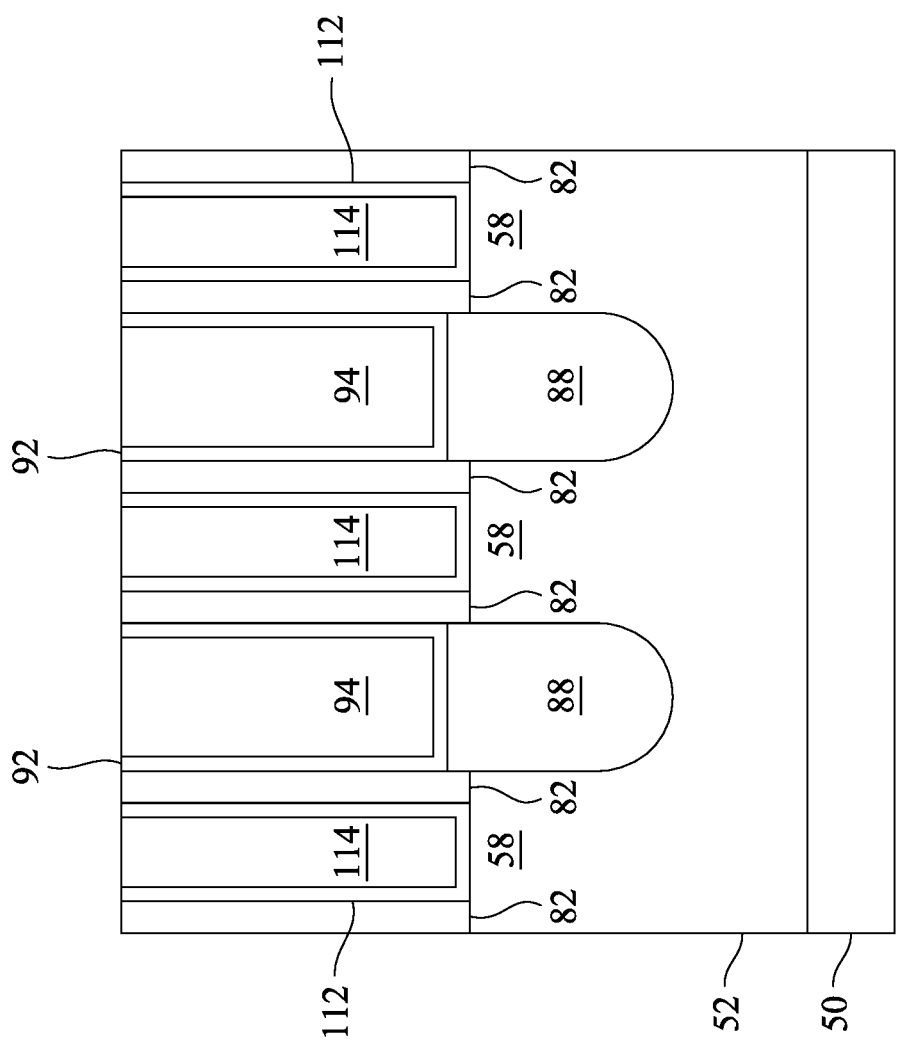
Figure 12C:
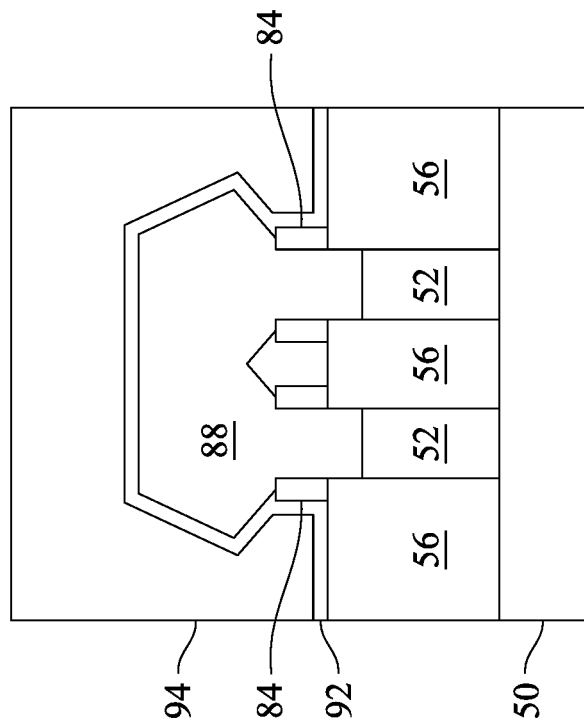
Figure 12B:
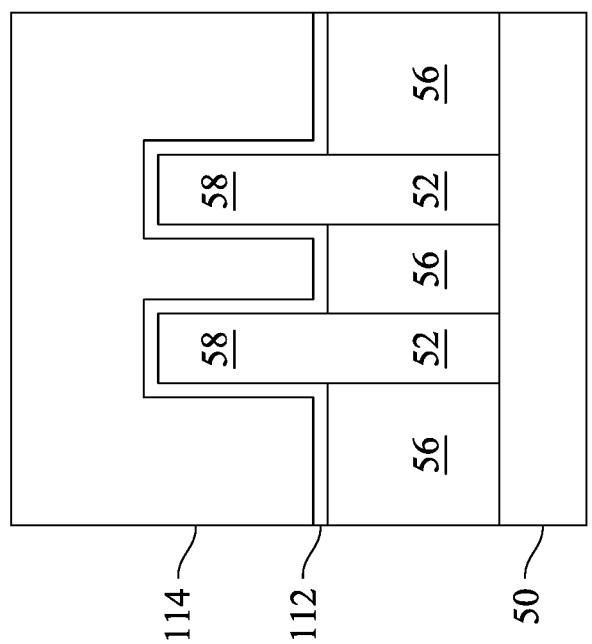

In FIGS. 12A-12C, a removal process is performed to remove the excess portions of the materials of the gate dielectric layer 102 and the gate electrode layer 104, which excess portions are over the top surfaces of the first ILD 94, the CESL 92, and the gate spacers 82, thereby forming gate dielectrics 112 and gate electrodes 114. In some embodiments, a planarization process such as a chemical mechanical polish (CMP), an etch-back process, combinations thereof, or the like may be utilized. The gate dielectric layer 102, when planarized, has portions left in the recesses 96 (thus forming the gate dielectrics 112). The gate electrode layer 104, when planarized, has portions left in the recesses 96 (thus forming the gate electrodes 114). After the planarization process, the top surfaces of the gate spacers 82, the CESL 92, the first ILD 94, the gate dielectrics 112, and the gate electrodes 114 are coplanar (within process variations). The gate dielectrics 112 and the gate electrodes 114 form replacement gates of the resulting FinFETs. Each respective pair of a gate dielectric 112 and a gate electrode 114 may be collectively referred to as a "gate structure." The gate structures each extend along top surfaces, sidewalls, and bottom surfaces of a channel region 58 of fins 52.

Figure 13A:
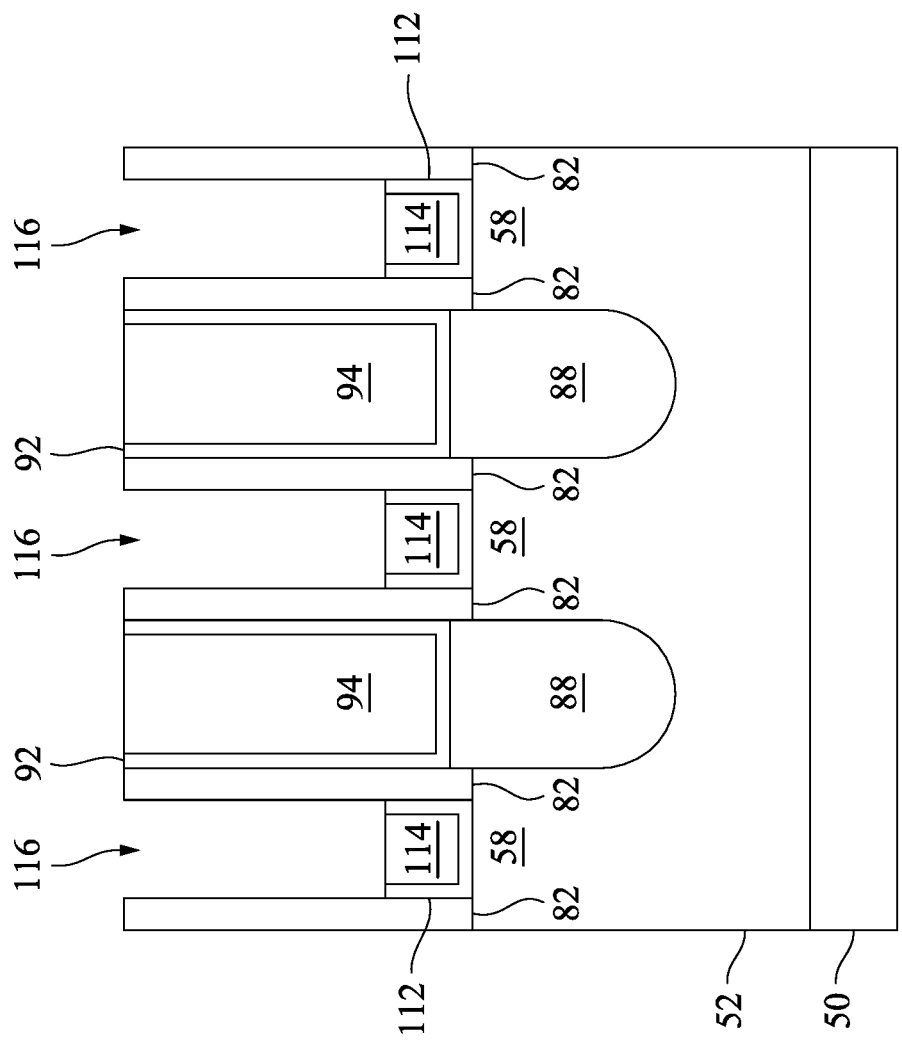

In FIGS. 13A-13C, the gate structures (including the gate dielectrics 112 and the gate electrodes 114) are recessed to form recesses 116 directly over the gate structures. The gate structures may be recessed using any acceptable etching process, such as one that is selective to the material of the gate structures (e.g., selectively etches the materials of the gate dielectrics 112 and the gate electrodes 114 at a faster rate than the materials of the first ILD 94 and the CESL 92). The gate spacers 82 may also be recessed (not separately illustrated). When the gate spacers 82 are recessed, they may be recessed the same amount as the gate structures, or may be recessed by a different amount.

Figure 14A:
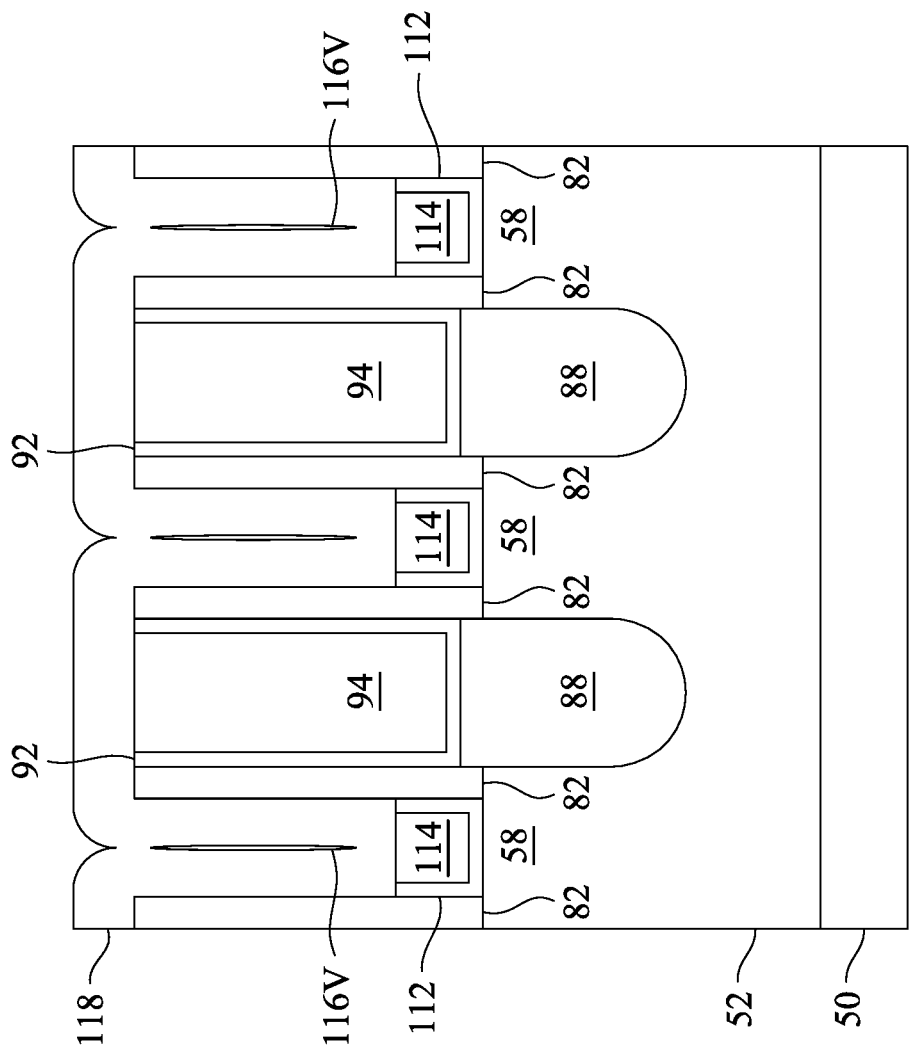
Figure 14C:
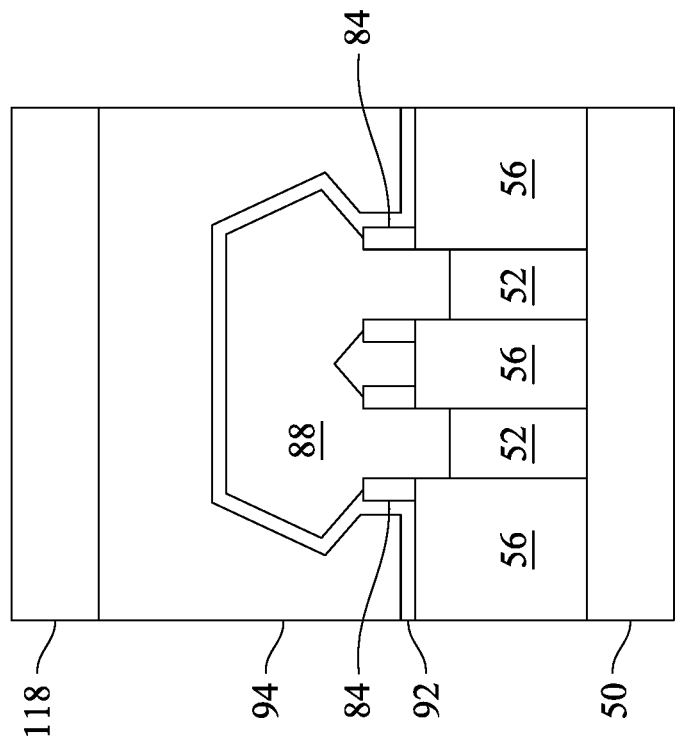
Figure 14B:
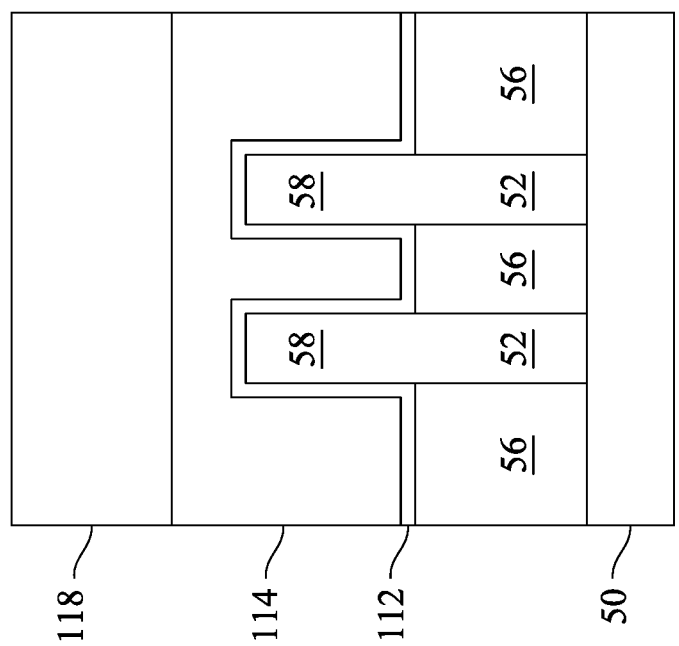

In FIGS. 14A-14C, one or more dielectric layer(s) 118 are conformally deposited in the recesses 116. The dielectric layer(s) 118 may also be formed on the top surfaces of the gate spacers 82, the first ILD 94, and the CESL 92. The dielectric layer(s) 118 are formed of dielectric material(s) that have a high etching selectivity from the etching of the first ILD 94 and the CESL 92. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. In some embodiments, pinch-off occurs during deposition of the dielectric layer(s) 118, such that the formation of the dielectric layer(s) 118 in the recesses 116 is incomplete. As a result, voids 116V are formed from the portions of the recesses 116 that are not filled by the dielectric layer(s) 118.

Figure 15A:
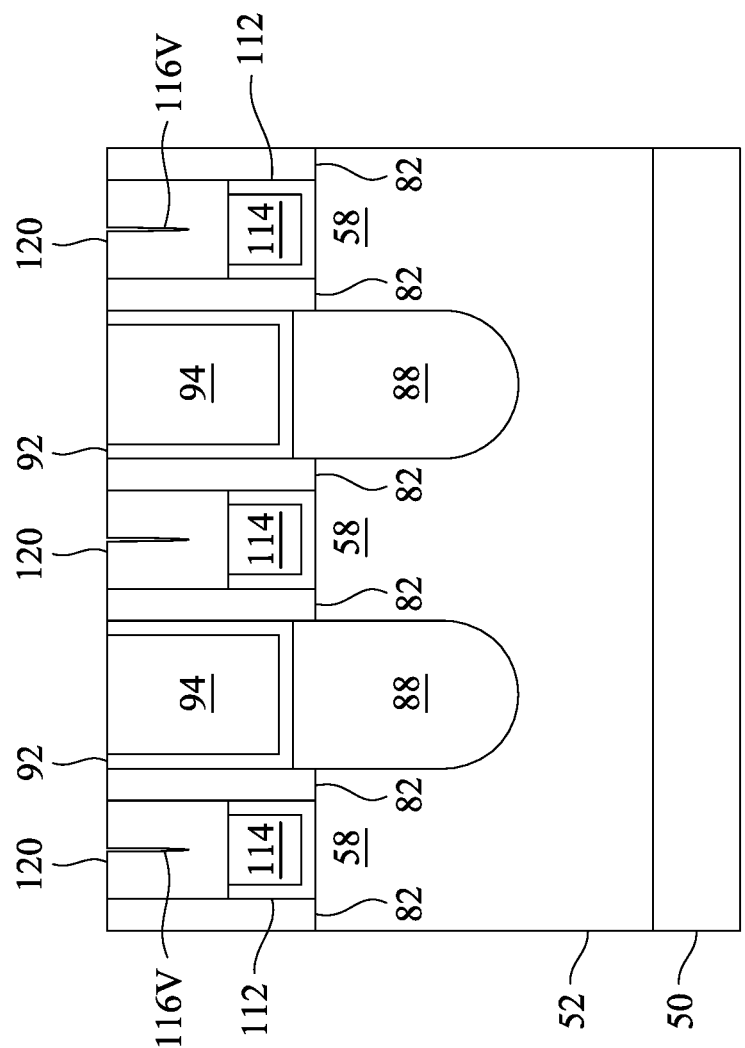
Figure 15C:
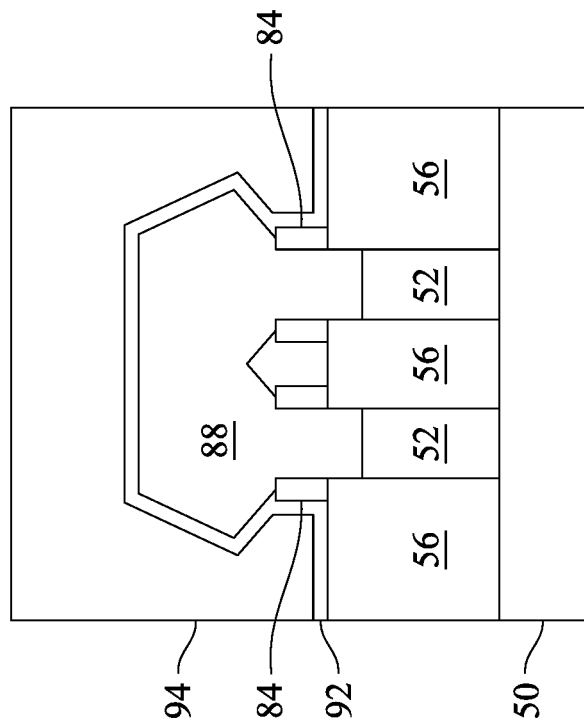
Figure 15B:
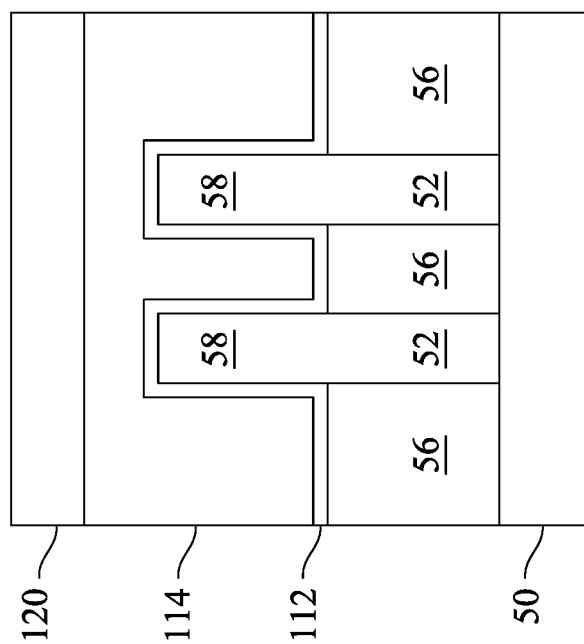

In FIGS. 15A-15C, a removal process is performed to remove the excess portions of the dielectric layer(s) 118, which excess portions are over the top surfaces of the gate spacers 82, the first ILD 94, and the CESL 92, thereby forming gate masks 120. In some embodiments, a planarization process such as a chemical mechanical polish (CMP), an etch-back process, combinations thereof, or the like may be utilized. The dielectric layer(s) 118, when planarized, have portions left in the recesses 116 (thus forming the gate masks 120). After the planarization process, the top surfaces of the gate spacers 82, the CESL 92, the first ILD 94, and the gate masks 120 are coplanar (within process variations). Gate contacts will be subsequently formed to penetrate through the gate masks 120 to contact the top surfaces of the gate electrodes 114. The voids 116V (if present) may or may not be breached by the planarization process. The gate spacers 82 are disposed on sidewalls of the gate masks 120 and the gate structures (including the gate dielectrics 112 and the gate electrodes 114).

Figure 16A:
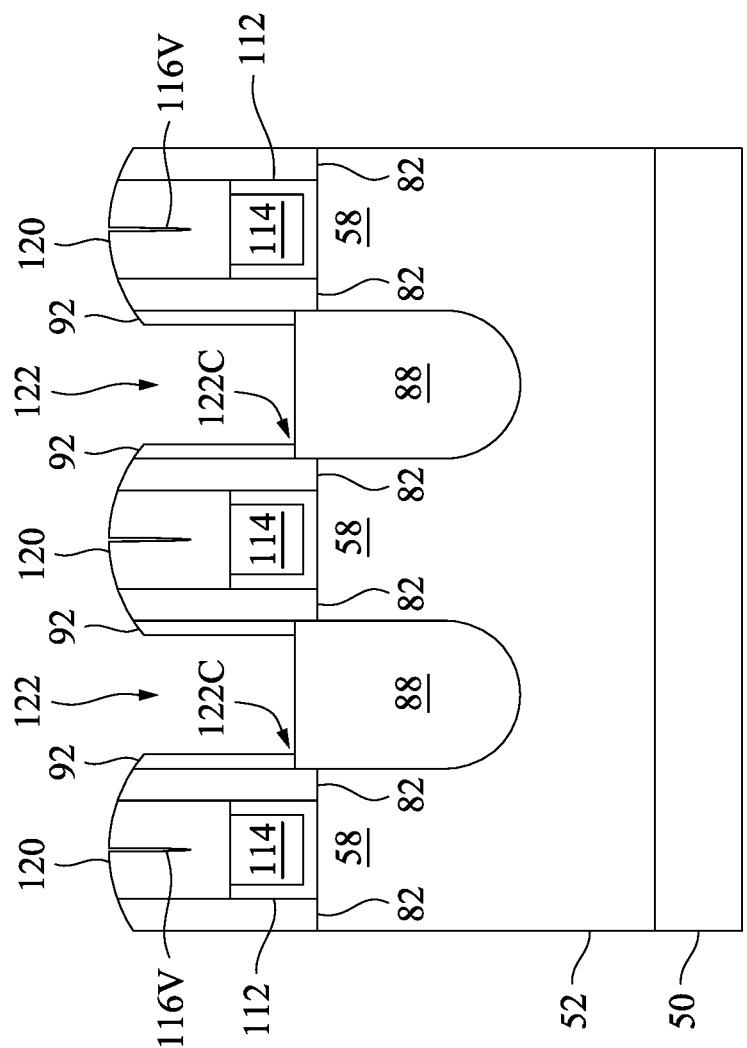
Figure 16C:
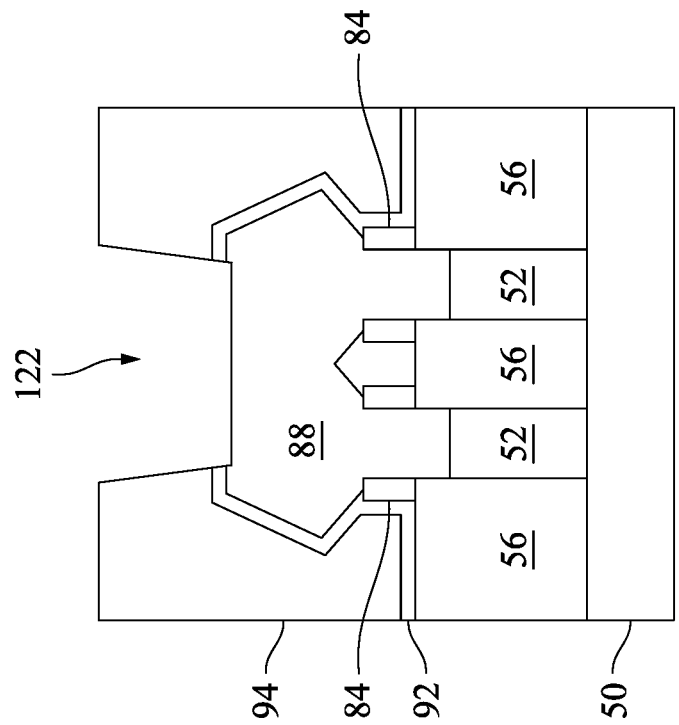
Figure 16B:
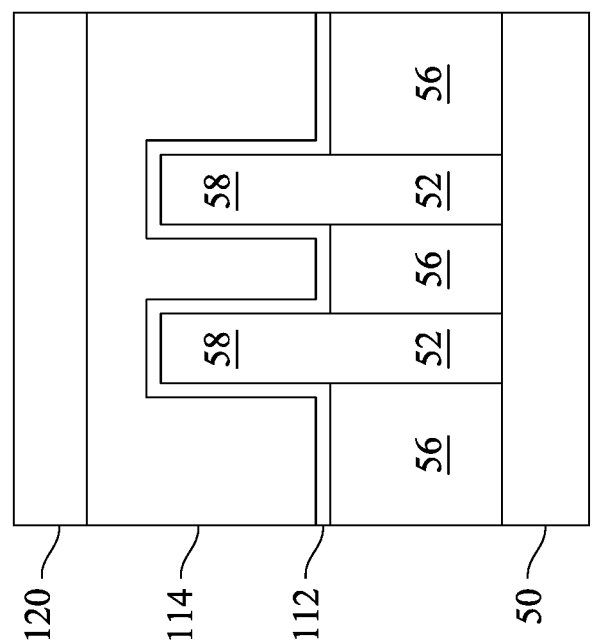

In FIGS. 16A-16C, contact openings 122 are formed through the first ILD 94 and the CESL 92. The contact openings 122 are source/drain contact openings formed by a self-aligned contact (SAC) process so that substantially no residue of the first ILD 94 remains in corner regions 122C of the contact openings 122. The corner regions 122C of the contact openings 122 are the corners defined by the sidewalls of the CESL 92 and the top surfaces of the epitaxial source/drain regions 88.

As an example to form the contact openings 122, a mask may be formed over the first ILD 94 and the gate masks 120. The mask is patterned with slot openings having a pattern of the contact openings 122. The mask may be, e.g., a photoresist, such as a single layer photoresist, a bi-layer photoresist, a tri-layer photoresist, or the like, which may be patterned using acceptable photolithography techniques to form the slot openings. Other types of masks formed by any acceptable process may be used. The slot openings are strips that run parallel to the lengthwise directions of the fins 52, overlapping the first ILD 94 and the gate masks 120. The first ILD 94 may then be etched using the mask as an etching mask and using the CESL 92 as an etch stop layer. The etching may be any acceptable etching process, such as one that is selective to the material of the first ILD 94 (e.g., selectively etches the material of the first ILD 94 at a faster rate than the material(s) of the CESL 92 and the gate masks 120). The etching process may be anisotropic. The portions of the first ILD 94 uncovered by the mask (e.g., exposed by the slot openings) are thus etched to form the contact openings 122. The contact openings 122 are then extended through the CESL 92 by any acceptable etching process to expose the epitaxial source/drain regions 88. After the etching processes, the mask may be removed, such as by any acceptable ashing process. Depending on the selectivity of the etching processes used to form the contact openings 122, some losses of the CESL 92 and/or the gate masks 120 may occur such that the sidewalls and/or top surfaces of the CESL 92 and/or the gate masks 120 are curved after etching. The gate masks 120 cover the gate structures (including the gate dielectrics 112 and the gate electrodes 114) during etching, thereby protecting the gate structures from etching losses.

Figure 17A:
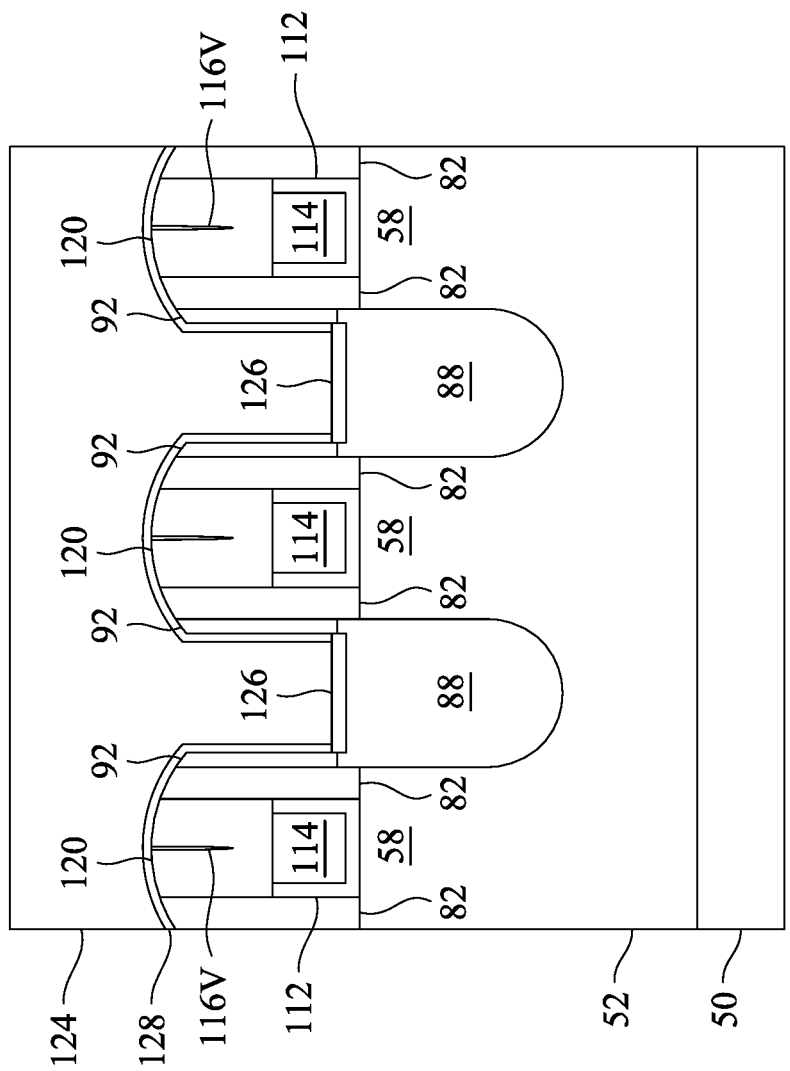
Figure 17C:
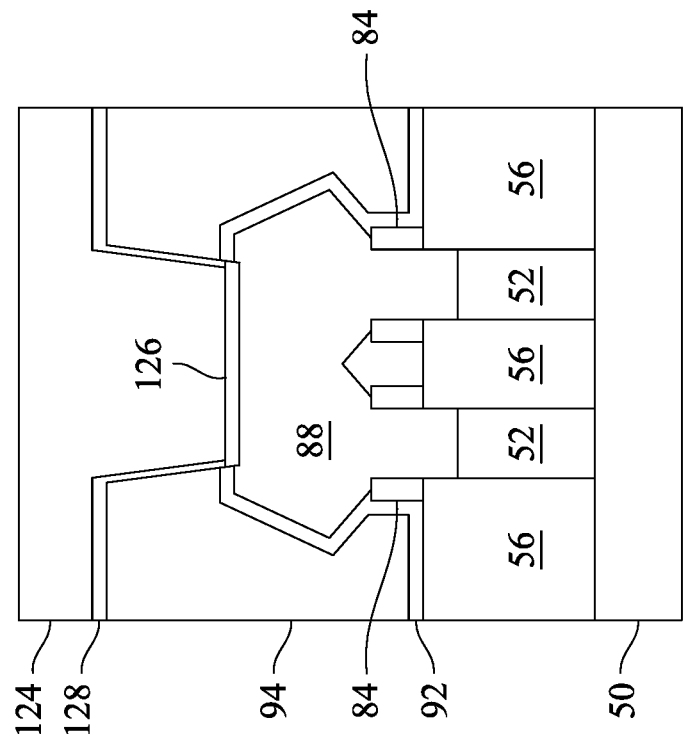
Figure 17B:
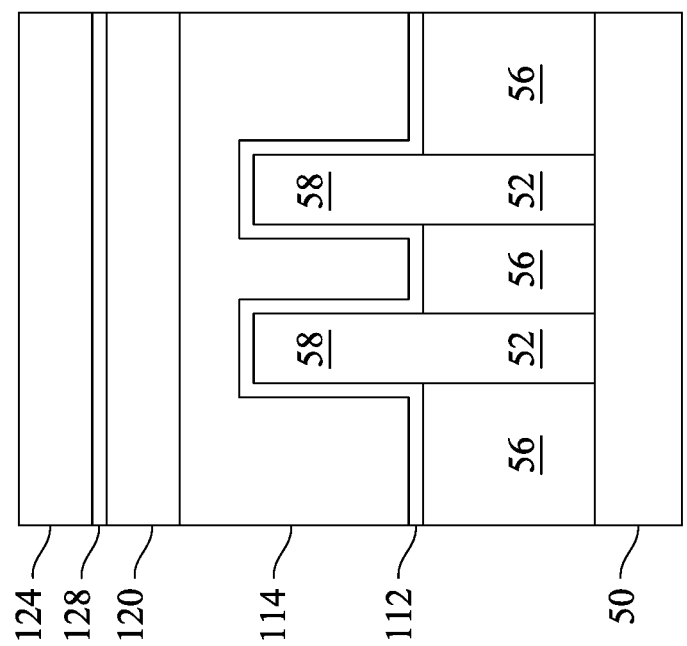

In FIGS. 17A-17C, conductive layer(s) 124 for source/drain contacts are formed in the contact openings 122. For example, the conductive layer(s) 124 may be formed by forming a liner (not separately illustrated), such as a diffusion barrier layer, an adhesion layer, or the like, and a conductive material in the contact openings 122. The liner may include titanium, titanium nitride, tantalum, tantalum nitride, or the like. The conductive material may be a metal such as copper, a copper alloy, silver, gold, tungsten, cobalt, aluminum, nickel, or the like, which may be formed by a deposition process such as PVD, ALD, CVD, or the like. The conductive layer(s) 124 are formed on the sidewalls and/or top surfaces of the gate spacers 82, the CESL 92, and/or the gate masks 120.

Optionally, metal-semiconductor alloy regions 126 are formed between the epitaxial source/drain regions 88 and the conductive layer(s) 124. The metal-semiconductor alloy regions 126 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 126 can be formed before the conductive layer(s) 124 by depositing a metal 128 in the contact openings 122 (e.g., on the epitaxial source/drain regions 88) and then performing a thermal anneal process. The metal 128 is formed on the sidewalls and/or top surfaces of the gate spacers 82, the CESL 92, and/or the gate masks 120. The metal 128 can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals or their alloys. The metal 128 can be deposited by a deposition process such as ALD, CVD, PVD, or the like. After the thermal anneal process, a cleaning process, such as a wet clean, may optionally be performed to remove any residual of the metal 128 from the contact openings 122, such as from surfaces of the metal-semiconductor alloy regions 126. In the illustrated embodiment, the cleaning process is omitted so that residue of the metal 128 remains on the sidewalls of the CESL 92. The conductive layer(s) 124 can then be formed on the metal-semiconductor alloy regions 126.

Figure 18A:
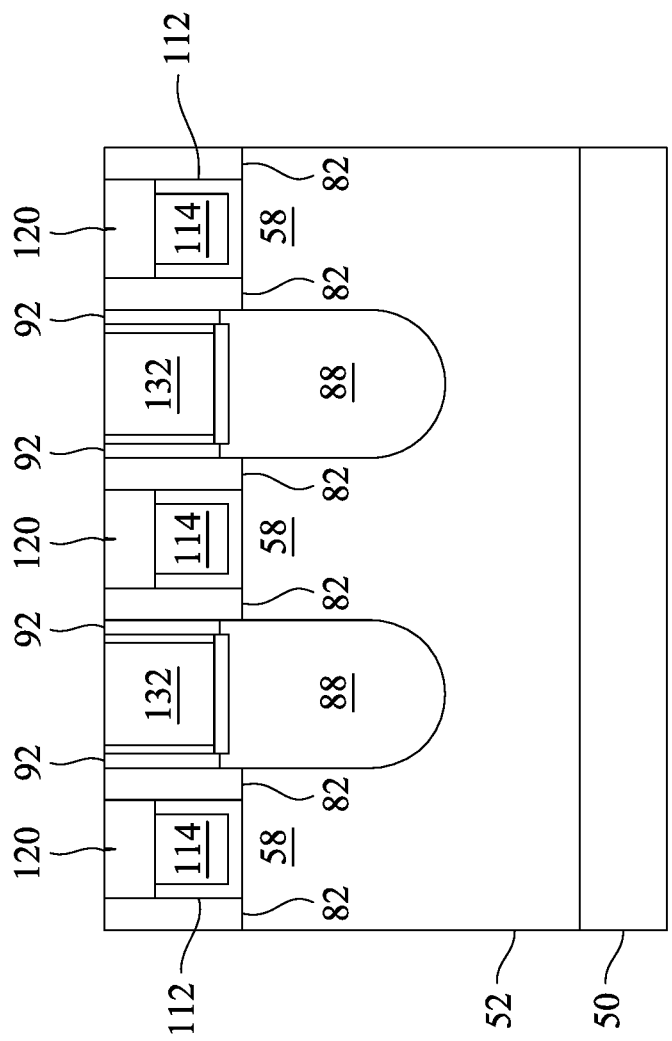
Figure 18C:
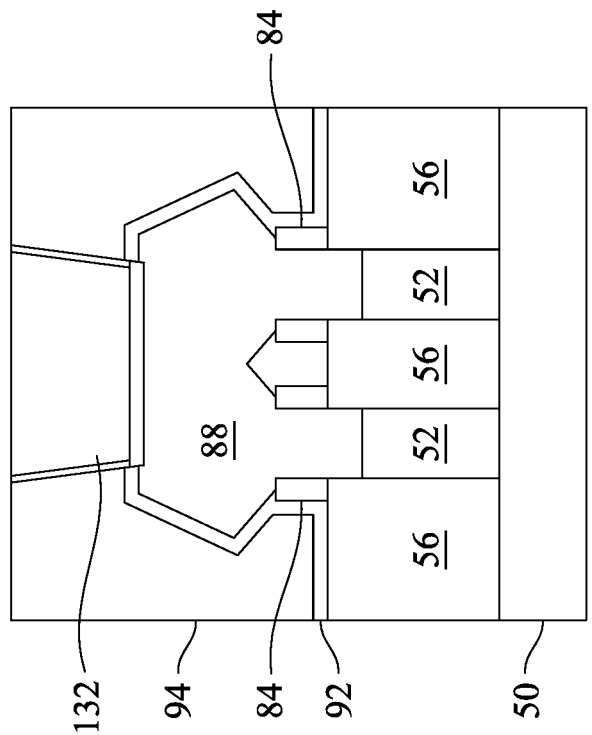
Figure 18B:
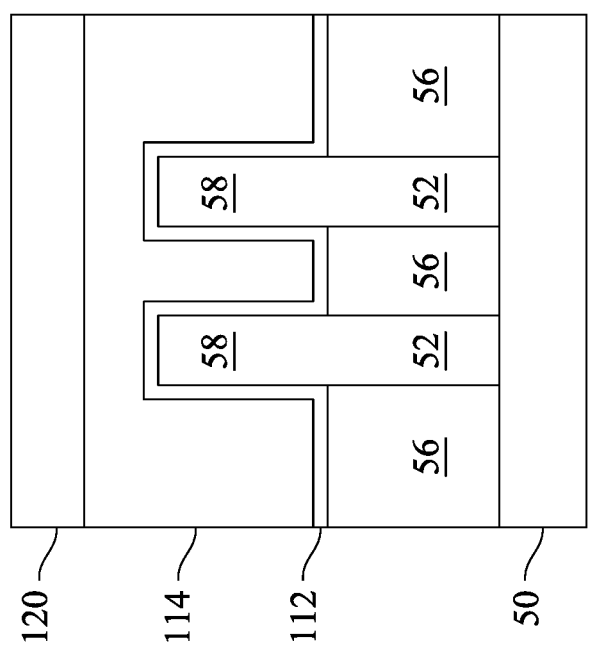

In FIGS. 18A-18C, a removal process is performed to remove excess portions of the metal 128 (if present) and the conductive layer(s) 124, which excess portions are over the top surfaces of the gate spacers 82, the CESL 92, the first ILD 94, and the gate masks 120. The removal process may also remove some portions of the gate spacers 82, the CESL 92, the first ILD 94, and/or the gate masks 120. In some embodiments, a planarization process such as a chemical mechanical polish (CMP), an etch-back process, combinations thereof, or the like may be utilized. The remaining conductive layer(s) 124 in the contact openings 122 form lower source/drain contacts 132 in the contact openings 122. After the planarization process, the top surfaces of the gate spacers 82, the CESL 92, the first ILD 94, the gate masks 120, the metal 128 (if present), and the lower source/drain contacts 132 are coplanar (within process variations). The lower source/drain contacts 132 extend through the first ILD 94. The voids 116V (if present) may or may not remain after the planarization process.

Figure 19A:
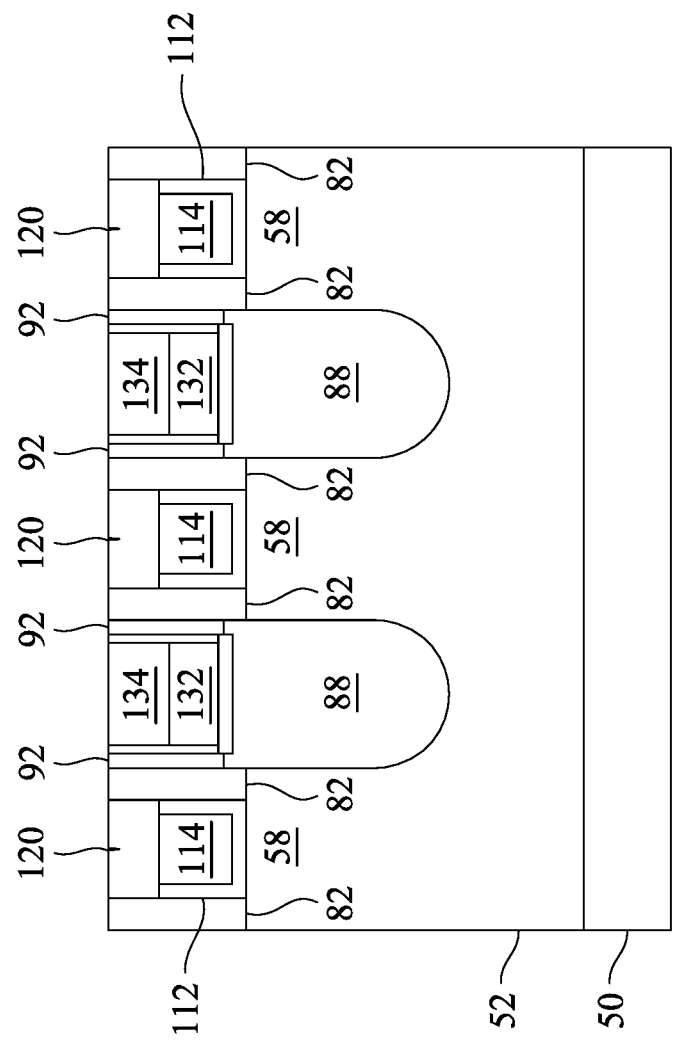
Figure 19C:
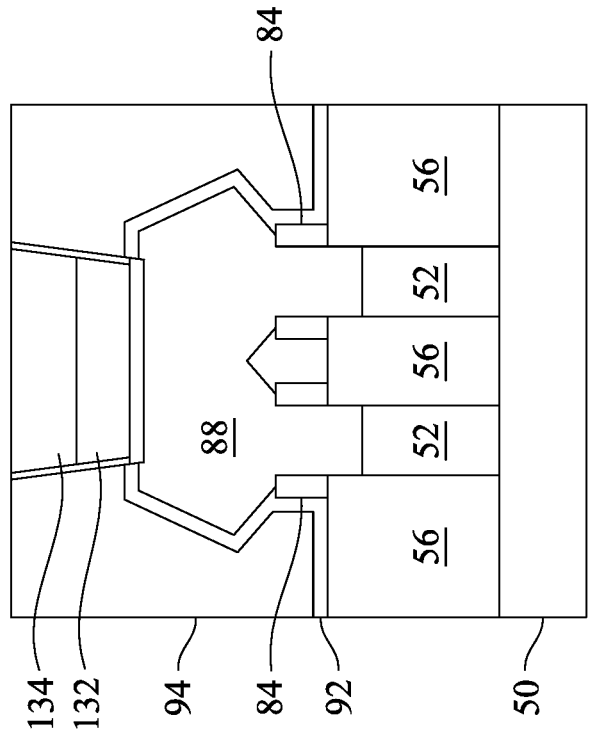
Figure 19B:
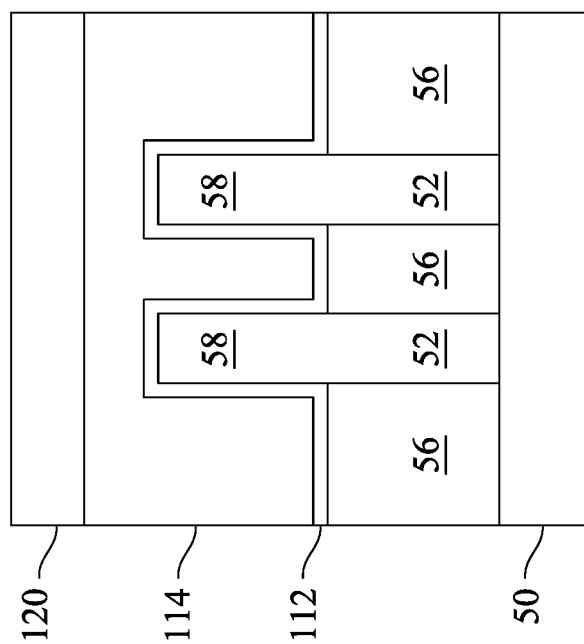

In FIGS. 19A-19C, contact masks 134 are optionally formed over the lower source/drain contacts 132. The contact masks 134 may be formed of materials that are selected from the same group of candidate materials of the gate masks 120. The gate masks 120 and the contact masks 134 may be formed from the same material, or may include different materials. The contact masks 134 may be formed in a similar manner as the gate masks 120. For example, the lower source/drain contacts 132 may be recessed. The lower source/drain contacts 132 may be recessed using any acceptable etching process. One or more dielectric layer(s) may be conformally deposited in the recesses. A removal process may be performed to remove the excess portions of the dielectric layer(s), which excess portions are over the top surfaces of the gate spacers 82, the CESL 92, the first ILD 94, and the gate masks 120. In some embodiments, a planarization process such as a chemical mechanical polish (CMP), an etch-back process, combinations thereof, or the like may be utilized. The dielectric layer(s), when planarized, have portions left in the recesses (thus forming the contact masks 134). After the planarization process, the top surfaces of the gate spacers 82, the CESL 92, the first ILD 94, the gate masks 120, and the contact masks 134 are coplanar (within process variations). Source/drain contacts will be subsequently formed to penetrate through the contact masks 134 to contact the top surfaces of the lower source/drain contacts 132.

Figure 20A:
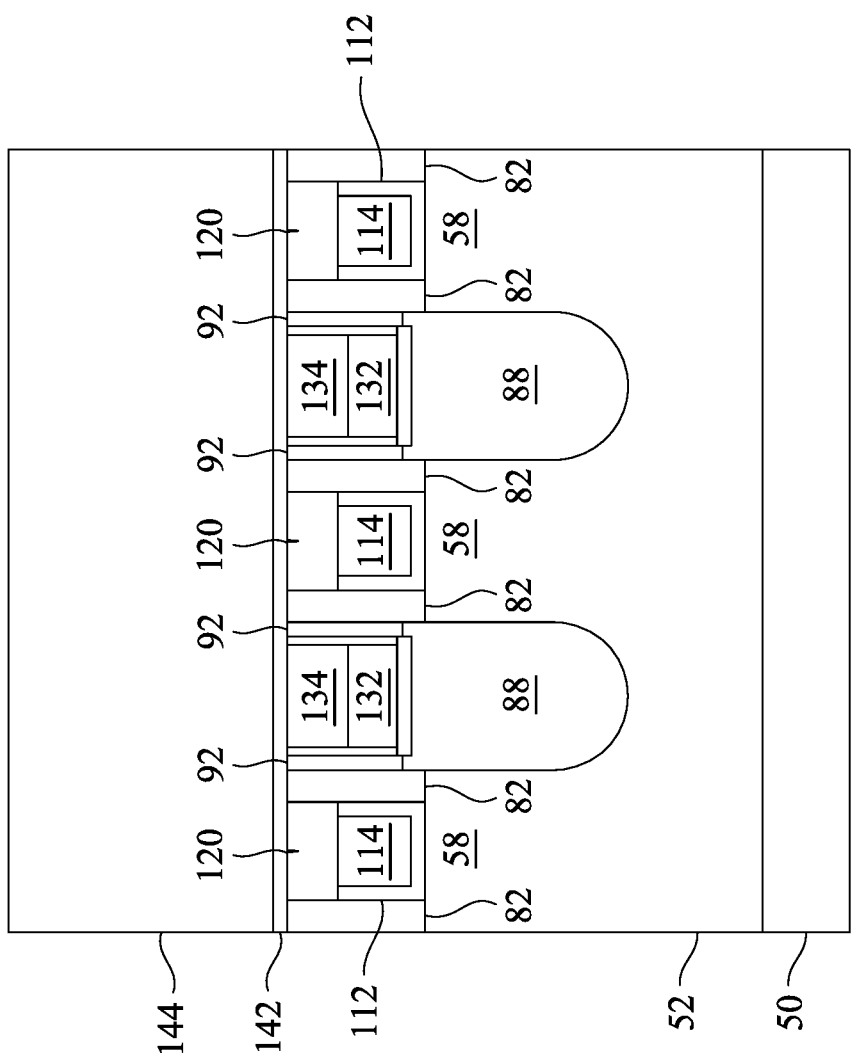
Figure 20C:
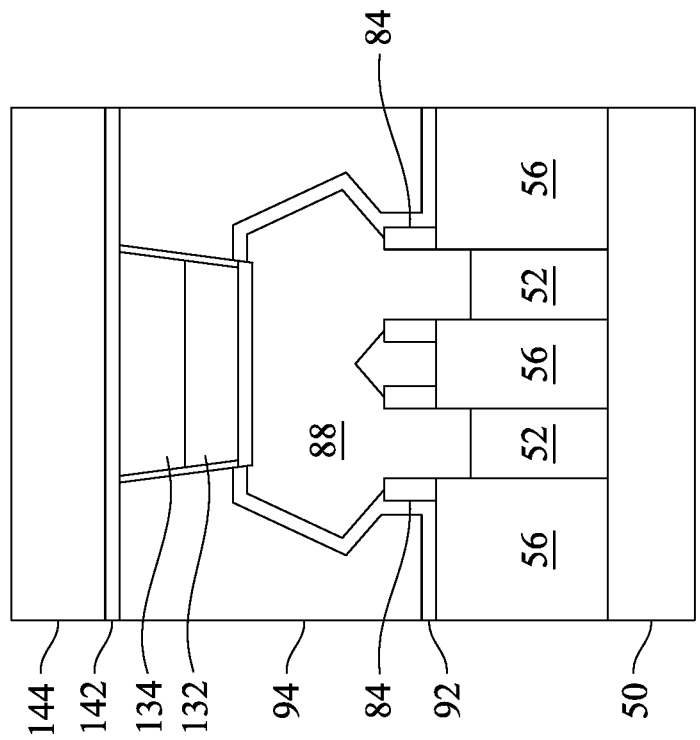
Figure 20B:
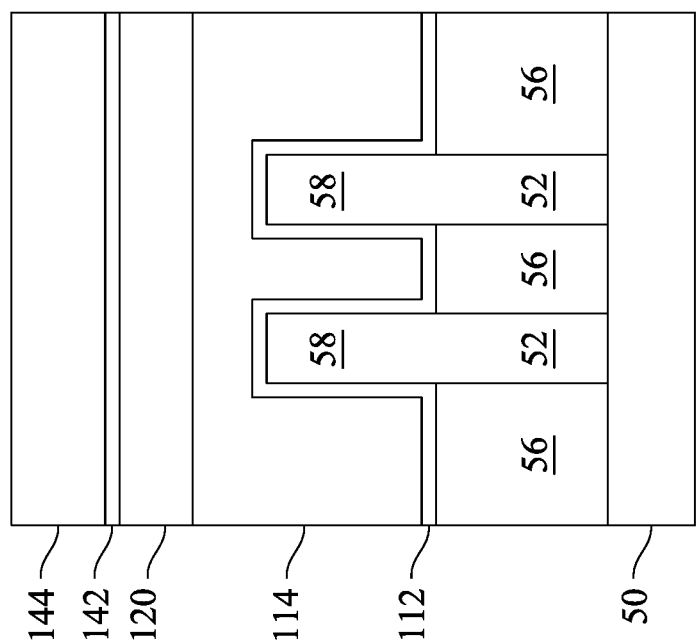

In FIGS. 20A-20C, a second ILD 144 is deposited over the gate spacers 82, the first ILD 94, the gate masks 120, and the contact masks 134 (if present) or the lower source/drain contacts 132. In some embodiments, the second ILD 144 is a flowable film formed by a flowable CVD method. In some embodiments, the second ILD 144 is formed of a dielectric material such as PSG, BSG, BPSG, USG, or the like, which may be deposited by any suitable method, such as CVD, PECVD, or the like.

In some embodiments, an etch stop layer (ESL) 142 is formed between the second ILD 144 and the gate spacers 82, the first ILD 94, the gate masks 120, and the contact masks 134 (if present) or the lower source/drain contacts 132. The ESL 142 may include a dielectric material, such as, silicon nitride, silicon oxide, silicon oxynitride, or the like, having a high etching selectivity from the etching of the second ILD 144.

Figure 21A:
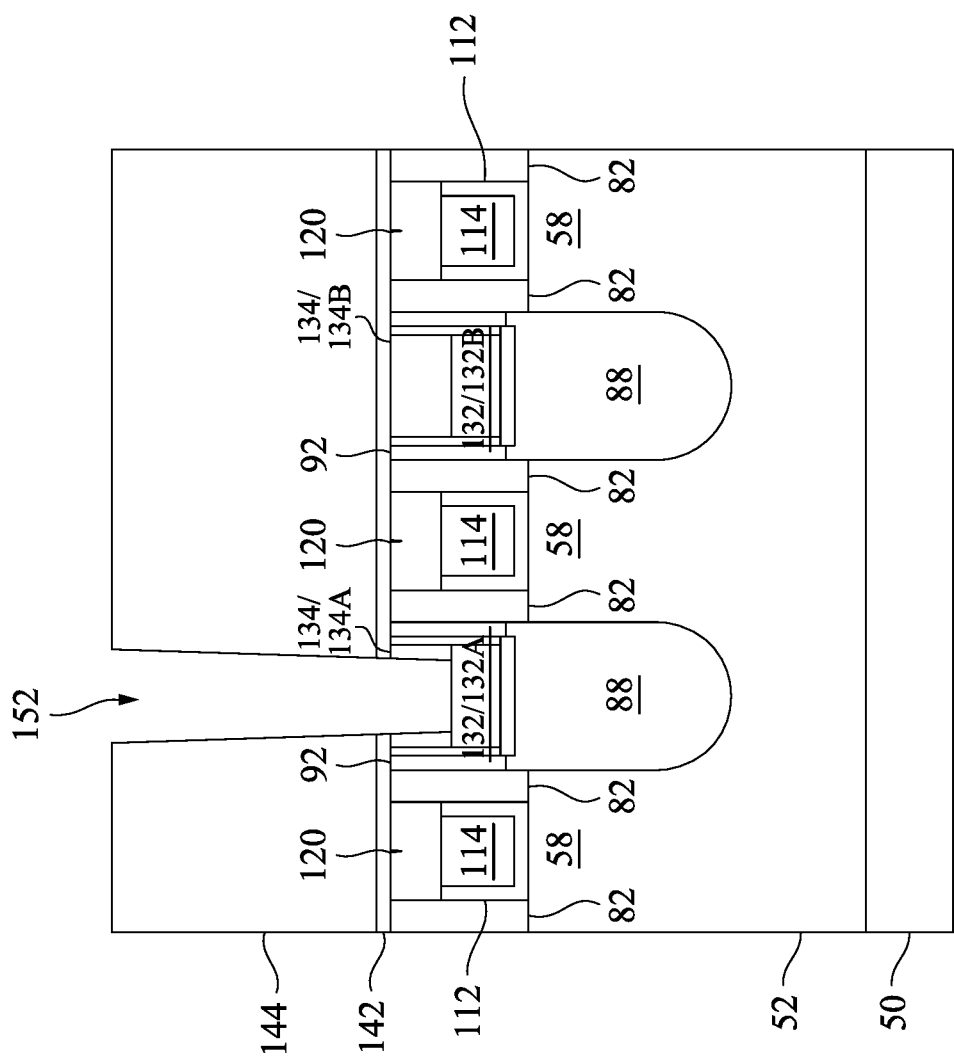
Figure 21C:
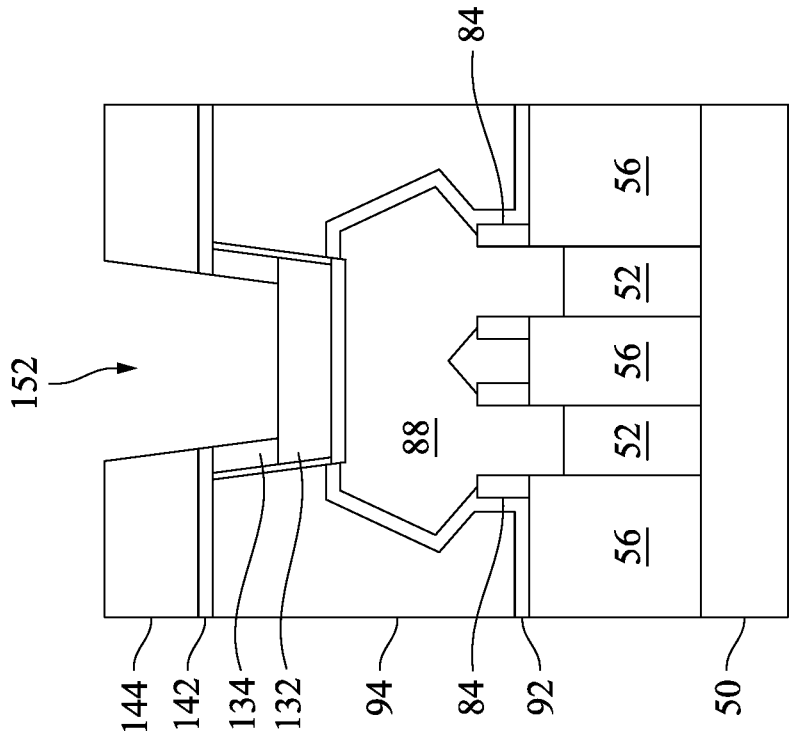
Figure 21B:
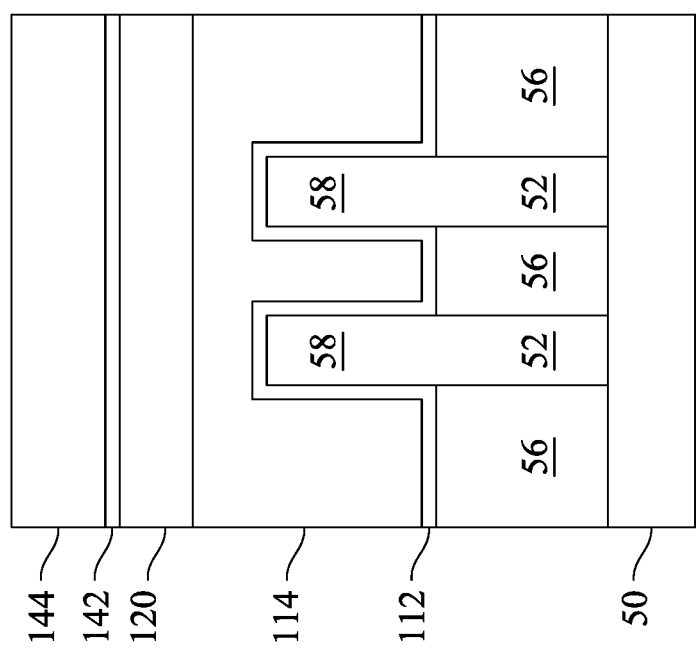

In FIGS. 21A-21C, contact openings 152 are formed through the second ILD 144, the ESL 142, and a first subset of the contact masks 134A (if present). The contact openings 152 may be formed using acceptable photolithography and etching techniques. The etching process may be anisotropic. The contact openings 152 expose the top surfaces of a first subset of the lower source/drain contacts 132A. The contact openings 152 are not formed through a second subset of the contact masks 134B (if present), so that the top surfaces of a second subset of the lower source/drain contacts 132B remain covered. The lower source/drain contacts 132A are dedicated to particular epitaxial source/drain regions 88, and are not shared with the gate electrodes 114. The lower source/drain contacts 132B will be shared with a subset of the gate electrodes 114. Shared contacts may be used for devices in which a gate electrode 114 of a transistor is permanently connected to an epitaxial source/drain region 88 of another transistor, such as memory devices (e.g., SRAM cells).

Figure 22A:
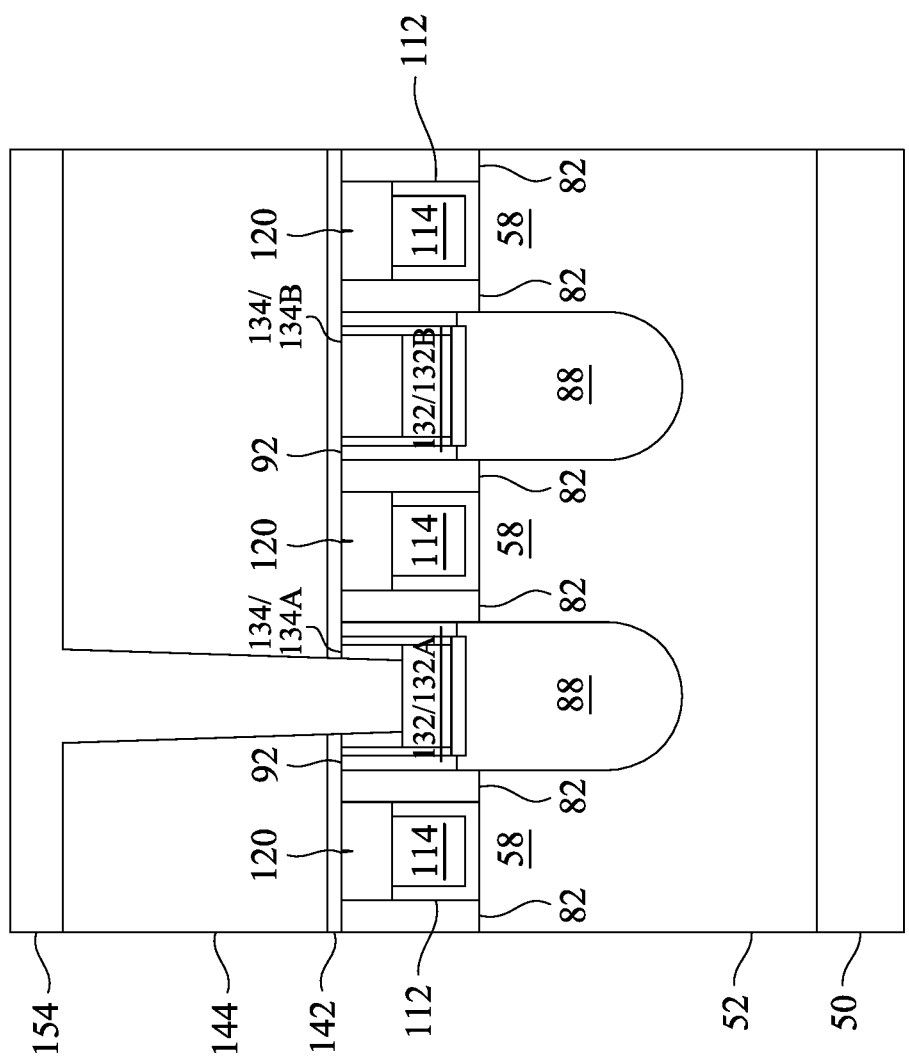
Figure 22C:
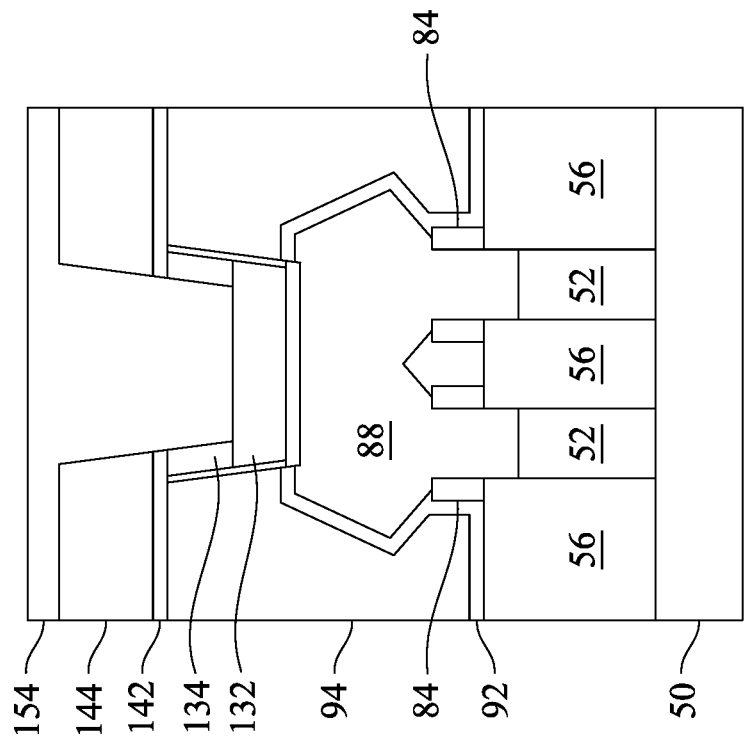
Figure 22B:
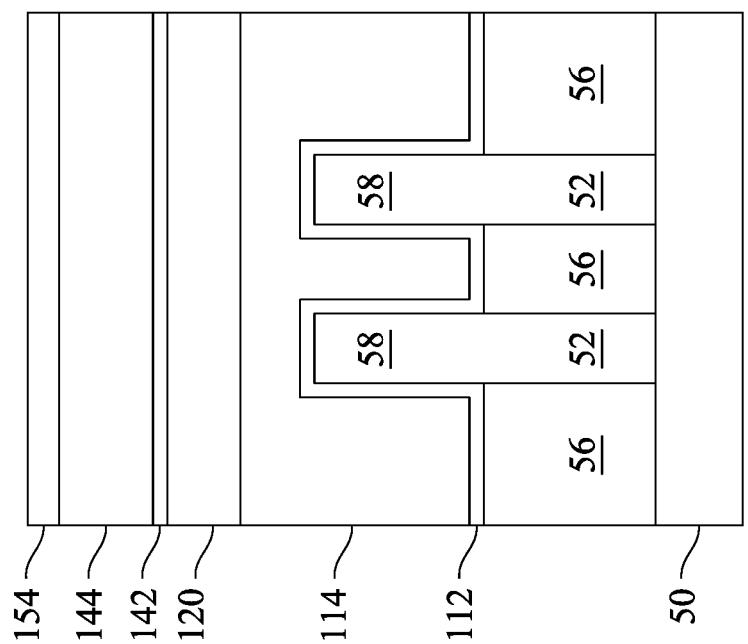

In FIGS. 22A-22C, conductive layer(s) 154 for gate contacts are formed in the contact openings 152. For example, the conductive layer(s) 154 may be formed by forming a liner (not separately illustrated), such as a diffusion barrier layer, an adhesion layer, or the like, and a conductive material in the contact openings 152. The liner may include titanium, titanium nitride, tantalum, tantalum nitride, or the like. The conductive material may be a metal such as copper, a copper alloy, silver, gold, tungsten, cobalt, aluminum, nickel, or the like, which may be formed by a deposition process such as PVD, ALD, CVD, or the like. The conductive layer(s) 154 are formed on the sidewalls and/or top surfaces of the second ILD 144, the ESL 142, the contact masks 134A (if present) and/or the lower source/drain contacts 132A.

Figure 23A:
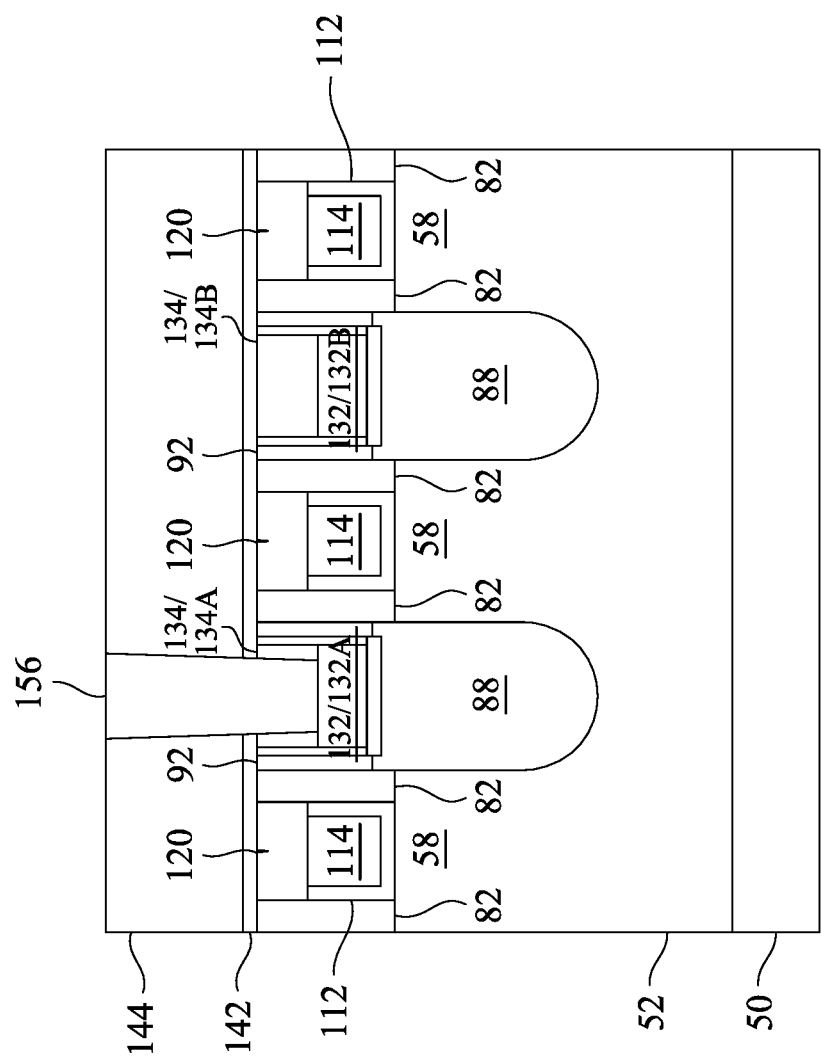
Figure 23C:
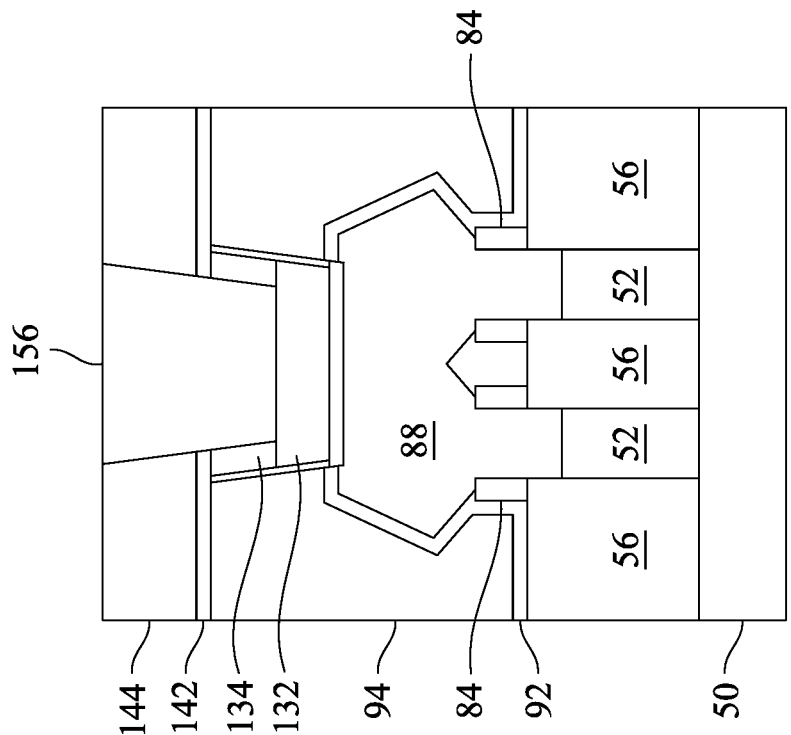
Figure 23B:
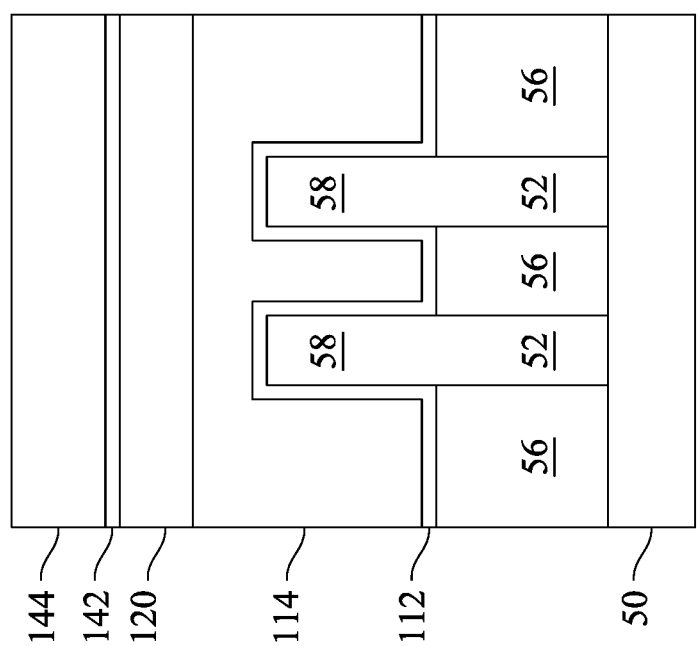

In FIGS. 23A-23C, a removal process is performed to remove excess portions of the conductive layer(s) 154, which excess portions are over the top surfaces of the second ILD 144. The removal process may also remove some portions of the second ILD 144. In some embodiments, a planarization process such as a chemical mechanical polish (CMP), an etch-back process, combinations thereof, or the like may be utilized. The remaining conductive layer(s) 154 in the contact openings 152 form upper source/drain contacts 156 in the contact openings 152. After the planarization process, the top surfaces of the second ILD 144 and the upper source/drain contacts 156 are coplanar (within process variations). The upper source/drain contacts 156 extend through the second ILD 144, the ESL 142, and the contact masks 134A (if present).

Figure 24A:
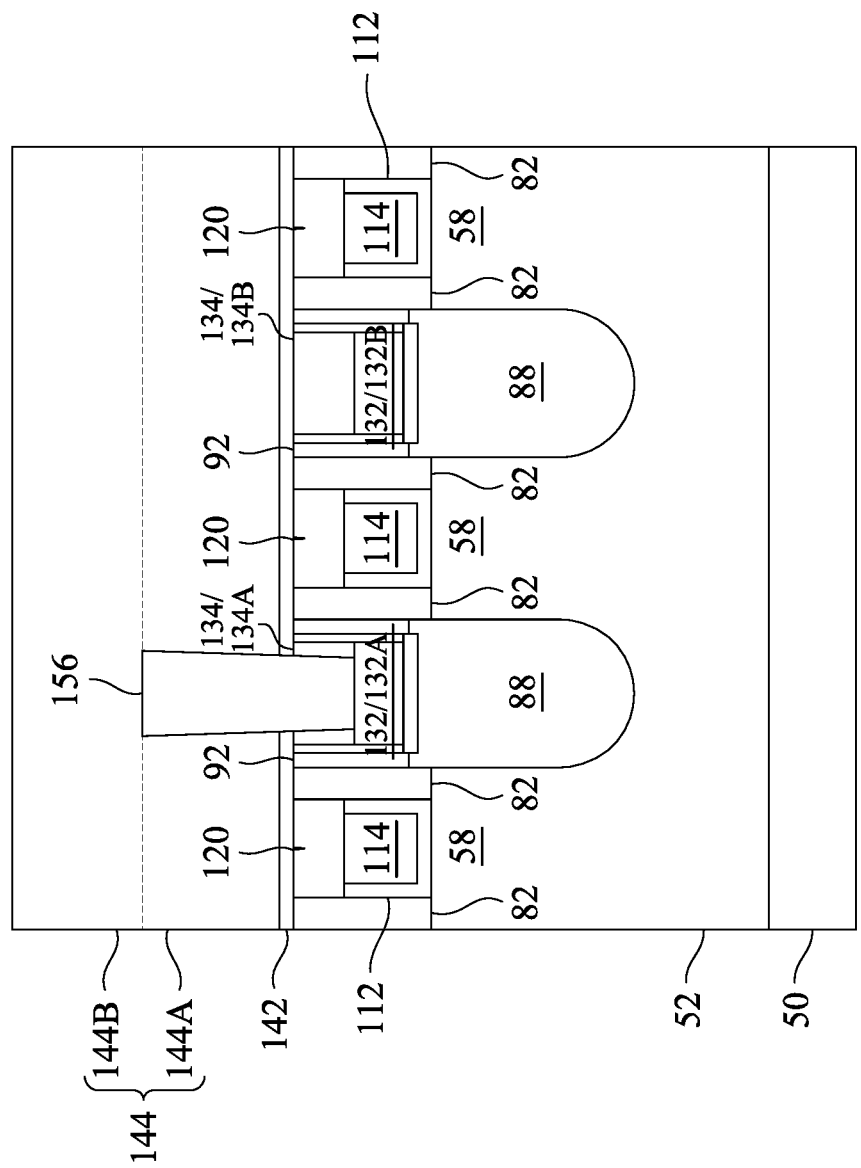
Figure 24C:
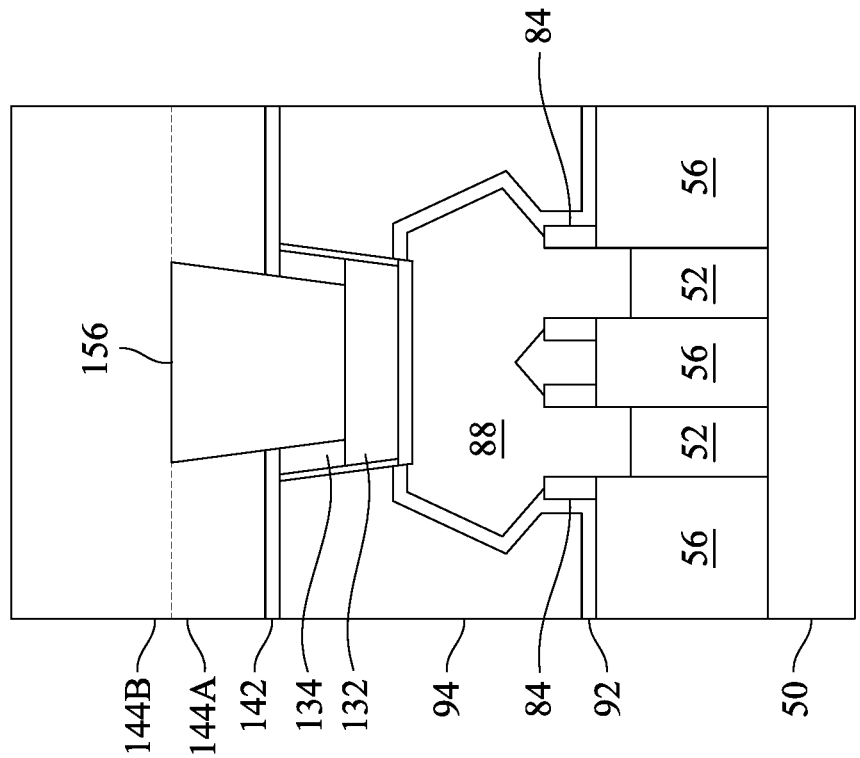
Figure 24B:
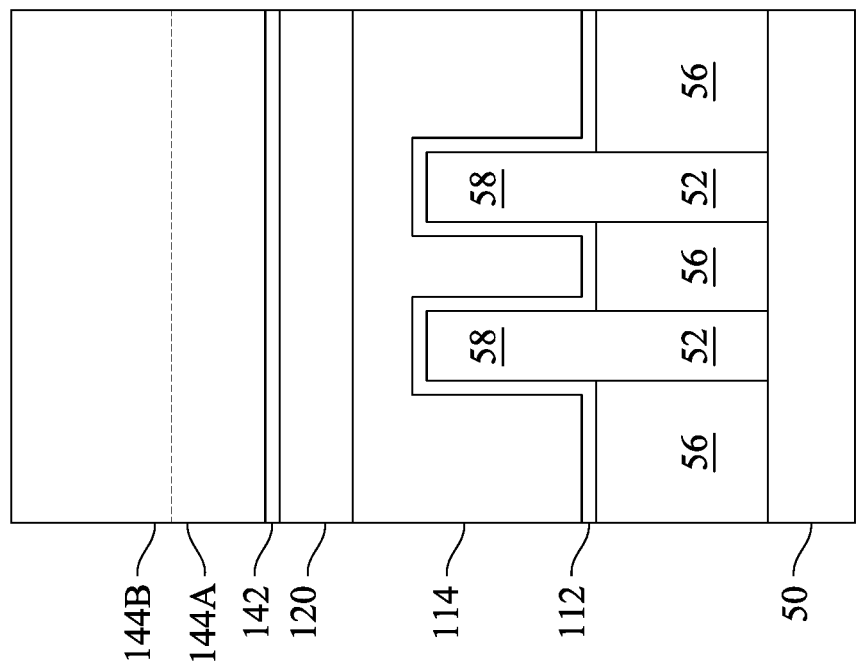

In FIGS. 24A-24C, additional portions of the material of the second ILD 144 are optionally redeposited on the upper source/drain contacts 156 and the original portions of the material of the second ILD 144. The second ILD 144 can thus include lower portions 144A (which include the original portions of the material of the second ILD 144) and upper portions 144B (which include the additional portions of the material of the second ILD 144).

Figure 25A:
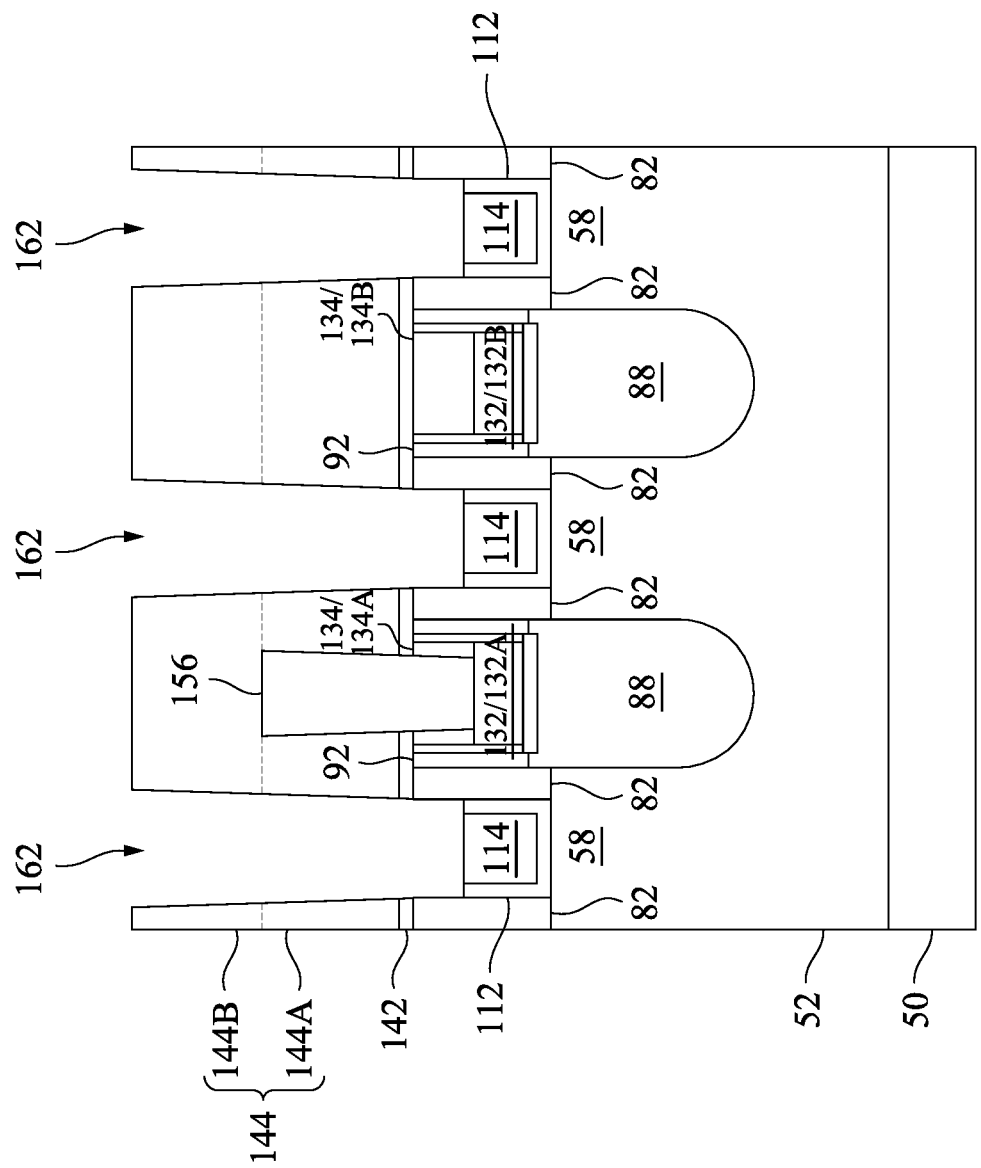
Figure 25C:
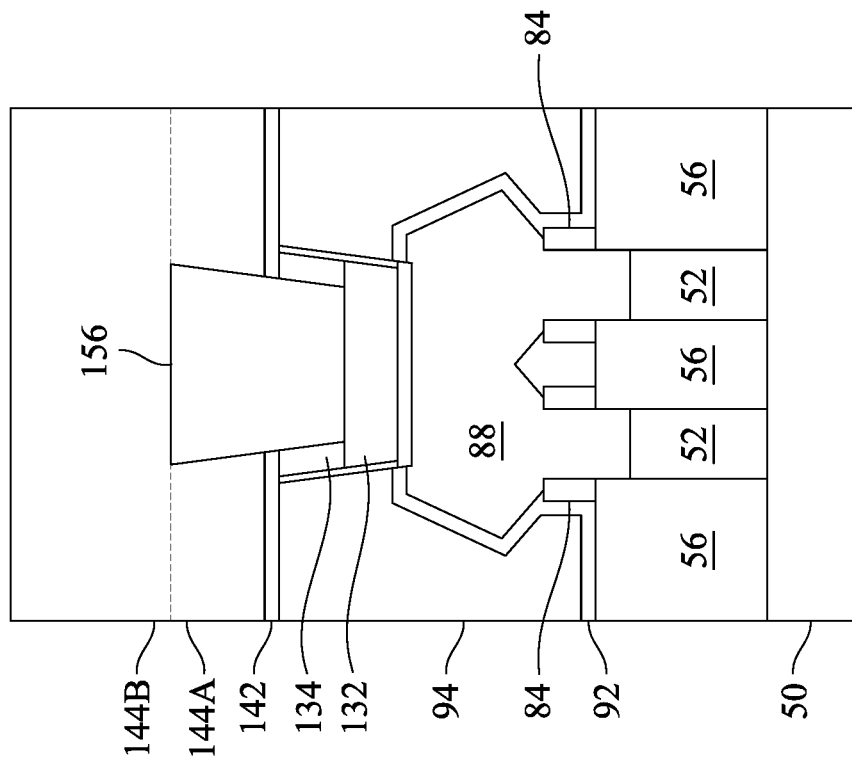
Figure 25B:
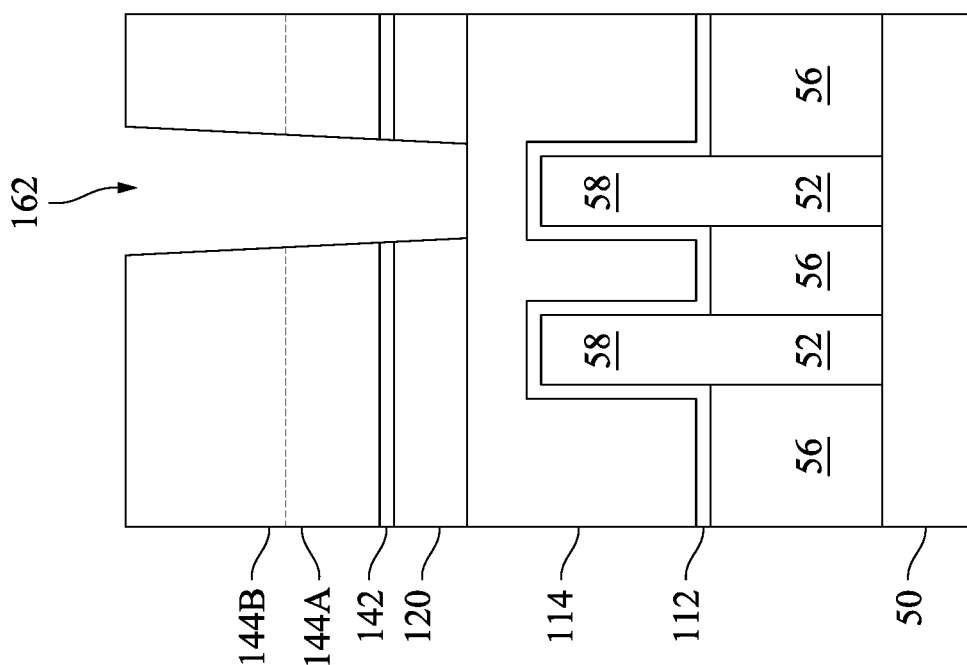

In FIGS. 25A-25C, contact openings 162 are formed through the second ILD 144, the ESL 142, and the gate masks 120. The contact openings 162 may be formed using acceptable photolithography and etching techniques. The etching process may be anisotropic. For example, when the gate masks 120 are formed of silicon nitride, the etch can be a dry etch performed with carbon tetrafluoride ($CF_4$). The contact openings 162 expose the top surfaces of the gate electrodes 114 and the sidewalls of the gate spacers 82.

Figure 26A:
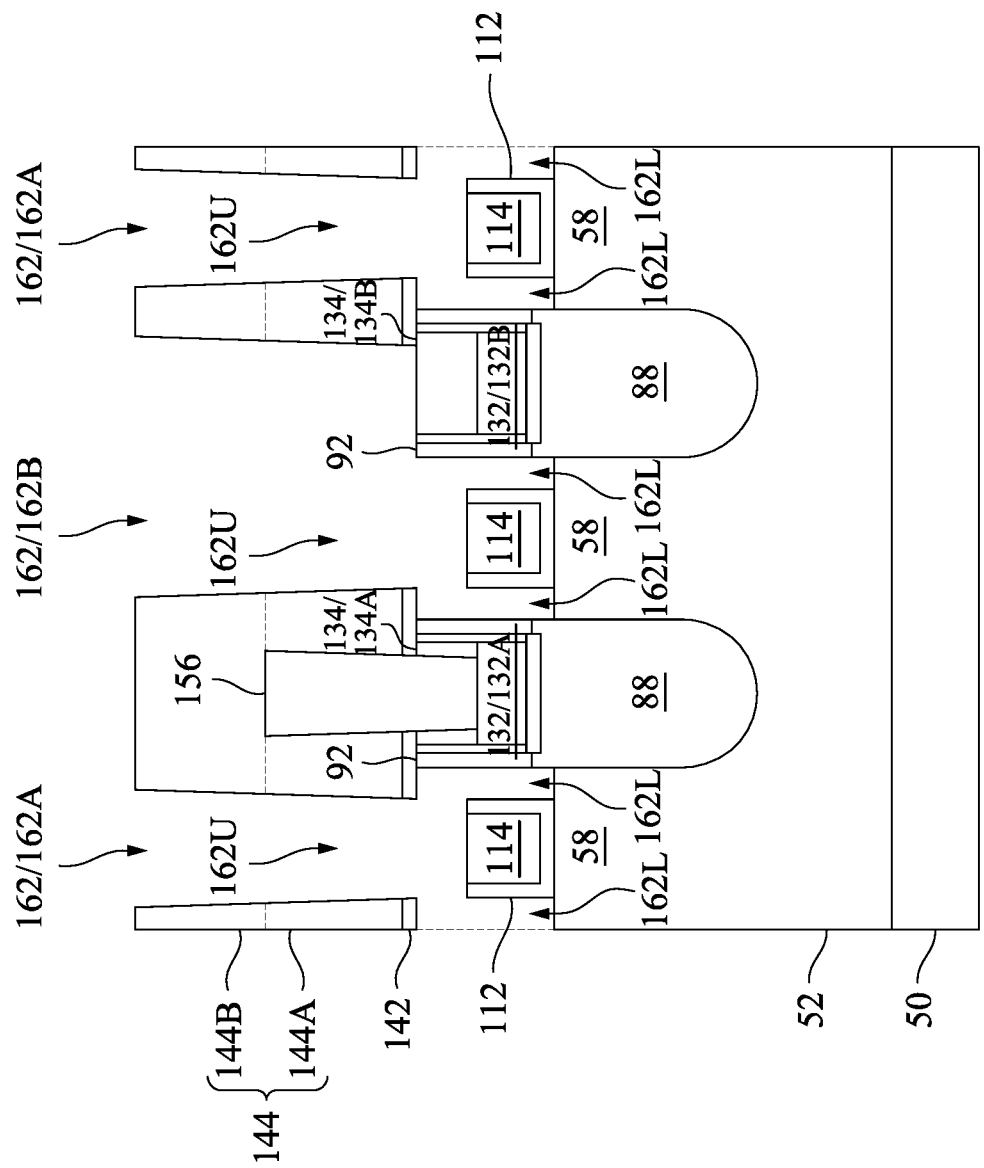

In FIGS. 26A-26C, a subset of the contact openings 162B are widened to also expose the top surfaces of the contact masks 134B (if present) or the top surfaces of the lower source/drain contacts 132B. The contact openings 162B may be widened using acceptable photolithography and etching techniques. The etching process may be anisotropic. For example, when the contact masks 134 are formed of silicon nitride, the etch can be a dry etch performed with carbon tetrafluoride ($CF_4$). A subset of the contact openings 162A are not widened.

The gate spacers 82 are then removed to expand the contact openings 162. Removing the gate spacers 82 extends the contact openings 162 along the sidewalls of the gate structures (including the gate dielectrics 112 and the gate electrodes 114). The expanded contact openings 162 have upper portions 162U and lower portions 162L. The upper portions 162U of the contact openings 162 extend through the second ILD 144 and the ESL 142. The lower portions 162L of the contact openings 162 expose the sidewalls of the gate dielectrics 112, the CESL 92, and the epitaxial source/drain regions 88. The lower portions 162L of the contact openings 162 may also expose the top surfaces of the fins 52 and the bottom surface of the ESL 142. Expanding the contact openings 162 increases the width and the depth of the contact openings 162. As noted above, the gate spacers 82 have a uniform height. As a result, when the gate spacers 82 are removed, the lower portions 162L of the contact openings 162 also have a uniform height.

The etching process for removing the gate spacers 82 may be different from (e.g., may be performed with different etching parameters, different etchants, and/or a different type of etching than) the etching process(es) for widening the contact openings 162B and initially forming the contact openings 162. The gate spacers 82 may be removed using acceptable photolithography and etching techniques. The etching may be a wet or dry etch that is selective to the material of the gate spacers 82 (e.g., etches the material of the gate spacers 82 at a faster rate than the material(s) of the second ILD 144, the ESL 142, the gate electrodes 114, the gate dielectrics 112, the first ILD 94, the CESL 92, the epitaxial source/drain regions 88, and the fins 52). In some embodiments, the etch is an isotropic etch (or at least etches the gate spacers 82 with a greater degree of isotropy than the etching process(es) for widening the contact openings 162B and/or initially forming the contact openings 162). For example, when the gate spacers 82 are formed of silicon nitride, the etch can be a wet etch performed with phosphoric acid ($H_3PO_4$). In some embodiments, the etching process for removing the gate spacers 82 includes soaking the gate spacers 82 in an etching solution that includes phosphoric acid in water. The gate spacers 82 may be soaked in the etching solution by immersing them in the etching solution, spraying them with the etching solution, or the like. The gate spacers 82 can be soaked in the etching solution for a duration in the range of about 10 seconds to about 1000 seconds. During the soaking, the etching solution may be at a temperature in the range of about 25° C. to about 200° C. Performing the etching process with parameters in these ranges allows the gate spacers 82 to be removed without over-etching of the fins 52, the gate dielectrics 112, or the gate electrodes 114. Performing the etching process with parameters outside these ranges may not allow the gate spacers 82 to be removed without over-etching of the fins 52, the gate dielectrics 112, and the gate electrodes 114.

Figure 27A:
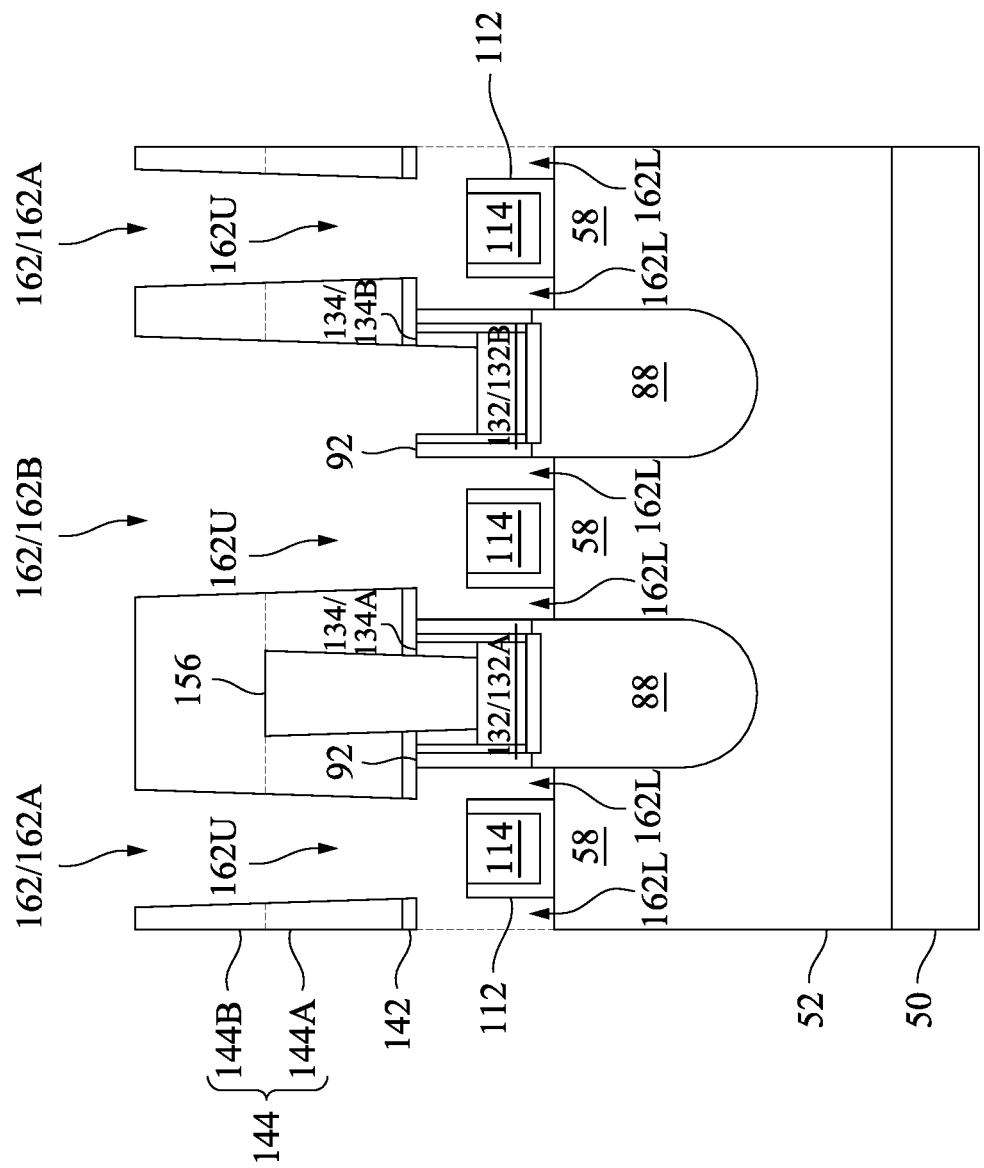
Figure 27C:
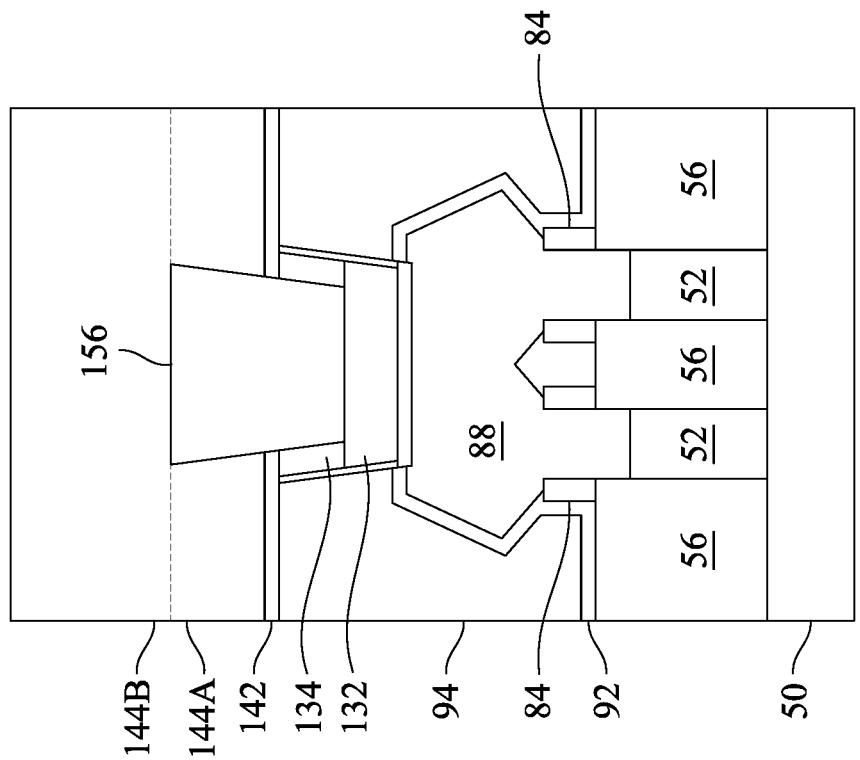
Figure 27B:
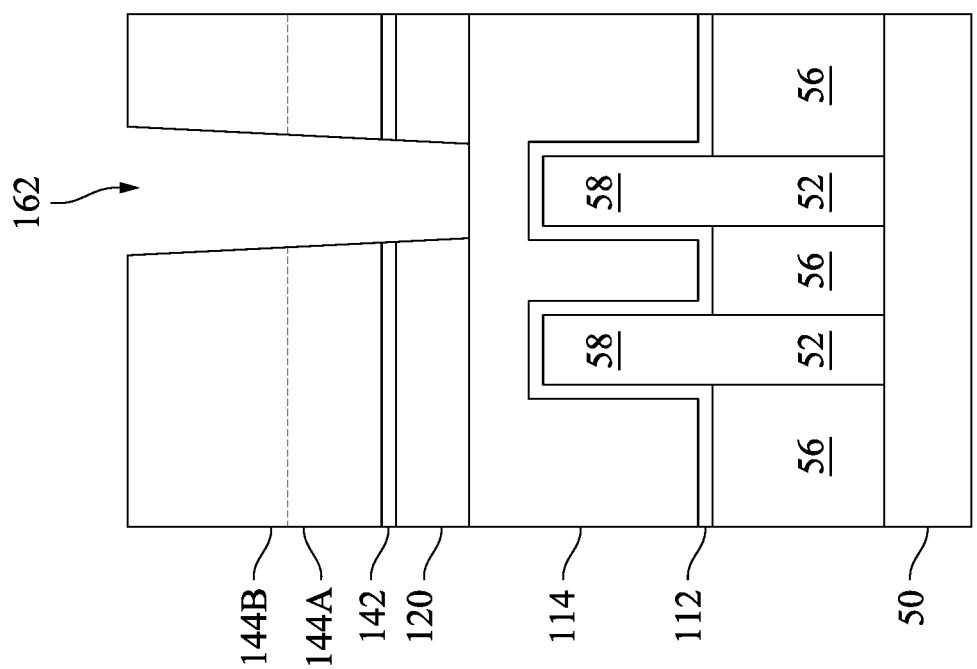

In FIGS. 27A-27C, the widened contact openings 162B are optionally extended through the contact masks 134B (if present) and expose the lower source/drain contacts 132B. The contact openings 162B may be extended through the contact masks 134B using acceptable photolithography and etching techniques. The etching process may be anisotropic. For example, when the contact masks 134 are formed of silicon nitride, the etch can be a dry etch performed with carbon tetrafluoride ($CF_4$).

Figure 28A:
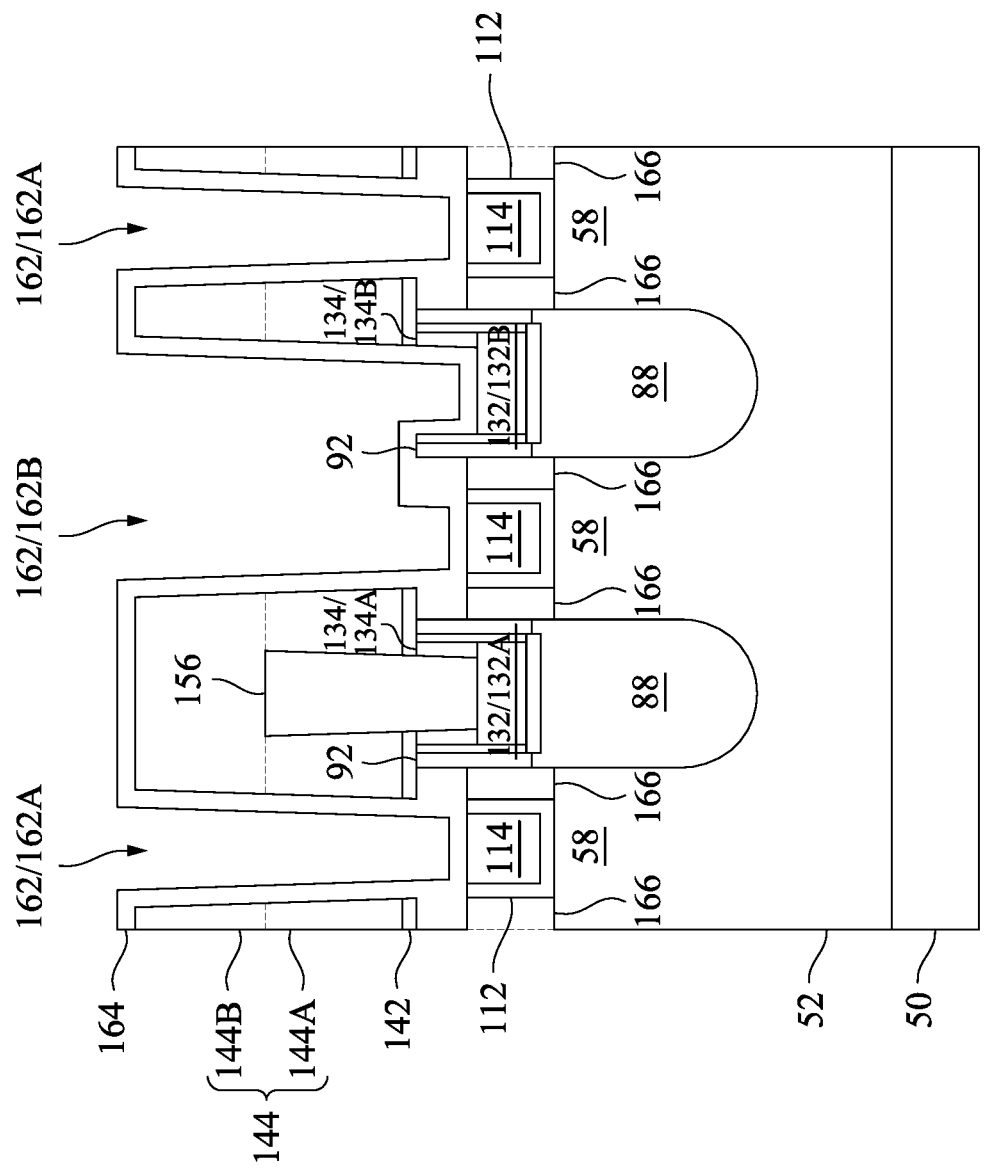
Figure 28C:
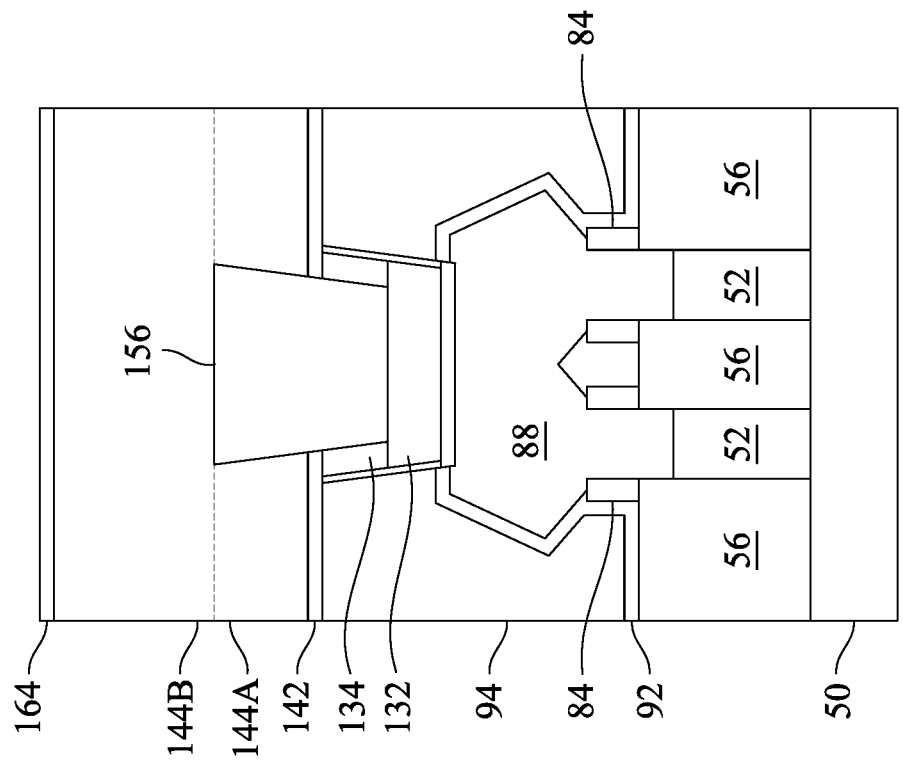
Figure 28B:
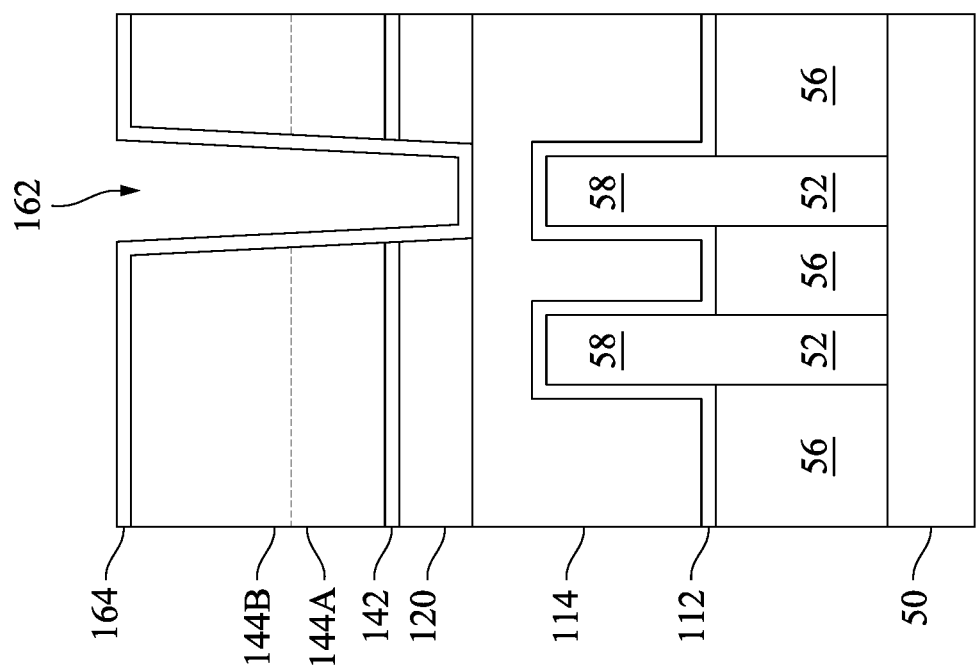

In FIGS. 28A-28C, a spacer layer 164 is deposited in the contact openings 162. The spacer layer 164 is formed on the top surfaces of the second ILD 144, the gate electrodes 114, the gate dielectrics 112, and the lower source/drain contacts 132B. The spacer layer 164 is also formed on the bottom surface of the ESL 142 and the sidewalls of the second ILD 144, the ESL 142, and the CESL 92. As will be subsequently described in greater detail, the spacer layer 164 may also be formed on the sidewalls of the gate dielectrics 112. The spacer layer 164 is formed of a dielectric material. Acceptable dielectric materials may include silicon nitride, silicon carbonitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used.

During deposition of the spacer layer 164, pinch-off occurs such that the formation of the spacer layer 164 in the lower portions 162L of the contact openings 162 is incomplete. As a result, the spacer layer 164 seals the lower portions 162L of the contact openings 162 so that voids 166 are formed from the lower portions 162L of the contact openings 162 that are not filled by the spacer layer 164. To promote formation of the voids 166, a deposition process that is more prone to pinch-off such as CVD may be used to deposit the spacer layer 164. For example, the spacer layer 164 may be formed of silicon nitride by CVD. Pinch-off may also occur because the lower portions 162L of the contact openings 162 and thus the voids 166 have small widths, such as widths $W_1$ in the range of about 1 nm to about 20 nm.

Figure 29A:
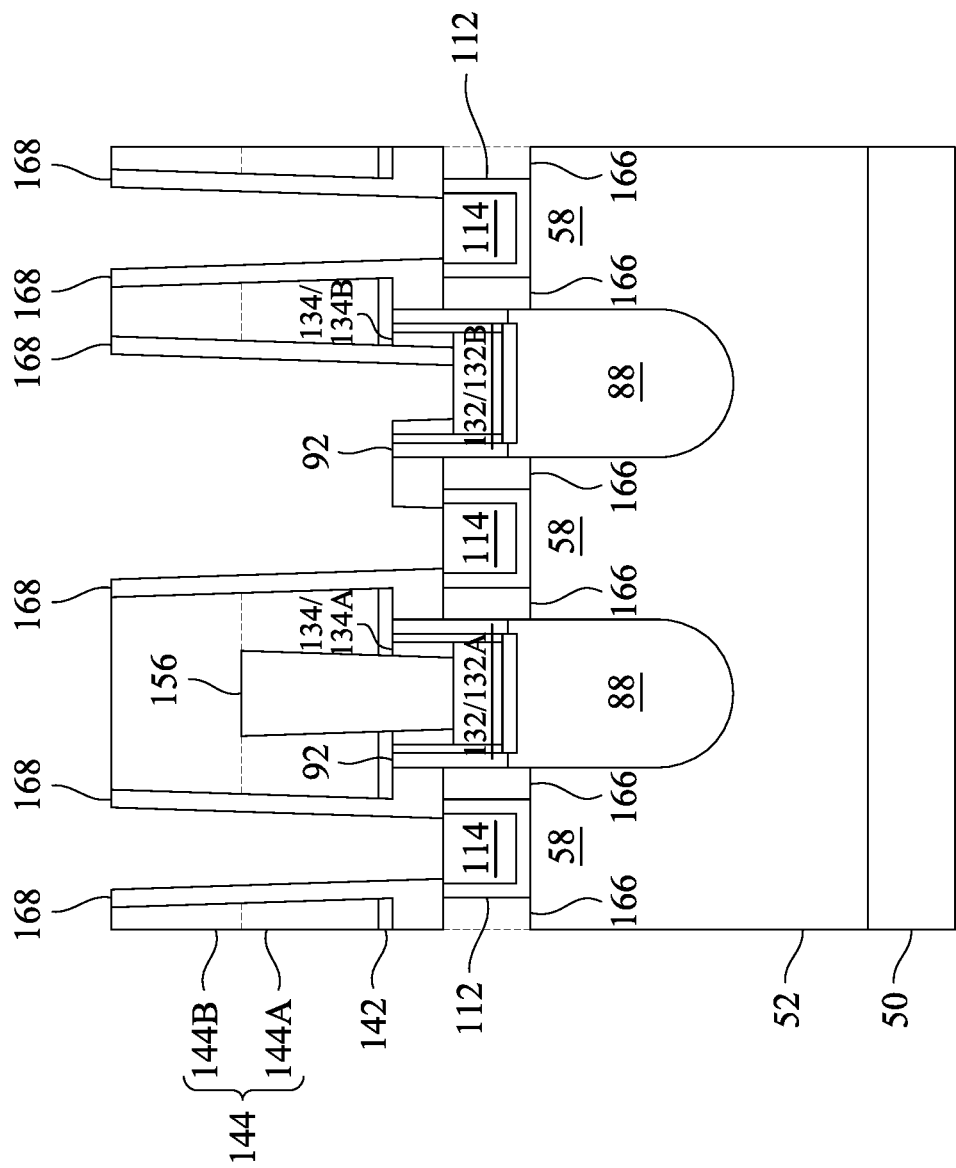
Figure 29C:
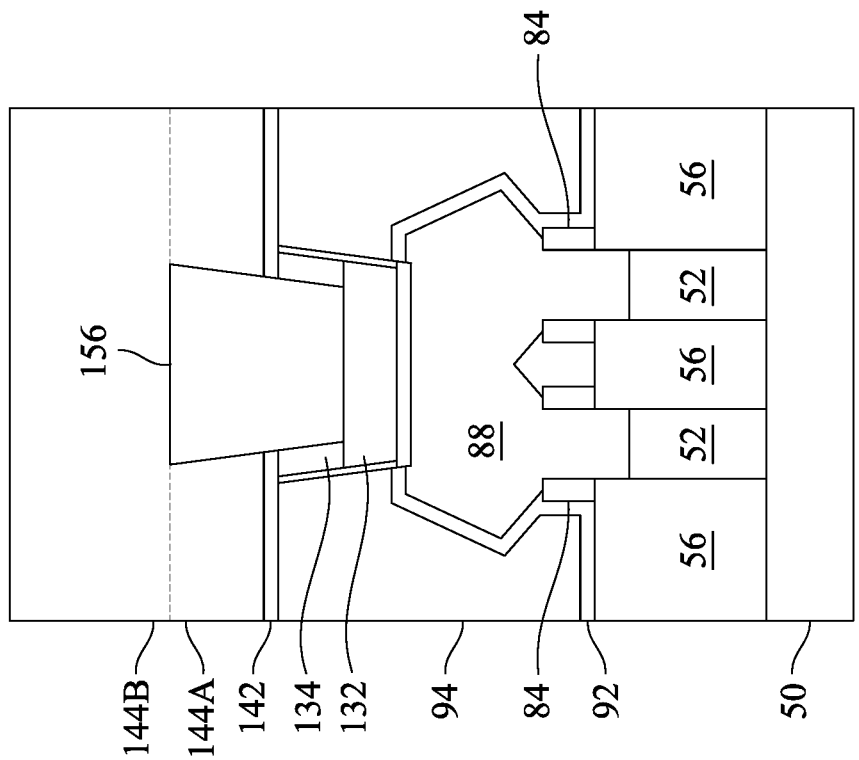
Figure 29B:
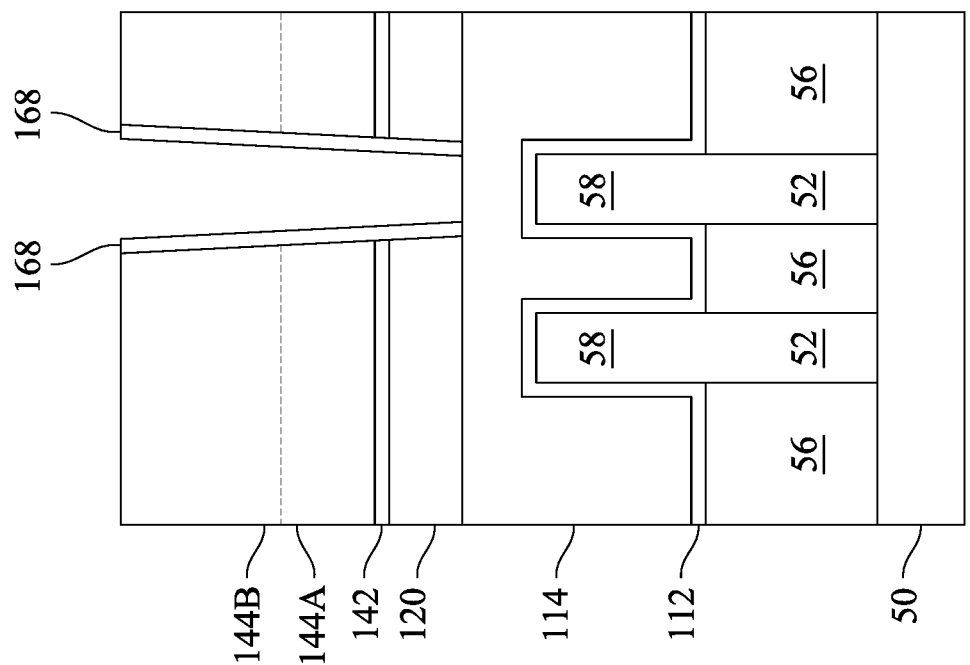

In FIGS. 29A-29C, the spacer layer 164 is patterned to form contact spacers 168. The spacer layer 164 may be patterned by any acceptable etching process, such as one that is selective to the material of the spacer layer 164 (e.g., selectively etches the material of the spacer layer 164 at a faster rate than the material(s) of the second ILD 144 and the gate electrodes 114). The etching process may be anisotropic. Patterning the spacer layer 164 removes the horizontal portions of the spacer layer 164 over the second ILD 144, the gate electrodes 114, and the lower source/drain contacts 132B. The spacer layer 164, when etched, has vertical portions left on the sidewalls of the second ILD 144, the ESL 142, and the CESL (thus forming the contact spacers 168). The top surfaces of the second ILD 144, the gate electrodes 114, and the lower source/drain contacts 132B are exposed after the horizontal portions of the spacer layer 164 are removed. The contact spacers 168 extending through the ESL 142, having portions disposed both above and below the ESL 142. The portions of the contact spacers 168 below the ESL 142 contact and extend along the bottom surface of the ESL 142. In the illustrated embodiment, the contact spacers 168 are not formed on the sidewalls of the gate dielectrics 112 so that the sidewalls of the gate dielectrics 112 are free of the contact spacers 168.

The voids 166 are defined by (and thus expose) the bottom surfaces of the contact spacers 168; the top surfaces of the fins 52; and the sidewalls of the gate dielectrics 112, the CESL 92, and the epitaxial source/drain regions 88. As such, the voids 166 are disposed between the gate electrodes 114 and the source/drain contacts 132, 156. The voids 166 may be filled with air or may be at a vacuum, both of which have a lower relative permittivity than the dielectric material of the removed gate spacers 82. At smaller device sizes, the capacitance between the source/drain contacts 132, 156 and the gate electrodes 114 may be a significant source of parasitic capacitance. Decreasing the relative permittivity of the area between the source/drain contacts 132, 156 and the gate electrodes 114 reduces the parasitic capacitance, thereby improving the performance of the resulting FinFETs.

As noted above, the lower portions 162L of the contact openings 162 have a uniform height. As a result, the voids 166 also have a uniform (e.g., same) height. Forming the voids 166 by removing the gate spacers 82, allows the voids 166 to have more uniform dimensions across the substrate 50. Further, the spacer layer 164 (see FIGS. 28A-28C) is formed in a middle end of line (MEOL) process instead of in a front end of line (FEOL) process. Forming the voids 166 during deposition of the spacer layer 164 thus allows the voids 166 to be formed in a late stage of processing, so that less processing steps are performed after the formation of the voids 166. The risk of damage to the voids 166 in subsequent processing may thus be reduced. Manufacturing yield may thus be improved.

Figure 30A:
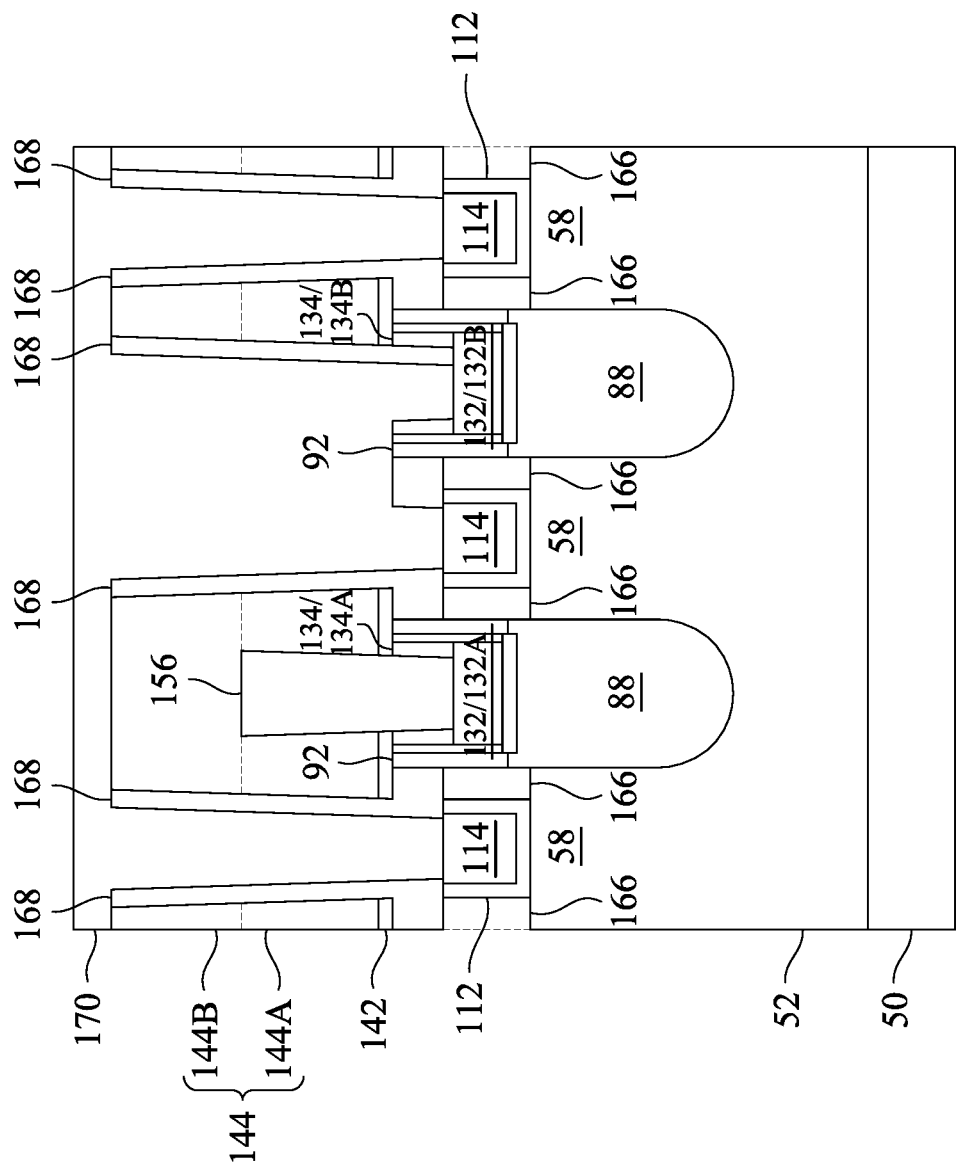
Figure 30C:
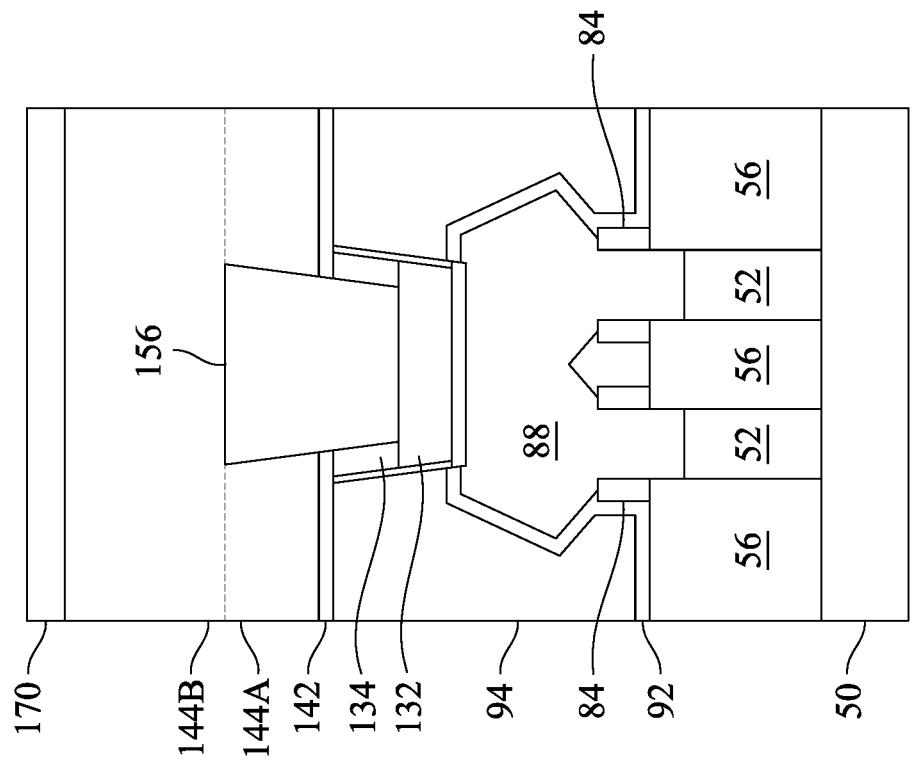
Figure 30B:
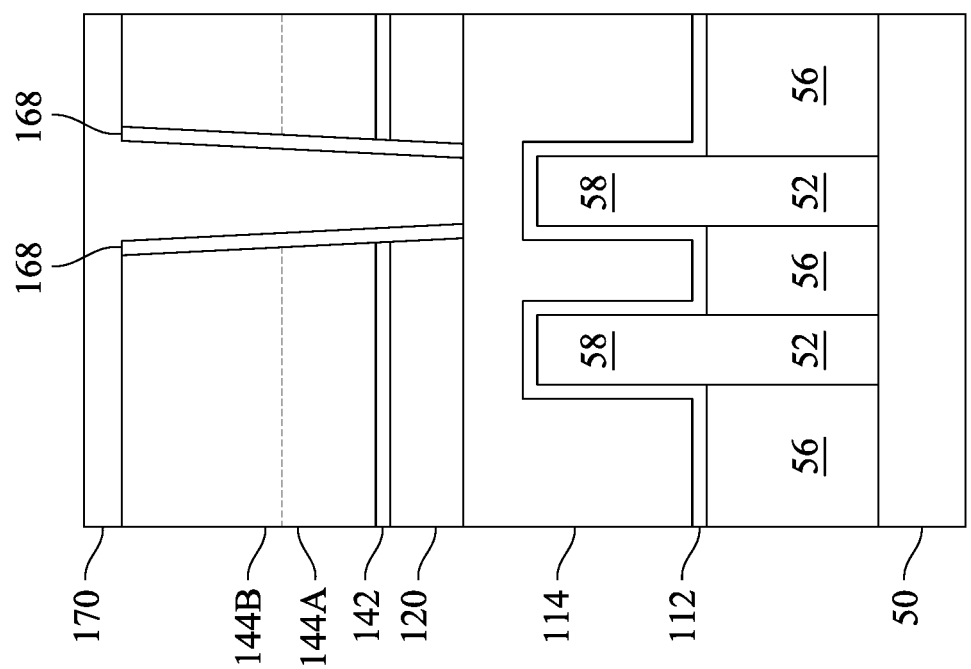

In FIGS. 30A-30C, conductive layer(s) 170 for gate contacts are formed in the contact openings 162. For example, the conductive layer(s) 170 may be formed by forming a liner (not separately illustrated), such as a diffusion barrier layer, an adhesion layer, or the like, and a conductive material in the contact openings 162. The liner may include titanium, titanium nitride, tantalum, tantalum nitride, or the like. The conductive material may be a metal such as copper, a copper alloy, silver, gold, tungsten, cobalt, aluminum, nickel, or the like, which may be formed by a deposition process such as PVD, ALD, CVD, or the like. The conductive layer(s) 170 are formed on the sidewalls and/or top surfaces of the contact spacers 168, the second ILD 144, the gate electrodes 114, and the lower source/drain contacts 132B.

Figure 31A:
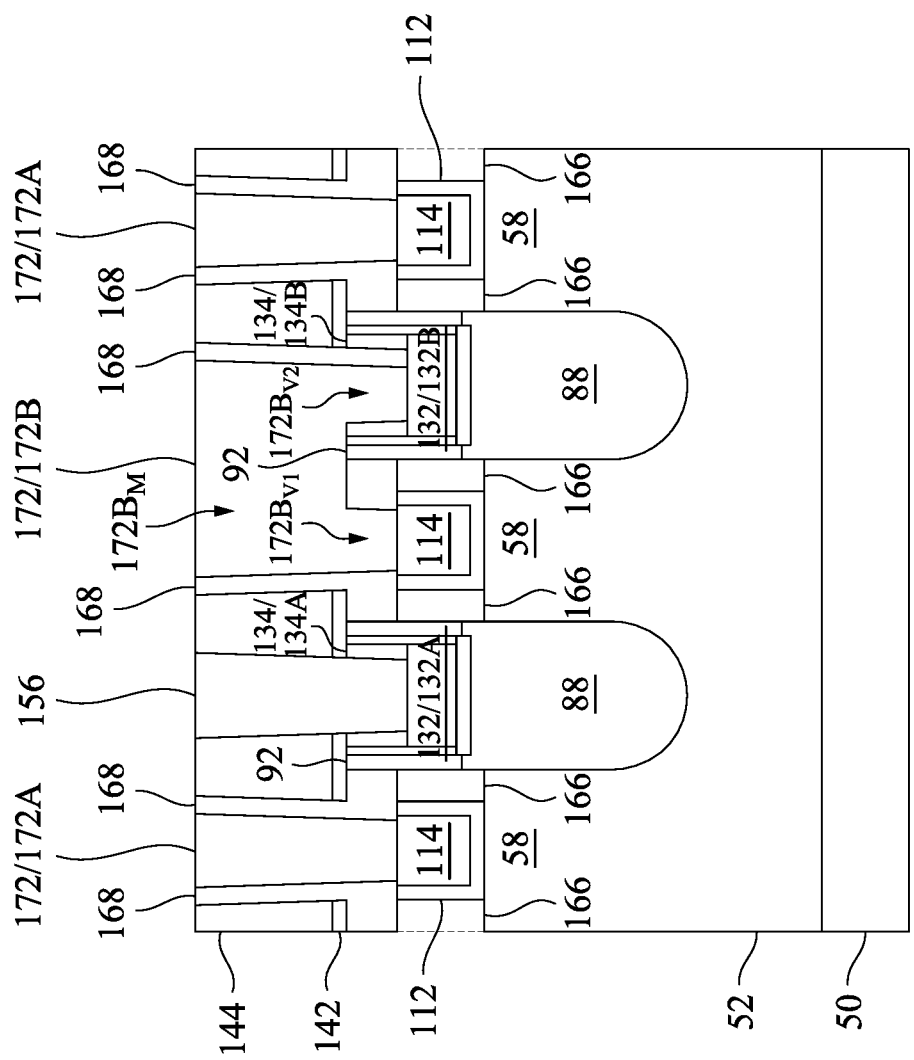
Figure 31C:
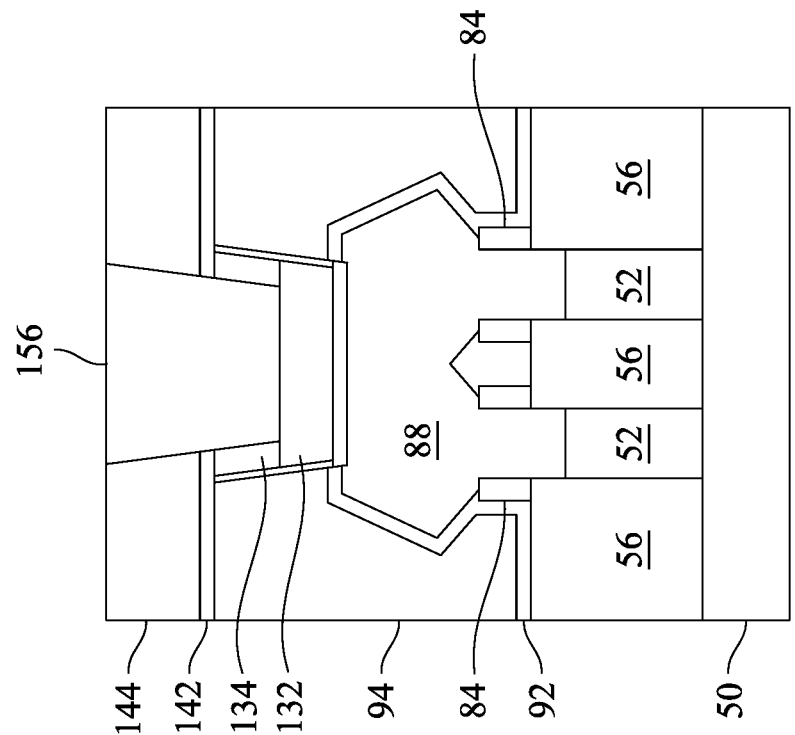
Figure 31B:
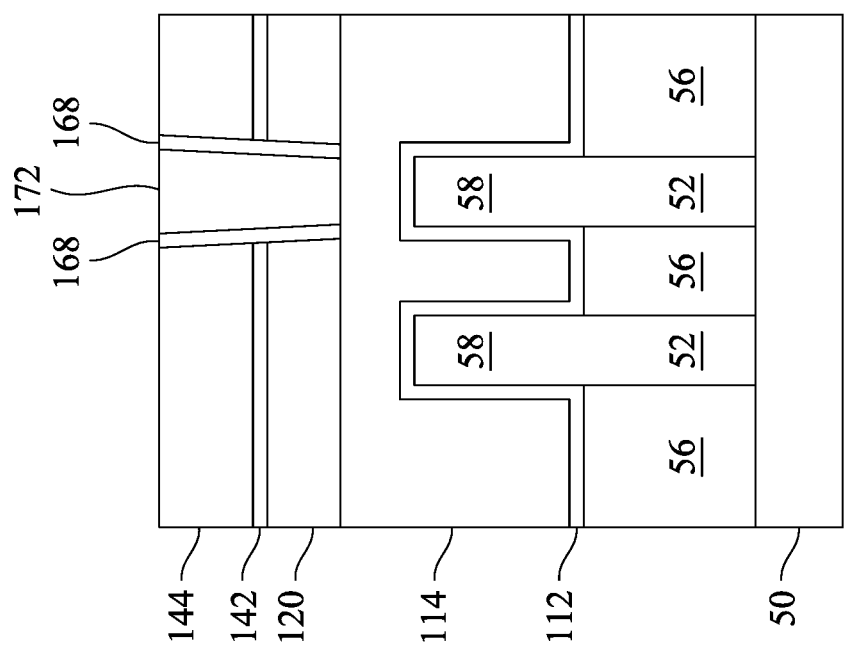

In FIGS. 31A-31C, a removal process is performed to remove excess portions of the conductive layer(s) 170, which excess portions are over the top surfaces of the second ILD 144. The removal process may also remove some portions of the second ILD 144, such as the portions over the top surfaces of the upper source/drain contacts 156. In some embodiments, a planarization process such as a chemical mechanical polish (CMP), an etch-back process, combinations thereof, or the like may be utilized. The remaining conductive layer(s) 170 in the contact openings 162 form gate contacts 172 in the contact openings 162. After the planarization process, the top surfaces of the second ILD 144, the upper source/drain contacts 156, and the gate contacts 172 are coplanar (within process variations). The gate contacts 172 extend through the second ILD 144 and the ESL 142.

A subset of the gate contacts 172A in the contact openings 162A are dedicated to particular gate electrodes 114, and are not shared with the epitaxial source/drain regions 88. A subset of the gate contacts 172B in the contact openings 162B are shared with a subset of the epitaxial source/drain regions 88, through the lower source/drain contacts 132B. According to various embodiments, the gate contacts 172B each have a main portion $172B_M$ extending through the second ILD 144 and the ESL 142, a first via portion $172B_{V1}$ extending through a gate mask 120 to contact an underlying gate electrode 114, and a second via portion $172B_{V2}$ extending through a contact mask 134 to contact an underlying lower source/drain contacts 132B. The contact spacers 168 have portions that are beneath the main portion $172B_M$ of a gate contact 172B and between the via portions $172B_{V1}$, $172B_{V2}$ of the gate contact 172B.

Figure 32:
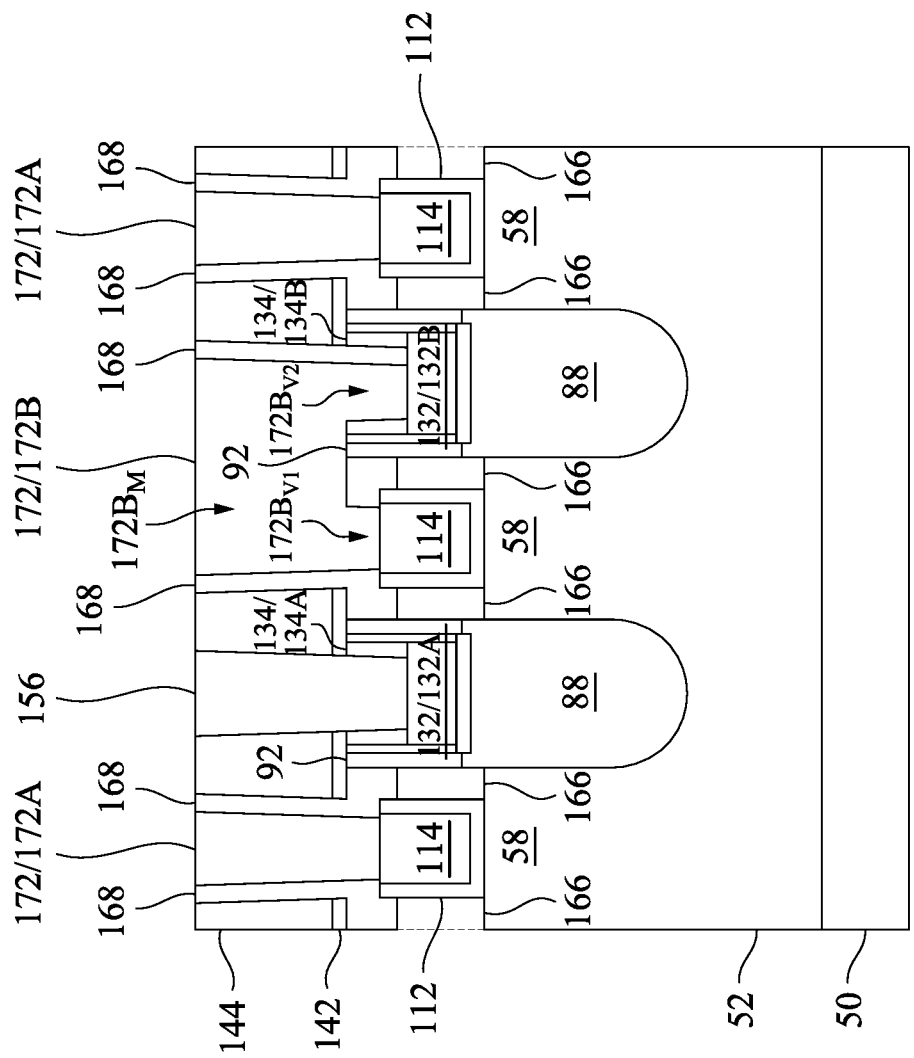
FIG. 32 is a cross-sectional view of FinFETs, in accordance with some other embodiments.

FIG. 32 is a view of FinFETs, in accordance with some other embodiments. This embodiment is similar to the embodiment of FIG. 31A, except the contact spacers 168 are also formed on the sidewalls of the gate dielectrics 112 so that they extend along and contact the gate dielectrics 112. For example, during deposition of the spacer layer 164 (see FIGS. 28A-28C), pinch-off may occur further down in the lower portions 162L of the contact openings 162. As a result, the voids 166 in this embodiment may have a lesser height than the voids 166 in the embodiment of FIG. 31A.

Figure 33:
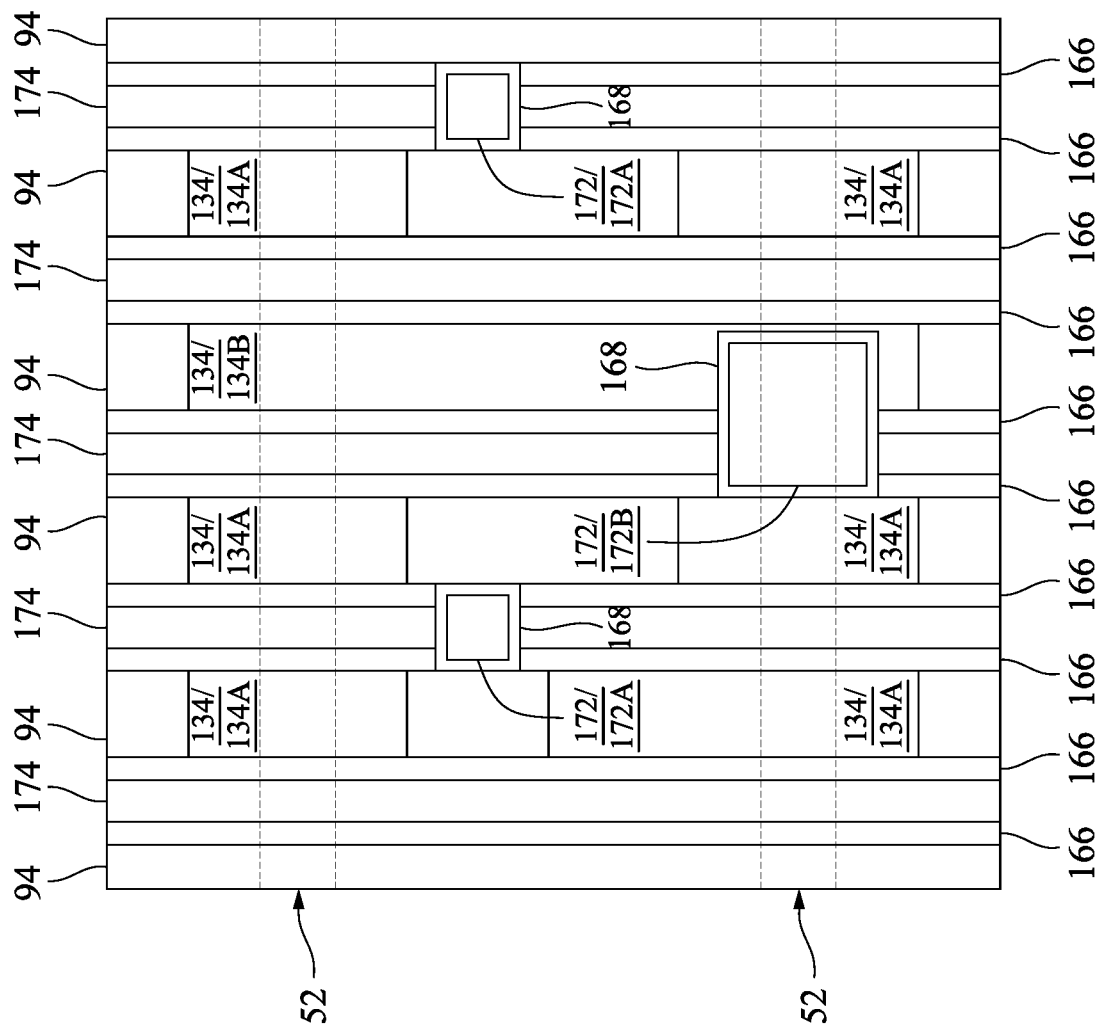
FIG. 33 is a top-down view of FinFETs, in accordance with some other embodiments.

FIG. 33 is a view of FinFETs, in accordance with some embodiments. Specifically, FIG. 33 is a top-down view of the devices of FIGS. 31A and 32, where some features of the FinFETs are omitted for illustration clarity. As more clearly seen, the voids 166 extend along sidewalls of the gate structures 174. The voids 166 separate the source/drain contacts 132, 156 from the gate structures 174. The voids 166 are defined by the contact spacers 168.

Figure 34:
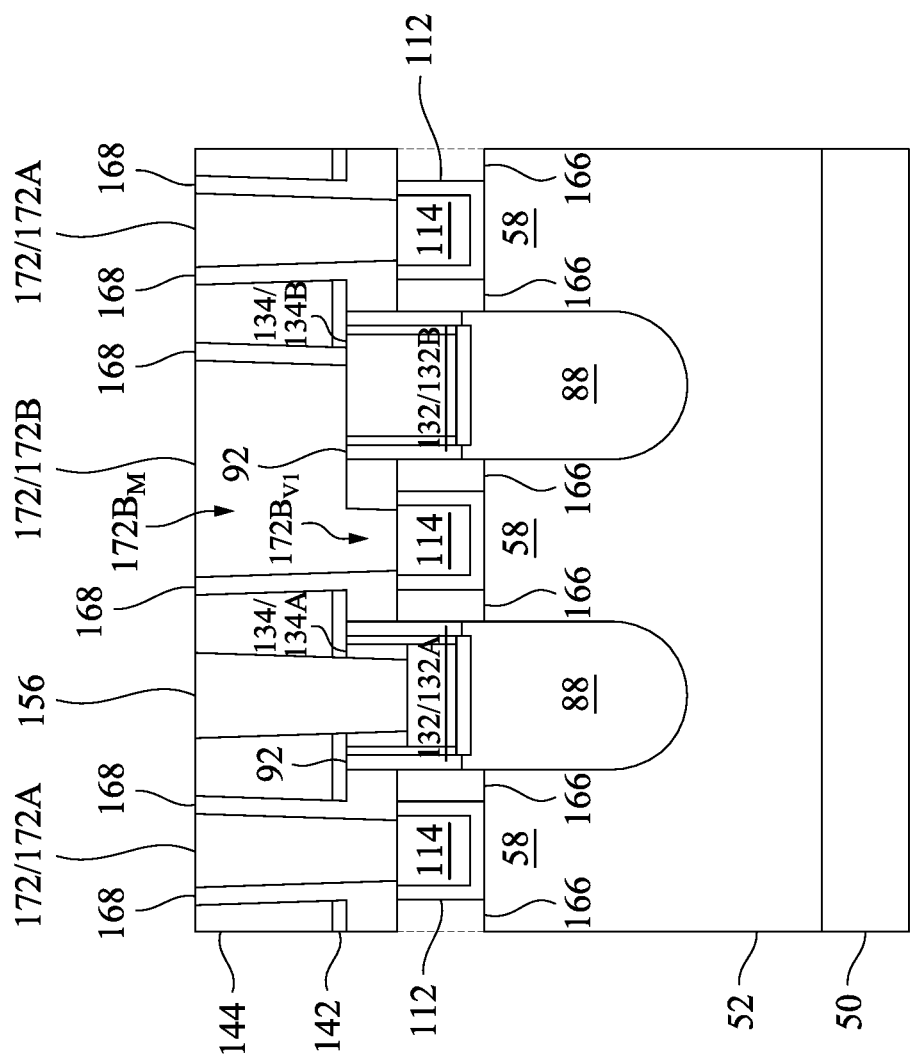
FIG. 34 is a cross-sectional view of FinFETs, in accordance with some other embodiments.

FIG. 34 is a view of FinFETs, in accordance with some other embodiments. This embodiment is similar to the embodiment of FIG. 31A, except the contact masks 134 are omitted. As a result, the gate contacts 172B do not include via portions $172B_{V2}$ (see FIG. 31A) extending through the contact masks 134. Instead, the main portions $172B_M$ (see FIG. 31A) of the gate contacts 172B extend along the top surface of the lower source/drain contacts 132B. The upper source/drain contacts 156 may extend partially into the lower source/drain contacts 132, as a result of decreased etching selectivity during the formation of the contact openings 152 (see FIGS. 21A-21C).

Figure 35:
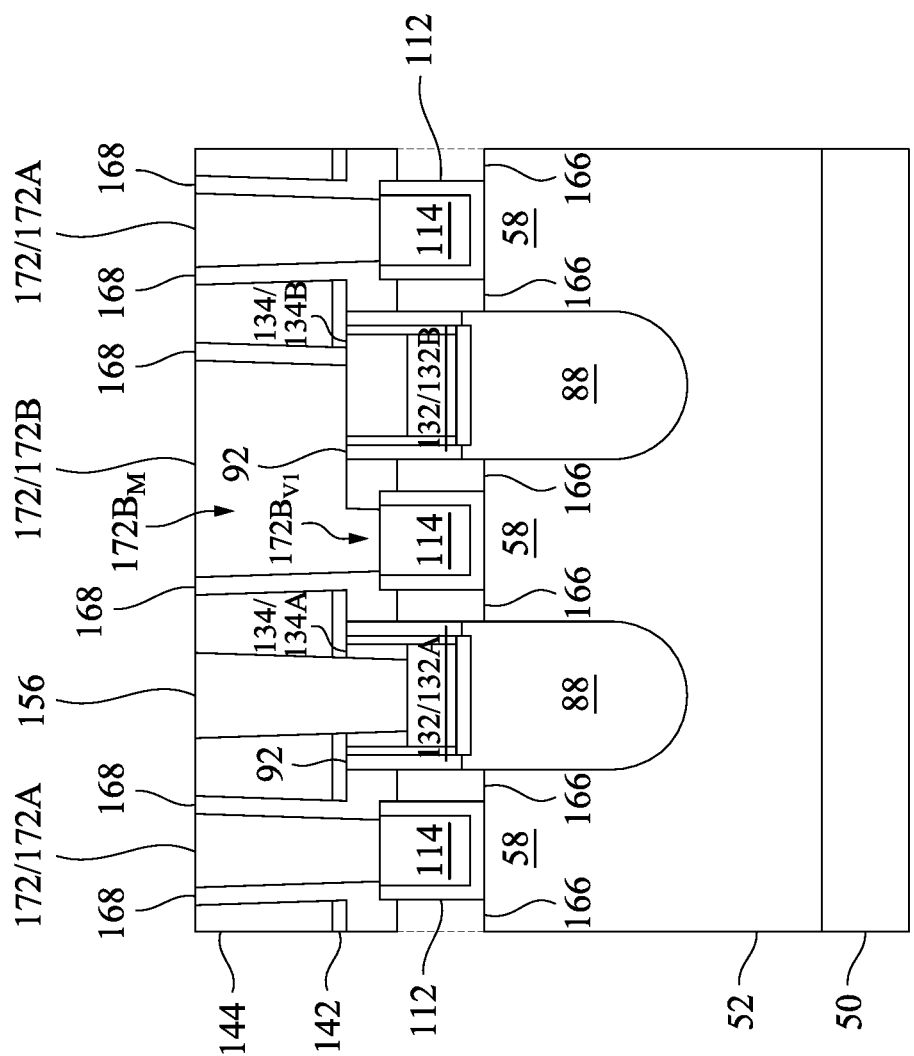
FIG. 35 is a cross-sectional view of FinFETs, in accordance with some other embodiments.

FIG. 35 is a view of FinFETs, in accordance with some other embodiments. This embodiment is similar to the embodiment of FIG. 34, except the contact spacers 168 are also formed on the sidewalls of the gate dielectrics 112. As a result, the voids 166 in this embodiment may have a lesser height than the voids 166 in the embodiment of FIG. 34.

Figure 36:
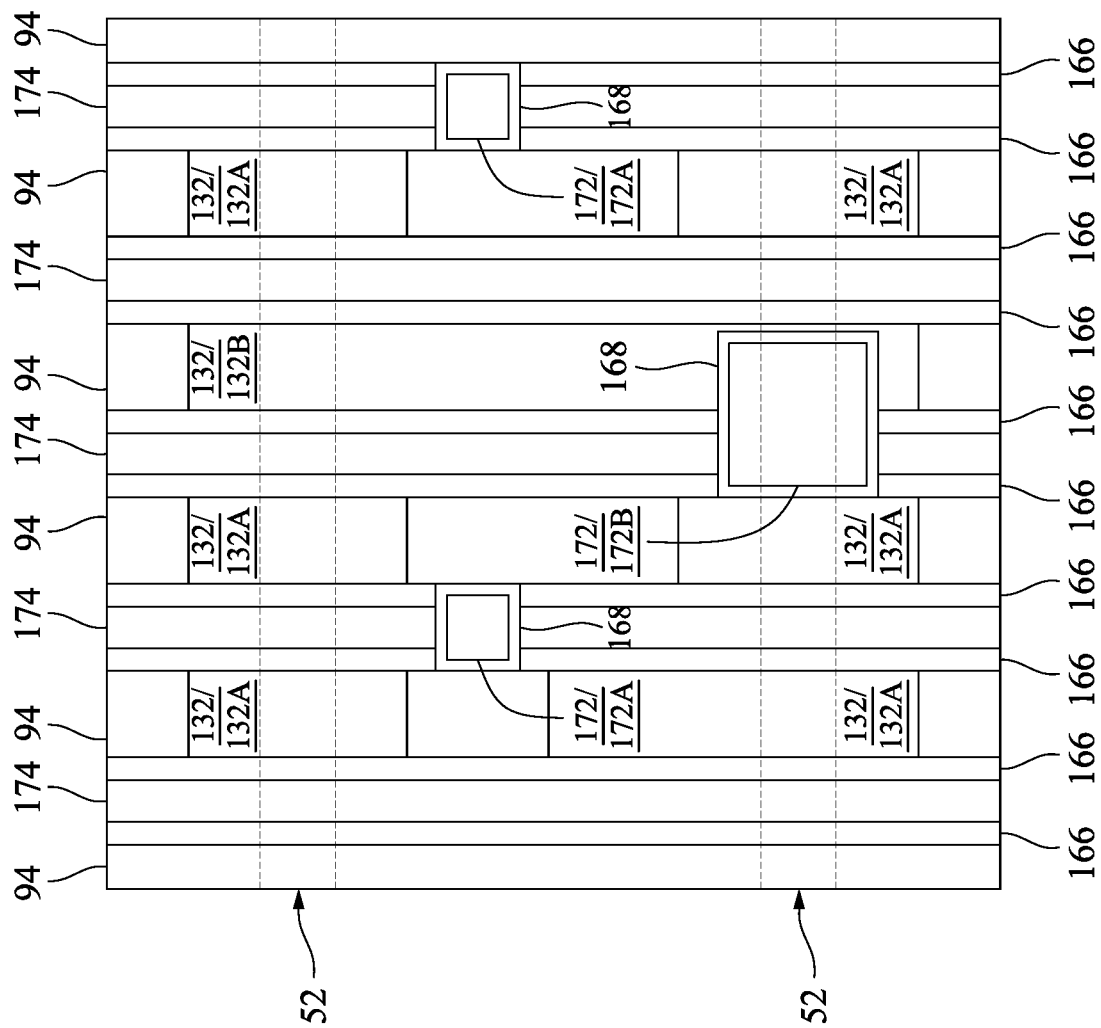
FIG. 36 is a top-down view of FinFETs, in accordance with some other embodiments.

FIG. 36 is a view of FinFETs, in accordance with some embodiments. Specifically, FIG. 36 is a top-down view, where some features of the FinFETs are omitted for illustration clarity. This embodiment is similar to the embodiment of FIG. 33, except the contact masks 134 are omitted.

Embodiments may achieve advantages. The voids 166 may be filled with air or may be at a vacuum, both of which have a lower relative permittivity than the dielectric material of the removed gate spacers 82. At smaller device sizes, the capacitance between the source/drain contacts 132, 156 and the gate electrodes 114 may be a significant source of parasitic capacitance. Decreasing the relative permittivity of the area between the source/drain contacts 132, 156 and the gate electrodes 114 reduces the parasitic capacitance, thereby improving the performance of the resulting FinFETs. Further, forming the voids 166 by removing the gate spacers 82 allows the voids 166 to be formed to the same height and at a later step in processing. Manufacturing yield may thus be improved.

The disclosed FinFET embodiments could also be applied to nanostructure devices such as nanostructure (e.g., nanosheet, nanowire, gate-all-around, or the like) field-effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Further, the FinFET/NSFET devices may be interconnected by metallization layers in an overlying interconnect structure to form integrated circuits. The overlying interconnect structure can be formed in a back end of line (BEOL) process, in which the metallization layers are connected to the upper source/drain contacts 156, and the gate contacts 172. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

In an embodiment, a device includes: a source/drain region adjoining a channel region of a substrate; a contact etch stop layer on the source/drain region; a first source/drain contact extending through the contact etch stop layer, the first source/drain contact connected to the source/drain region; a gate structure on the channel region; a gate contact connected to the gate structure; and a contact spacer around the gate contact, where the contact spacer, the gate structure, the contact etch stop layer, and the substrate collectively define a void between the gate structure and the first source/drain contact. In some embodiments, the device further includes: an etch stop layer on the gate structure, the gate contact and the contact spacer extending through the etch stop layer, the contact spacer having a first portion disposed above the etch stop layer and having a second portion disposed beneath the etch stop layer. In some embodiments of the device, top surfaces of the contact etch stop layer and the first source/drain contact are coplanar, and the device further includes: a second source/drain contact extending through the etch stop layer and into the first source/drain contact. In some embodiments, the device further includes: a contact mask on the first source/drain contact, top surfaces of the contact etch stop layer and the contact mask being coplanar; and a second source/drain contact extending through the contact mask and the etch stop layer. In some embodiments of the device, the gate structure includes a gate dielectric, a sidewall of the gate dielectric exposed to the void, the sidewall of the gate dielectric being free of the contact spacer. In some embodiments of the device, the gate structure includes a gate dielectric, a sidewall of the gate dielectric exposed to the void, the contact spacer extending along the sidewall of the gate dielectric.

In an embodiment, a device includes: a first source/drain region; a channel region adjoining the first source/drain region; a gate structure on the channel region, the gate structure separated from the first source/drain region by a first void; a gate mask on the gate structure; a gate contact extending through the gate mask to contact the gate structure; and a contact spacer around the gate contact, the first void exposing a bottom surface of the contact spacer, a sidewall of the gate structure, a sidewall of the first source/drain region, and a top surface of the channel region. In some embodiments of the device, the contact spacer extends along a sidewall of the gate contact, a top surface of the gate structure, and the sidewall of the gate structure. In some embodiments of the device, the contact spacer extends along a sidewall of the gate contact and a top surface of the gate structure, the sidewall of the gate structure being free of the contact spacer. In some embodiments, the device further includes: a second source/drain region adjoining the channel region, the gate structure separated from the second source/drain region by a second void, the first void and the second void having a same height.

In an embodiment, a method includes: etching a first contact opening through a gate mask to expose a gate structure and a gate spacer, the gate spacer disposed along a sidewall of the gate structure and along a sidewall of the gate mask; removing the gate spacer to extend the first contact opening along the sidewall of the gate structure; depositing a spacer layer in an upper portion of the first contact opening over the gate structure, the spacer layer sealing a lower portion of the first contact opening along the sidewall of the gate structure; and forming a gate contact in the upper portion of the first contact opening, the gate contact connected to the gate structure, the spacer layer disposed around the gate contact. In some embodiments, the method further includes: growing a source/drain region adjoining a channel region, the gate structure disposed over the channel region; depositing a first inter-layer dielectric over the source/drain region; etching a second contact opening through the first inter-layer dielectric to expose the source/drain region, the gate mask covering the gate structure while etching the second contact opening; and forming a lower source/drain contact in the second contact opening, the lower source/drain contact connected to the source/drain region. In some embodiments of the method, top surfaces of the lower source/drain contact, the gate mask, and the gate spacer are coplanar. In some embodiments, the method further includes: forming a contact mask over the lower source/drain contact, top surfaces of the contact mask, the gate mask, and the gate spacer being coplanar. In some embodiments, the method further includes: depositing a second inter-layer dielectric over the lower source/drain contact, the gate mask, and the gate spacer; etching the first contact opening through the second inter-layer dielectric; and before removing the gate spacer, widening the first contact opening to expose the lower source/drain contact, the spacer layer further deposited over the lower source/drain contact. In some embodiments of the method, the sidewall of the gate structure is free of the spacer layer. In some embodiments of the method, the sidewall of the gate structure contacts the spacer layer. In some embodiments of the method, etching the first contact opening through the gate mask includes performing an anisotropic etching process, and removing the gate spacer includes performing an isotropic etching process. In some embodiments of the method, the gate mask includes silicon nitride, and the anisotropic etching process is a dry etch performed with carbon tetrafluoride. In some embodiments of the method, the gate spacer includes silicon nitride, and the isotropic etching process is a wet etch performed with phosphoric acid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a first contact opening through a gate mask to expose a gate structure and a gate spacer, the gate spacer disposed along a sidewall of the gate structure and along a sidewall of the gate mask;
    removing the gate spacer to extend the first contact opening along the sidewall of the gate structure to form a first extended contact opening;
    depositing a spacer layer in an upper portion of the first extended contact opening over the gate structure, the spacer layer sealing a lower portion of the first extended contact opening along the sidewall of the gate structure to form a void from the lower portion of the first extended contact opening; and
    forming a gate contact in the upper portion of the first extended contact opening, the gate contact connected to the gate structure, the spacer layer disposed around the gate contact.

2. The method of claim 1 further comprising:
    growing a source/drain region adjoining a channel region, the gate structure disposed over the channel region;
    depositing a first inter-layer dielectric over the source/drain region;
    etching a source/drain contact opening through the first inter-layer dielectric to expose the source/drain region, the gate mask covering the gate structure while etching the source/drain contact opening; and
    forming a lower source/drain contact in the source/drain contact opening, the lower source/drain contact connected to the source/drain region.

3. The method of claim 2, wherein top surfaces of the lower source/drain contact, the gate mask, and the gate spacer are coplanar.

4. The method of claim 2 further comprising:
    forming a contact mask over the lower source/drain contact, top surfaces of the contact mask, the gate mask, and the gate spacer being coplanar.

5. The method of claim 2 further comprising:
    depositing a second inter-layer dielectric over the lower source/drain contact, the gate mask, and the gate spacer, wherein the first contact opening is also etched through the second inter-layer dielectric; and
    before removing the gate spacer, widening the first contact opening to expose the lower source/drain contact, the spacer layer further deposited over the lower source/drain contact.

6. The method of claim 1, wherein the sidewall of the gate structure is free of the spacer layer.

7. The method of claim 1, wherein the sidewall of the gate structure contacts the spacer layer.

8. The method of claim 1, wherein etching the first contact opening through the gate mask comprises performing an anisotropic etching process, and removing the gate spacer comprises performing an isotropic etching process.

9. The method of claim 8, wherein the gate mask comprises silicon nitride, and the anisotropic etching process is a dry etch performed with carbon tetrafluoride.

10. The method of claim 8, wherein the gate spacer comprises silicon nitride, and the isotropic etching process is a wet etch performed with phosphoric acid.

11. The method of claim 1 further comprising:
    growing a source/drain region adjoining a channel region, the gate structure disposed over the channel region;
    depositing a first inter-layer dielectric over the source/drain region;
    etching a source/drain contact opening through the first inter-layer dielectric to expose the source/drain region, the gate mask covering the gate structure while etching the source/drain contact opening;
    forming a lower source/drain contact in the source/drain contact opening, the lower source/drain contact connected to the source/drain region;
    forming a contact mask over the lower source/drain contact;
    depositing a second inter-layer dielectric over the contact mask, the gate mask, and the gate spacer, wherein the first contact opening is also etched through the second inter-layer dielectric;
    before removing the gate spacer, widening the first contact opening to expose the contact mask; and
    extending the first contact opening through the contact mask to expose the lower source/drain contact, the spacer layer further deposited over the lower source/drain contact.

12. A method comprising:
    etching a first contact opening through an etch stop layer to expose a gate structure and a gate spacer, the gate spacer disposed along a sidewall of the gate structure;

removing the gate spacer to extend the first contact opening along the sidewall of the gate structure to form an extended contact opening;

forming a contact spacer in an upper portion of the extended contact opening over the gate structure, the contact spacer sealing a lower portion of the extended contact opening along the sidewall of the gate structure to form a void from the lower portion of the extended contact opening; and forming a gate contact in the upper portion of the extended contact opening, the gate contact connected to the gate structure, the contact spacer disposed around the gate contact.

13. The method of claim 12, wherein forming the contact spacer comprises:

depositing a spacer layer in the upper portion of the extended contact opening; and patterning the spacer layer to remove a horizontal portion of the spacer layer over the gate structure.

14. The method of claim 12, wherein the contact spacer extends through the etch stop layer.

15. The method of claim 12, wherein the sidewall of the gate structure is free of the contact spacer.

16. The method of claim 12, wherein the sidewall of the gate structure contacts the contact spacer.

17. The method of claim 12, wherein etching the first contact opening through the etch stop layer comprises performing an anisotropic etching process, and removing the gate spacer comprises performing an isotropic etching process.

18. The method of claim 12, further comprising:

expanding the first contact opening to expose a source/drain contact, the source/drain contact connected to a source/drain region, the source/drain region adjoining a channel region, the gate structure disposed over the channel region.

19. A method comprising:

etching a contact opening through an etch stop layer to expose a gate structure and a gate spacer, the gate spacer disposed along a sidewall of the gate structure;

expanding the contact opening to expose a source/drain contact, the source/drain contact connected to a source/drain region, the gate spacer disposed along a sidewall of the source/drain region;

removing the gate spacer to extend the contact opening along the sidewall of the gate structure and along the sidewall of the source/drain region to form an extended contact opening;

forming a contact spacer in an upper portion of the extended contact opening over the gate structure, the contact spacer sealing a lower portion of the extended contact opening along the sidewall of the gate structure and along the sidewall of the source/drain region; and forming a gate contact in the upper portion of the extended contact opening, the gate contact connected to the gate structure and to the source/drain contact, a portion of the contact spacer disposed beneath the gate contact.

20. The method of claim 19, wherein etching the contact opening through the etch stop layer comprises performing an anisotropic etching process, and removing the gate spacer comprises performing an isotropic etching process.

* * * * *